(12) United States Patent
Sugiyama et al.

(10) Patent No.: US 6,982,456 B2
(45) Date of Patent: Jan. 3, 2006

(54) NONVOLATILE SEMICONDUCTOR MEMORY DEVICE AND METHOD FOR FABRICATING THE SAME

(75) Inventors: Nobuyo Sugiyama, Hyogo (JP); Hiromasa Fujimoto, Kyoto (JP); Shinji Odanaka, Osaka (JP); Seiki Ogura, Wappingers Falls, NY (US)

(73) Assignee: Matsushita Electic Industrial Co., Ltd., Osaka (JP)

( * ) Notice: Subject to any disclaimer, the term of this patent is extended or adjusted under 35 U.S.C. 154(b) by 29 days.

(21) Appl. No.: 10/889,013

(22) Filed: Jul. 13, 2004

(65) Prior Publication Data

US 2004/0246803 A1    Dec. 9, 2004

Related U.S. Application Data

(62) Division of application No. 10/366,420, filed on Feb. 14, 2003, now Pat. No. 6,770,931, which is a division of application No. 09/902,942, filed on Jul. 12, 2001, now Pat. No. 6,538,275.

(30) Foreign Application Priority Data

Jul. 12, 2000    (JP) .............................. 2000-210887

(51) Int. Cl.
*H01L 29/76*    (2006.01)
*H01L 29/788*    (2006.01)

(52) U.S. Cl. ...................... 257/314; 257/315; 257/321; 257/336; 257/334; 257/345; 438/201; 438/211; 438/257

(58) Field of Classification Search . 257/314–315,321, 257/336, 334, 345; 438/201, 211, 257
See application file for complete search history.

(56) References Cited

U.S. PATENT DOCUMENTS

| | | | |
|---|---|---|---|
| 5,712,180 | A | 1/1998 | Guterman et al. |
| 5,780,341 | A | 7/1998 | Ogura |
| 6,051,860 | A | 4/2000 | Odanaka et al. |
| 6,272,050 | B1 | 8/2001 | Cunningham et al. |
| 6,445,617 | B1 | 9/2002 | Sakakibara |
| 6,538,275 | B2 | 3/2003 | Sugiyama et al. |

*Primary Examiner*—Tom Thomas
*Assistant Examiner*—Joseph Nguyen
(74) *Attorney, Agent, or Firm*—McDermott Will & Emery LLP

(57) ABSTRACT

A nonvolatile semiconductor memory device according to the present invention has a control gate electrode which is formed on the upper stage of a stepped portion formed in the principal surface of a substrate with a first insulating film interposed therebetween and a floating gate electrode which is formed to cover up the stepped portion, capacitively coupled to the side surface of the control gate electrode closer to the stepped portion with a second insulating film interposed therebetween, and opposed to the lower stage of the stepped portion with a third insulating film serving as a tunnel film interposed therebetween. Within the semiconductor substrate and in the vicinity of the stepped portion, there is formed a depletion control layer which is composed of a heavily doped impurity region and formed to extend from a position located under the floating gate electrode and at a distance from the upper corner of the stepped portion toward the lower corner of the stepped portion and adjoin the end portion of a drain region without reaching a step side region.

7 Claims, 42 Drawing Sheets

NONVOLATILE SEMICONDUCTOR MEMORY DEVICE AND METHOD FOR FABRICATING THE SAME

This application is a DIV of Ser. No. 10/366,420, filed on Feb. 14, 2003, now U.S. Pat. No. 6,770,931 which is a DIV of Ser. No. 09/902,942, filed on Jul. 12, 2001, now U.S. Pat. No. 6,538,275.

BACKGROUND OF THE INVENTION

The present invention relates to a nonvolatile semiconductor memory device and to a method for fabricating the same. At present, flash EEPROM (Electrically Erasable Programmable ROM) devices are used widely in electronic equipment as nonvolatile semiconductor memory devices which allow for electrical write and erase operations. The structures of memory cells in the nonvolatile semiconductor memory devices can be divided broadly into two types. The first one is a stacked-gate type having a multilayer electrode structure composed of a floating gate electrode and a control gate electrode which are stacked successively on a semiconductor substrate. The second one is a split-gate type having an electrode structure composed of a floating gate electrode and a control gate electrode which are disposed adjacent to each other in opposing relation to a channel region in a semiconductor substrate.

Referring to the drawings, a description will be given herein below to a conventional split-gate nonvolatile semiconductor memory device.

FIG. 42 shows a cross-sectional structure of a split-gate nonvolatile semiconductor memory device disclosed in U.S. Pat. No. 5,780,341, which has a stepped portion formed in a portion of a semiconductor substrate underlying a floating gate electrode. As shown in FIG. 42, a main surface of a semiconductor substrate 201 composed of, e.g., p-type silicon is formed with a stepped portion 205 composed of a first surface region 202 serving as an upper stage, a second surface region 204 serving as a lower stage, and a step side region 204 connecting the upper and lower stages.

A control gate electrode 210 is formed on the first surface region 202 of the stepped portion 205 with a gate insulating film 211 interposed therebetween. A floating gate electrode 212 formed to cover up the stepped portion 205 is capacitively coupled to the side surface of the control gate electrode 210 closer to the stepped portion and opposed to the second surface region 203 with a silicon dioxide film 213 serving as a tunnel film interposed therebetween.

A heavily doped n-type source region 221 is formed in the first surface region 202 of the semiconductor substrate 201, while a lightly doped n-type drain region 222a is formed in an area of the second surface region 203 underlying the floating gate electrode 212 and a heavily doped drain region 222b is formed externally of the lightly doped drain region 222a.

In an area of the first surface region 202 underlying the floating gate electrode 212, a p-type impurity region 223 containing a p-type impurity at a concentration higher than in the semiconductor substrate 201 is formed. In such a structure, the floating gate electrode 212 is positioned in the direction in which electrons that have been injected into the heavily source region 221 flow so that the efficiency with which channel electrons are injected is improved.

As a result of conducting various studies including simulation and the like, the present inventors have concluded that the conventional split-gate nonvolatile semiconductor memory device is unsatisfactory in terms of the effect of increasing the efficiency of electron injection which is exerted by the stepped portion 205 formed in the semiconductor substrate 201.

When an electric field is applied during a write operation, a high electric field is hard to propagate upwardly from the lower corner of the stepped portion 205 in the source-side end portion of the lightly doped drain region 222a so that the localization of the electric field is likely to occur only in the vicinity of the lower corner of the stepped portion 205. As a result, a region where the electric field is intensest deviates to a lower portion from the step side region 204 into which the channel electrons from the floating gate electrode 212 are intended to be actually injected. The channel electrons flow directly to the lightly doped drain region 222a through a region at a distance from the step side region 204. This prevents the channel electrons from being injected into the floating gate electrode 212 with a sufficiently high efficiency.

During an erase operation, the electrons accumulated in the floating gate electrode 212 are extracted as a FN tunnel current to the heavily doped drain region 222b through a tunnel film composed of the portion of the silicon dioxide film 213 opposed to the floating gate electrode 212. With the increasing miniaturization of the element, however, the area of the portion of the tunnel film which permits the passage of the electrons is reduced so that the erase operation becomes difficult.

For an easier erase operation, there is a method of enhancing the electric field applied to the tunnel film by increasing the drain voltage. In accordance with the method, however, holes having high energy (hot holes) generated in the heavily doped drain region 222b are generated simultaneously. The hot holes causes the problem that the reliability of the tunnel film is lowered or that the hot holes are captured in the tunnel film to degrade the characteristics of the element.

As the element is reduced in size, especially the gate length of the control gate electrode 210 is reduced, a short-channel effect, which is obscure in the conventional split-gate flash EEPROM device, is observed distinctly disadvantageously.

SUMMARY OF THE INVENTION

It is therefore a first object of the present invention to ensure, by solving the foregoing conventional problems, an improved efficiency with which electrons are injected into a nonvolatile semiconductor memory device having a stepped portion and allow a low-voltage and high-speed write operation.

A second object of the present invention is to increase an erase speed, while suppressing the occurrence of hot holes during an erase operation. A third object of the present invention is to allow miniaturization of an element by suppressing a short-channel effect.

To attain the first object, the present invention provides a nonvolatile semiconductor memory device having a stepped portion on the drain side, wherein a heavily doped impurity region of the conductivity type opposite to that of the drain region is formed at a position at a distance from and opposed to the upper corner of the stepped portion so as not to reach a first surface region and a step side region or adopts a method in which a proper substrate voltage is applied during a write operation.

To attain the second object, the present invention forms a drain region in which an impurity concentration is progressively higher with distance from a source region. To attain the third object, the present invention provides an impurity region of the conductivity type opposite to that of the source region such that the source region is covered with the impurity region.

Specifically, a first nonvolatile semiconductor memory device according to the present invention attains the first object and comprises: a stepped portion formed in a semiconductor substrate, the stepped portion being composed of a first surface region serving as an upper stage, a second surface region serving as a lower stage, and a step side region connecting the upper and lower stages; a first insulating film formed on the first surface region; a control gate electrode formed on an area of the first surface region located in the vicinity of the stepped portion with the first insulating film interposed therebetween; a floating gate electrode formed on the semiconductor substrate so as to cover up the stepped portion, the floating gate electrode being capacitively coupled to a side surface of the control gate electrode closer to the stepped portion with a second insulating film interposed therebetween and opposed to the second surface region with a third insulating film interposed therebetween; a source region formed in an area of the first surface region opposite to the floating gate electrode relative to the control gate electrode; a drain region formed in an area of the second surface region underlying the floating gate electrode; and a depletion control layer formed in the semiconductor substrate to extend from a position located under the first surface region and at a distance from an upper corner of the stepped portion toward a lower corner of the stepped portion and adjoin the drain region without reaching the step side region, the depletion control layer being composed of a heavily doped impurity region of a conductivity type opposite to a conductivity type of the drain region.

The first nonvolatile semiconductor memory device is of a split-gate type comprising the depletion control layer which is formed within the semiconductor substrate and has the conductivity type opposite to that of the drain region. The arrangement prevents the depletion layer from extending to a region at a distance from the stepped portion during a write operation even when the drain region is provided in the second surface region serving as the lower stage of the stepped portion. In addition, a high electric field caused by the drain region is brought into a reverse-biased state due to the pn junction between the drain region and the depletion control layer and the potential difference across the pn junction is increased, so that a path of carriers flowing toward a high electron temperature region generated in the vicinity of the lower corner of the stepped portion is formed. This ensures an improved efficiency with which the electrons which have become hot electrons in the vicinity of the step side region are injected from the step side region into the floating gate electrode.

Preferably, the first nonvolatile semiconductor memory device further comprises a high-electric-field forming layer formed between the upper corner of the stepped portion and the depletion control layer, the high-electric-field forming layer being composed of an impurity region of the same conductivity type as the conductivity type of the depletion control layer. In the arrangement, an energy level in the step side region has a sharper gradient due to the pn junction portion composed of the interface between the high-electric-field forming layer and the drain region. As a result, a high electric field is generated at the interface between the high-electric-field forming layer and the drain region to overlap each of a high electric field caused by the stepped structure and a high electric field generated at the interface between the depletion control layer and the drain region, so that an electron temperature in the vicinity of the lower corner of the step side region is further increased. This increases the number of electrons in the channel that have become hot electrons and remarkably improves the efficiency with which the electrons are injected into the floating gate electrode.

In the first nonvolatile semiconductor memory device, an impurity concentration of the high-electric-field forming layer is preferably lower than an impurity concentration of the depletion control layer and higher than an impurity concentration of the semiconductor substrate. In the arrangement, the high-electric-field forming layer formed between the depletion control layer at a distance from the stepped portion and the stepped portion is depleted during a write operation so that the channel region is generated reliably in the vicinity of the step side region.

A second nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the semiconductor substrate so as to cover up the stepped portion; a floating gate electrode formed on the first insulating film so as to cover up the stepped portion; a control gate electrode formed on the floating gate electrode with the second insulating film interposed therebetween, the control gate electrode being capacitively coupled to the floating gate electrode; a source region formed in an area of the first surface region opposite to the stepped portion relative to the floating gate electrode; a drain region formed in an area of the second surface region underlying the floating gate electrode; and a depletion control layer formed in the semiconductor substrate to extend from a position located under the first surface region and at a distance from an upper corner of the stepped portion toward a lower corner of the stepped portion and adjoin the drain region without reaching the step side region, the depletion control layer being composed of a heavily doped impurity region of a conductivity type opposite to a conductivity type of the drain region.

The second nonvolatile semiconductor memory device is of a stacked-gate type comprising the depletion control layer which is formed within the semiconductor substrate and has the conductivity type opposite to that of the drain region. The arrangement prevents the depletion layer from extending to a region at a distance from the stepped portion during a write operation even when the drain region is provided in the second surface region serving as the lower stage of the stepped portion. In addition, a high electric field is caused by the drain region at the pn junction between the drain region and the depletion control layer so that a path of carriers flowing toward a high electron temperature region generated in the vicinity of the lower corner of the stepped portion is formed. This ensures an improved efficiency with which the electrons which have become hot electrons in the vicinity of the step side region are injected from the step side region into the floating gate electrode.

Preferably, the second nonvolatile semiconductor memory device further comprises a high-electric-field forming layer formed between the upper corner of the stepped portion and the depletion control layer, the high-electric-field forming layer being composed of an impurity region of the same conductivity type as the conductivity type of the depletion control layer.

In this case, an impurity concentration of the high-electric-field forming layer is preferably lower than an impurity concentration of the depletion control layer and higher than an impurity concentration of the semiconductor substrate.

In the first or second nonvolatile semiconductor memory device, an end portion of the drain region closer to the source region is preferably located in the step side region without reaching the first surface region. In the arrangement, an area of the conductivity type opposite to that of the drain region is formed in the step side region so that the channel region is formed reliably by using the area as a depletion layer and an inversion layer.

In the first or second nonvolatile semiconductor memory device, the drain region preferably has at least three impurity regions formed to have respective impurity concentrations which are progressively higher with distance from the source region along a surface of the second surface region. In the arrangement, the area of the drain region opposite to the channel region is high in impurity concentration so that the intensity of an electric field in the area closer to the channel region is reduced relatively and the occurrence of hot holes in the peripheral region of the drain region during an erase operation is suppressed. This prevents the lowering of the reliability of a tunnel film and suppresses a short-channel effect as well, thereby attaining the second and third objects.

Preferably, the first or second nonvolatile semiconductor memory device further comprises an impurity region formed in the first surface region so as to cover a junction interface of the source region, the impurity region having a conductivity type opposite to a conductivity type of the source region to suppress a short-channel effect. The arrangement suppresses the expansion of the depletion layer in the channel region and suppresses the short-channel effect and a punch-through effect as well, thereby attaining the third object.

A third nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the first surface region; a control gate electrode formed on an area of the first surface region located in the vicinity of the stepped portion with the first insulating film interposed therebetween; a floating gate electrode formed on the semiconductor substrate so as to cover up the stepped portion, the floating gate electrode being capacitively coupled to a side surface of the control gate electrode closer to the stepped portion with a second insulating film interposed therebetween and opposed to the second surface region with a third insulating film interposed therebetween; a source region formed in an area of the first surface region opposite to the floating gate electrode relative to the control gate electrode; a drain region formed in an area of the second surface region underlying the floating gate electrode; and an impurity region formed in the semiconductor substrate to be located in the vicinity of an corner between the first surface region and the step side region, the impurity region having an impurity concentration higher than an impurity concentration of the semiconductor substrate and a conductivity type opposite to a conductivity type of the drain region, the drain region having at least three impurity diffusion regions formed to have respective impurity concentrations which are progressively higher with distance from the source region along a surface of the second surface region.

The third nonvolatile semiconductor memory device is of a split-gate type comprising an impurity region which is formed within the semiconductor substrate to be located in the vicinity of the corner between the first surface region and the step side region and has the conductivity type opposite to that of the drain region. As a result, a high electric field is generated at the pn junction interface between the impurity region and the drain region and the number of electrons in the channel that have become hot electrons is increased, which improves the efficiency with which the electrons are injected into the floating gate electrode. The third nonvolatile semiconductor memory device also has at least three impurity diffusion regions formed to have respective impurity concentrations which are progressively higher with distance from the source region along the surface of the second surface region. This relatively reduces the intensity of an electric field in the area of the drain region closer to the channel region and suppresses the occurrence of hot holes in the area of the drain region located around the channel during an erase operation and suppresses the short-channel effect as well.

A fourth nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the first surface region; a control gate electrode formed on an area of the first surface region located in the vicinity of the stepped portion with the first insulating film interposed therebetween; a floating gate electrode formed on the semiconductor substrate so as to cover up the stepped portion, the floating gate electrode being capacitively coupled to a side surface of the control gate electrode closer to the stepped portion with a second insulating film interposed therebetween and opposed to the second surface region with a third insulating film interposed therebetween; a source region formed in an area of the first surface region opposite to the floating gate electrode relative to the control gate electrode; a drain region formed in an area of the second surface region underlying the floating gate electrode; a first impurity region formed in the semiconductor substrate to be located in the vicinity of an corner between the first surface region and the step side region, the impurity region having an impurity concentration higher than an impurity concentration of the semiconductor substrate and a conductivity type opposite to a conductivity type of the drain region; and a second impurity region formed in the first surface region so as to cover a junction interface of the source region, the second impurity region having a conductivity type opposite to a conductivity type of the source region to suppress a short-channel effect.

The fourth nonvolatile semiconductor memory device is of a split-gate type comprising the first impurity region which is formed within the semiconductor substrate to be located in the vicinity of the corner between the first surface region and the step side region and has a conductivity type opposite to that of the drain region. As a result, a high electric field is generated at the pn junction interface between the first impurity region and the drain region and the number of electrons in the channel that have become hot electrons is increased, which improves the efficiency with which the electrons are injected into the floating gate electrode. The fourth nonvolatile semiconductor memory device also has the second impurity region formed to cover the junction interface of the source region and having a conductivity type opposite to that of the source region. This suppresses the expansion of the depletion layer in the channel region and suppresses the short-channel effect and the punch-through effect as well.

A fifth nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the semiconductor substrate so as to cover up the stepped portion; a floating gate electrode formed on the first insulating film so as to cover up the stepped portion; a control gate electrode formed on the floating gate electrode with the second insulating film interposed therebetween, the control gate electrode being capacitively coupled to the floating gate electrode; a source region formed in an area of the first surface region opposite to the stepped portion relative to the floating gate electrode; a drain region formed in an area of the second surface region underlying the floating gate electrode; and an impurity region formed in the semiconductor substrate to be located in the vicinity of an corner between the first surface region and the step side region, the impurity region having an impurity concentration higher than an impurity concentration of the semiconductor substrate and a conductivity type opposite to a conductivity type of the drain region, the drain region having at least three impurity diffusion regions formed to have respective impurity concentrations which are progressively higher with distance from the source region along a surface of the second surface region.

The fifth nonvolatile semiconductor memory device is of a stacked-gate type comprising an impurity region which is formed within the semiconductor substrate to be located in the vicinity of the corner between the first surface region and the step side region and has the conductivity type opposite to that of the drain region. As a result, a high electric field is generated at the pn junction interface between the impurity region and the drain region and the number of electrons in the channel that have become hot electrons is increased, which improves the efficiency with which the electrons are injected into the floating gate electrode. The third nonvolatile semiconductor memory device also has at least three impurity diffusion regions formed to have respective impurity concentrations which are progressively higher with distance from the source region along the surface of the second surface region. This relatively reduces the intensity of an electric field in the area of the drain region closer to the channel region and suppresses the occurrence of hot holes in the area of the drain region located around the channel during an erase operation and suppresses the short-channel effect as well.

A sixth nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the semiconductor substrate so as to cover up the stepped portion; a floating gate electrode formed on the first insulating film so as to cover up the stepped portion; a control gate electrode formed on the floating gate electrode with the second insulating film interposed therebetween, the control gate electrode being capacitively coupled to the floating gate electrode; a source region formed in an area of the first surface region opposite to the stepped portion relative to the floating gate electrode; a drain region formed in an area of the second surface region underlying the floating gate electrode; a first impurity region formed in the semiconductor substrate to be located in the vicinity of an corner between the first surface region and the step side region, the impurity region having an impurity concentration higher than an impurity concentration of the semiconductor substrate and a conductivity type opposite to a conductivity type of the drain region; and a second impurity region formed in the first surface region so as to cover a junction interface of the source region, the second impurity region having a conductivity type opposite to a conductivity type of the source region to suppress a short-channel effect.

The sixth nonvolatile semiconductor memory device is of a stacked-gate type comprising the first impurity region which is formed within the semiconductor substrate to be located in the vicinity of the corner between the first surface region and the step side region and has a conductivity type opposite to that of the drain region. As a result, a high electric field is generated at the pn junction interface between the first impurity region and the drain region and the number of electrons in the channel that have become hot electrons is increased, which improves the efficiency with which the electrons are injected into the floating gate electrode. The sixth nonvolatile semiconductor memory device also has the second impurity region formed to cover the junction interface of the source region and having a conductivity type opposite to that of the source region. This suppresses the expansion of the depletion layer in the channel region and suppresses the short-channel effect and the punch-through effect as well.

In any one of the first to sixth nonvolatile semiconductor memory devices, a substrate voltage is preferably applied to the semiconductor substrate such that a channel region in which carriers flow from a portion of the first surface region underlying the floating gate electrode toward the step side region is formed. In the arrangement, a potential at the floating gate is relatively increased in the portion of the semiconductor substrate enclosed with the first surface region and the step side region so that the carriers are strongly attracted to the surface of the semiconductor substrate. In addition, the current density is increased only during the application of the substrate voltage so that power consumption while a write operation is not performed is reduced significantly.

In any one of the first to sixth nonvolatile semiconductor memory devices, a specified drain voltage and a specified control gate voltage are preferably applied to the drain region and to the control gate electrode, respectively, such that a channel region in which carriers flow from a portion of the first surface region underlying the floating gate electrode toward the step side region is formed.

A seventh nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the first surface region; a control gate electrode formed on an area of the first surface region located in the vicinity of the stepped portion with the first insulating film interposed therebetween; a floating gate electrode formed on the semiconductor substrate so as to cover up the stepped portion, the floating gate electrode being capacitively coupled to a side surface of the control gate electrode closer to the stepped portion with a second insulating film interposed therebetween and opposed to the second surface region with a third insulating film interposed therebetween; a source region formed in an area of the first surface region opposite to the floating gate electrode relative to the control gate electrode; a drain region formed in an area of the second surface region underlying the floating gate electrode; and an impurity region formed in the first surface region and step side region of the semiconductor substrate to have an impurity concentration higher than an impurity concentration of the semiconductor substrate and a conductivity type opposite to a conductivity type of the drain region, wherein a substrate voltage is applied to the semiconductor substrate such that a channel region in which carriers flow from a portion of the first surface region underlying the floating gate electrode toward the step side region is formed.

The seventh nonvolatile semiconductor memory device is of a split-gate type in which, even if a depletion control layer is not provided in a portion of the semiconductor substrate at a distance from the step side region of the stepped portion, a potential at the floating gate electrode over the portion of the semiconductor substrate enclosed with the first surface region and the step side region is increased relatively by applying, e.g., a substrate voltage of a polarity opposite to that of the drain voltage during a write operation, i.e., by applying a negative substrate voltage in the case of an n-type channel and applying a positive substrate voltage in the case of a p-type channel. As a result, the carriers are strongly attracted to the surface of the semiconductor substrate so that the efficiency with which the carriers are injected into the floating gate electrode is improved.

An eighth nonvolatile semiconductor memory device according to the present invention comprises: a stepped portion formed in a semiconductor substrate, the stepped portion being composed of a first surface region serving as an upper stage, a second surface region serving as a lower stage, and a step side region connecting the upper and lower stages; a first insulating film formed on the semiconductor substrate so as to cover up the stepped portion; a floating gate electrode formed on the first insulating film so as to cover up the stepped portion; a control gate electrode formed on the floating gate electrode with the second insulating film interposed therebetween, the control gate electrode being capacitively coupled to the floating gate electrode; a source region formed in an area of the first surface region opposite to the stepped portion relative to the floating gate electrode; a drain region formed in an area of the second surface region underlying the floating gate electrode; and an impurity region formed in the first surface region and step side region of the semiconductor substrate to have an impurity concentration higher than an impurity concentration of the semiconductor substrate and a conductivity type opposite to a conductivity type of the drain region, wherein a substrate voltage is applied to the semiconductor substrate such that a channel region in which carriers flow from a portion of the first surface region underlying the floating gate electrode toward the step side region is formed.

The eighth nonvolatile semiconductor memory device is of a stacked-gate type in which, even if a depletion control layer is not provided in a portion of the semiconductor substrate at a distance from the step side region of the stepped portion, a potential at the floating gate electrode over the portion of the semiconductor substrate enclosed with the first surface region and the step side region is increased relatively by applying a negative substrate voltage in the case of an n-type channel and applying a positive substrate voltage in the case of a p-type channel. As a result, the carriers are strongly attracted to the surface of the semiconductor substrate so that the efficiency with which the carriers are injected into the floating gate electrode is improved.

A first method for fabricating a nonvolatile semiconductor memory device according to the present invention comprises: a first step of forming a control gate electrode on a semiconductor substrate with a first insulating film interposed therebetween; a second step of masking a region of the semiconductor substrate to be formed with a source, ion-implanting a high-concentration impurity of a first conductivity type into the semiconductor substrate by using the control gate electrode as a mask, and thereby forming a heavily doped impurity region; a third step for forming a sidewall composed of an insulating film on a side surface of the gate electrode, etching the semiconductor substrate by using the formed sidewall and the control gate electrode as a mask and masking the source formation region, and thereby forming a recessed portion in the semiconductor substrate, while forming, in the semiconductor substrate, a stepped portion composed of a first surface region in which a portion of the semiconductor substrate underlying the sidewall serves as an upper stage, a second surface region in which a bottom surface of the recessed portion serves as a lower stage, and a step side region connecting the upper and lower stages; a fourth step of selectively ion-implanting a low-concentration impurity of a second conductivity type into the second surface region of the semiconductor substrate and thereby forming a lightly doped drain region of the second conductivity type in the second surface region, while inverting a conductivity type of each of portions of the heavily doped impurity region located in the vicinity of the first surface region, an upper corner of the stepped portion, and the step side region of the stepped portion and thereby forming a depletion control layer composed of the heavily doped impurity region and located discretely at a distance from the first surface region and the step side region to adjoin the lightly doped drain region; a fifth step of removing the sidewall and forming a second insulating film over the side surface of the control gate electrode closer to the stepped portion, the first surface region, the step side region, and the second surface region; a sixth step of depositing a conductor film over the entire surface of the second insulating film, etching the deposited conductor film, and thereby forming by self alignment a floating gate electrode covering up the stepped portion, capacitively coupled to the side surface of the control gate electrode closer to the stepped portion with the second insulating film interposed therebetween, and opposed to the second surface region with the second insulating film interposed therebetween; and a seventh step of ion-implanting an impurity of the second conductivity type into the semiconductor substrate by using the control gate electrode and the floating gate electrode as a mask and thereby forming a source region of the second conductivity type in the first surface region, while forming a drain region of the second conductivity type in the second surface region.

The first method for fabricating a nonvolatile semiconductor memory device comprises the step of selectively ion-implanting the low-concentration impurity of the second conductivity type into the second surface region composed of the bottom surface of the recessed portion in the semiconductor substrate and thereby forming the lightly doped drain region of the second conductivity type in the second surface region, while inverting the conductivity type of each of the portions of the heavily doped impurity region located in the vicinity of the first surface region, the upper corner of the stepped portion, and the step side region of the stepped portion and thereby forming the depletion control layer composed of the heavily doped impurity region of the first conductivity type and located distinctly at a distance from the first surface region and the step side region to adjoin the lightly doped drain region. This ensures the fabrication of the first nonvolatile semiconductor memory device according to the present invention.

In the first method for fabricating a nonvolatile semiconductor memory device, the second step preferably includes the step of: ion-implanting again an impurity of the first conductivity type into the heavily doped impurity region that has been formed and thereby forming another impurity region of the first conductivity type which is shallower in diffusion depth than the heavily doped impurity region and the fourth step includes the step of: forming a high-electric-field forming layer composed of the other impurity region between an upper corner of the stepped portion and the depletion control layer.

Preferably, the first method for fabricating a nonvolatile semiconductor memory device further comprises, after the seventh step: an eighth step of depositing a third insulating film on the floating gate electrode, ion-implanting an impurity of the second conductivity type into the semiconductor substrate by using the deposited third insulating film and the floating gate electrode as a mask, and thereby forming, in the second surface region, a heavily doped drain region of the second conductivity type which is higher in impurity concentration than the drain region. This ensures the fabrication of the third nonvolatile semiconductor memory device according to the present invention.

Preferably, the first method for fabricating a nonvolatile semiconductor memory device further comprises, after the fourth step, the step of: masking a region extending from the control gate electrode to the second surface region and forming, in the source formation region, an impurity region of the first conductivity type which is deeper in diffusion depth than the source region. This ensures the fabrication of the fourth nonvolatile semiconductor memory device according to the present invention.

A second method for fabricating a nonvolatile semiconductor memory device according to the present invention comprises: a first step of selectively ion-implanting a high-concentration impurity of a first conductivity type into a region of a semiconductor substrate to be formed with a drain and thereby forming a heavily doped impurity region of the first conductivity type; a second step of selectively etching the heavily doped impurity region except for an end portion thereof closer to a region of the semiconductor substrate to be formed with a source and thereby forming a recessed portion in the semiconductor substrate, while forming, in the semiconductor substrate, a stepped portion composed of a first surface region in which the end portion of the heavily doped impurity region serves as an upper stage, a second surface region in which a bottom surface of the recessed portion serves as a lower stage, and a step side region connecting the upper and lower stages; a third step of selectively ion-implanting a low-concentration impurity of a second conductivity type into the second surface region of the semiconductor substrate and thereby forming a lightly doped drain region of the second conductivity type in the second surface region, while inverting a conductivity type of each of portions of the heavily doped impurity region located in the vicinity of the first surface region, an upper corner of the stepped portion, and the step side region of the stepped portion and thereby forming a depletion control layer composed of the heavily doped impurity region and located discretely at a distance from the first surface region and the step side region to adjoin the lightly doped drain region; a fourth step of successively forming a first insulating film, a floating gate electrode, a second insulating film, and a control gate electrode on the semiconductor substrate such that the stepped portion is covered up therewith; and a fifth step of ion-implanting an impurity of the second conductivity type into the semiconductor substrate by using the control gate electrode as a mask and thereby forming a source region of the second conductivity type in the source formation region, while forming a drain region of the second conductivity type in the drain formation region.

The second method for fabricating a nonvolatile semiconductor memory device comprises the step of selectively ion-implanting the low-concentration impurity of the second conductivity type into the second surface region of the semiconductor substrate and thereby forming the lightly doped drain region of the second conductivity type in the second surface region, while inverting the conductivity type of each of the portions of the heavily doped impurity region of the first conductivity type located in the vicinity of the first surface region, the upper corner of the stepped portion, and the step side region of the stepped portion and thereby forming the depletion control layer composed of the heavily doped impurity region and located distinctly at a distance from the first surface region and the step side region to adjoin the lightly doped drain region. This ensures the fabrication of the second nonvolatile semiconductor memory device according to the present invention.

In the second method for fabricating a nonvolatile semiconductor memory device, the first step preferably includes the step of: ion-implanting again an impurity of the first conductivity type into the heavily doped impurity region that has been formed and thereby forming another impurity region of the first conductivity type which is shallower in diffusion depth than the heavily doped impurity region and the third step includes the step of: forming a high-electric-field forming layer composed of the other impurity region between an upper corner of the stepped portion and the depletion control layer.

Preferably, the second method for fabricating a nonvolatile semiconductor memory device further comprises, after the fifth step: a sixth step of depositing a third insulating film on the control gate electrode, etching the deposited third insulating film, and thereby forming sidewalls on respective side surfaces of the floating gate electrode and the control gate electrode; and a seventh step of ion-implanting an impurity of the second conductivity type into the semiconductor substrate by using the control gate electrode and the sidewalls as a mask and thereby forming, in the second surface region, a heavily doped drain region of the second conductivity type which is higher in impurity concentration than the drain region. This ensures the fabrication of the fifth nonvolatile semiconductor memory device according to the present invention.

Preferably, the second method for fabricating a nonvolatile semiconductor memory device further comprises, after the third step, the step of: masking a region extending from the control gate electrode to the second surface region and forming, in the source formation region, an impurity region of the first conductivity type which is deeper in diffusion depth than the source region. This ensures the fabrication of the sixth nonvolatile semiconductor memory device according to the present invention.

BRIEF DESCRIPTION OF THE DRAWINGS

FIGS. 21A and 21B are enlarged cross-sectional views of a stepped portion and its vicinity in the split-gate nonvolatile semiconductor memory device according to the sixth embodiment, of which FIG. 21A shows a flow of electrons during a write operation and FIG. 21B shows a flow of electrons during an erase operation;

FIGS. 41A and 41B show flows of hot holes in the vicinity of a stepped portion during an erase operation in a split-gate nonvolatile semiconductor memory device, of which FIG. 41A is a cross-sectional view when a comparative method for bias application is used and FIG. 41B is a cross-sectional view when a method for bias application according to a tenth embodiment of the present invention is used.

DETAILED DESCRIPTION OF THE INVENTION

Embodiment 1

A first embodiment of the present invention will be described with reference to the drawings.

Figure 1:
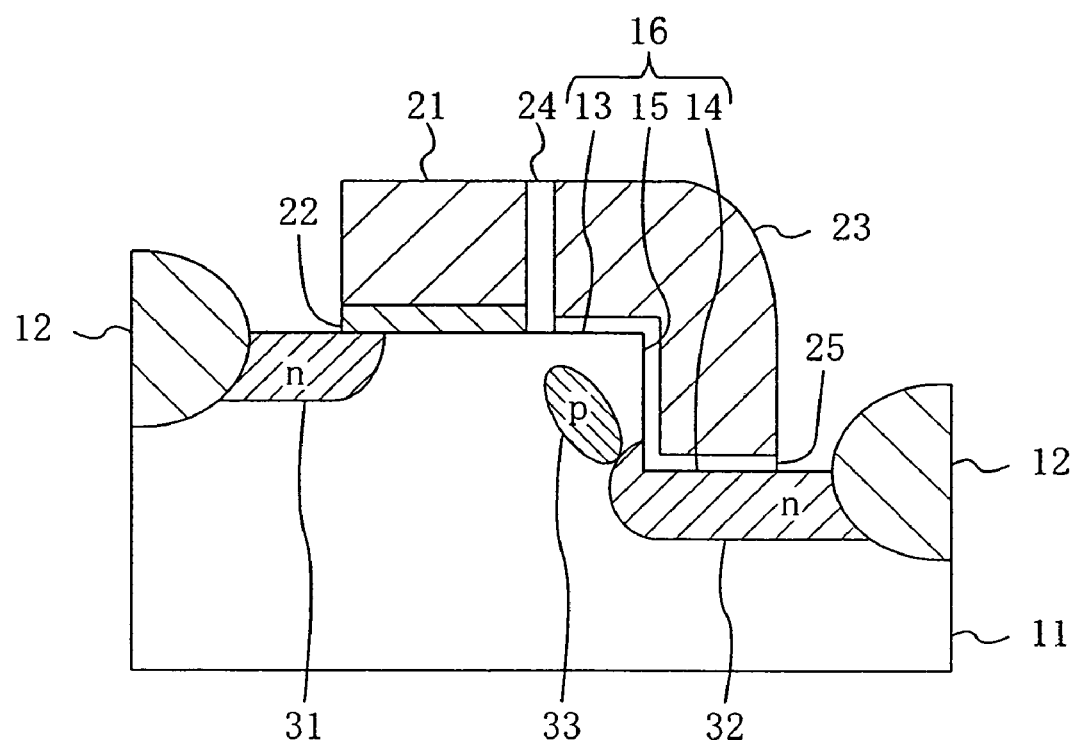
FIG. 1 is a structural cross-sectional view showing a memory element in a split-gate nonvolatile semiconductor memory device according to a first embodiment of the present invention.

FIG. 1 shows a cross-sectional structure of a memory element in a split-gate nonvolatile semiconductor memory device according to the first embodiment. As shown in FIG. 1, a semiconductor substrate 11 composed of p-type silicon has an active region surrounded by an isolation layer 12 composed of LOCOS or trench isolation. The principal surface of the active region is formed with a stepped portion composed of a first surface region 13 serving as an upper stage, a second surface region 14 serving as a lower stage, and a step side region 15 connecting the upper and lower stages.

A control gate electrode 21 is formed on the first surface region 13 with a first insulating film 22 interposed therebetween. A floating gate electrode 23 formed to cover up the stepped portion 16 is capacitively coupled to the side surface of the control gate electrode 21 closer to the stepped portion 16 with a second insulating film 24 interposed therebetween, while it is opposed to the second surface region 14 with a third insulating film 25 serving as a tunneling film interposed therebetween. The first and third insulating films 22 and 25 may be composed of a single film and the second and third insulating films 24 and 25 may be composed of a single film.

An n-type source region 31 is formed in the first surface region 13 of the semiconductor substrate 11, while an n-type drain region 32 is formed in a region under the floating gate electrode 23.

The nonvolatile semiconductor memory device according to the first embodiment features a depletion control layer 33 which is composed of a heavily doped p-type impurity region and formed within the semiconductor substrate 11 to be located in the vicinity of the stepped portion 16. The depletion control layer 33 extends from a position at a distance from the upper corner of the stepped portion 16 and under the floating gate electrode 23 toward the lower corner of the stepped portion 16 and adjoin the end portion of the drain region 32 without reaching the step side region 15.

A description will be given to exemplary data write, erase, and read operations in the nonvolatile semiconductor memory device according to the present embodiment.

During the data write operation, a gate voltage of about 4.0 V to 7.0 V is applied to the control gate electrode 21, the source region 31 is grounded, and a drain voltage of about 4.0 V to 6.0 V is applied to the drain region 32. The application of the voltages generates hot electrons in the vicinity of the lower corner of the stepped portion 16, which pass through the third insulating film 25 to be injected into the floating gate electrode 23.

During the data erase operation, a gate voltage of about −5.0 V to −7.0 V is applied to the control gate electrode 21, a drain voltage of about 4.0 to 6.0 V is applied to the drain region 23, and the source region 31 is grounded. As a result, electrons accumulated in the floating gate electrode 23 are extracted to the drain region 32 through the third insulating film 25 due to a FN (Fowler-Nordheim) tunneling phenomenon.

During the data read operation, a source voltage of about 1.0 V to 3.0 V is applied to the source region 31, the drain region 32 is grounded, and a gate voltage of about 2.0 V to 4.0 V is applied to the control gate electrode 32 or, alternatively, a drain voltage of about 1.0 V to 3.0 V is applied to the drain region 32, the source region 31 is grounded, and a gate voltage of about 2.0 V to 4.0 V is applied to the control gate electrode 21. At this time, the threshold voltage of the control gate electrode 21 have different values depending on the presence or absence of the electrons accumulated in the floating gate electrode 23 to produce a difference in the amount of current flowing between the source and the drain, so that the presence or absence of data is determined by detecting the amount of the current.

Figure 2:
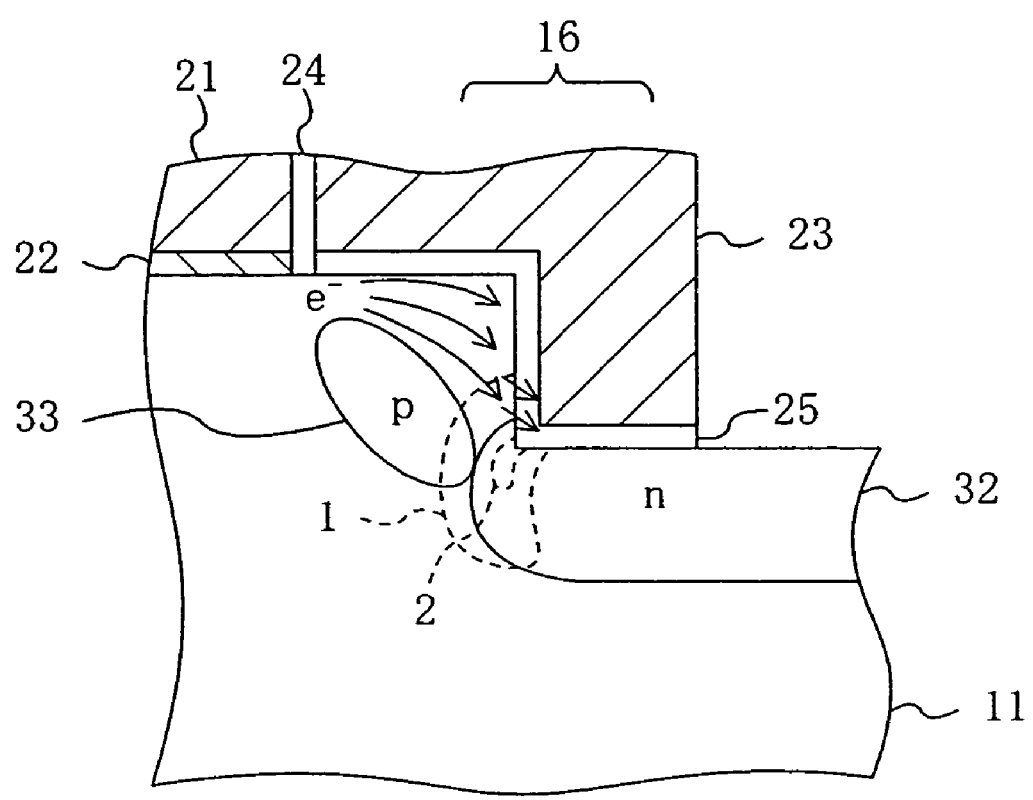
FIG. 2 is an enlarged cross-sectional view of a stepped portion and its vicinity in the split-gate nonvolatile semiconductor memory device according to the first embodiment, which shows electrons flowing toward a high electron temperature region generated in the vicinity of the lower corner of the stepped portion.

In the nonvolatile semiconductor memory according to the present embodiment, the depletion control layer 33 composed of the heavily doped p-type impurity region is formed at a position not reaching the first surface region 13 and step side region 15 of the stepped portion 16 to have the end portion thereof closer to the drain region 32 adjoining the drain region 32. During the write operation, therefore, electrons as carriers flowing toward a high electron temperature region 1 and a maximum electron temperature region 2 each generated in the vicinity of the lower corner of the stepped portion 16 to form a path (which is a channel), as shown in the diagram of FIG. 2. As a result, the channel electrons which have become hot electrons in the vicinity of the step side region 15 are injected efficiently into the floating gate electrode 23.

Figure 3A:
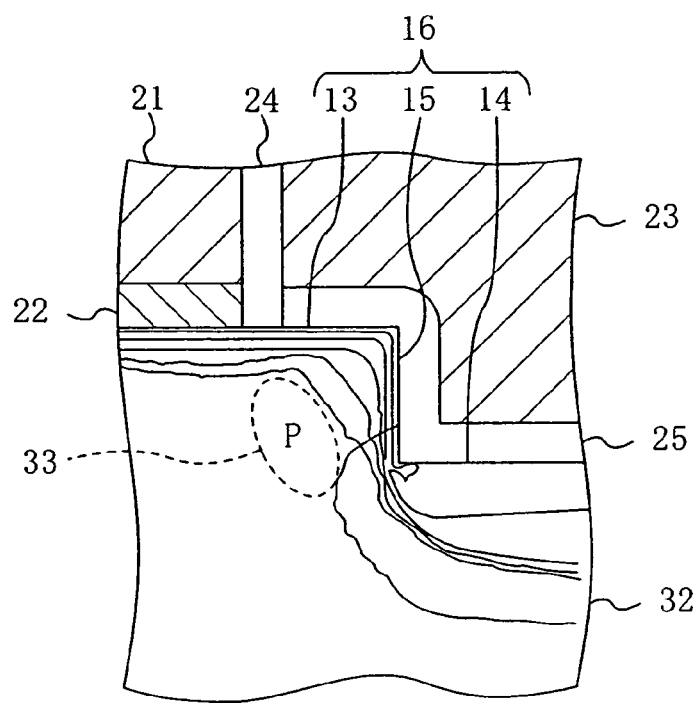
FIG. 3A is an enlarged cross-sectional view of the stepped portion and its vicinity in the split-gate nonvolatile semiconductor memory device according to the first embodiment, which shows the result of simulation using a calculator for a current density during a write operation.
Figure 3B:
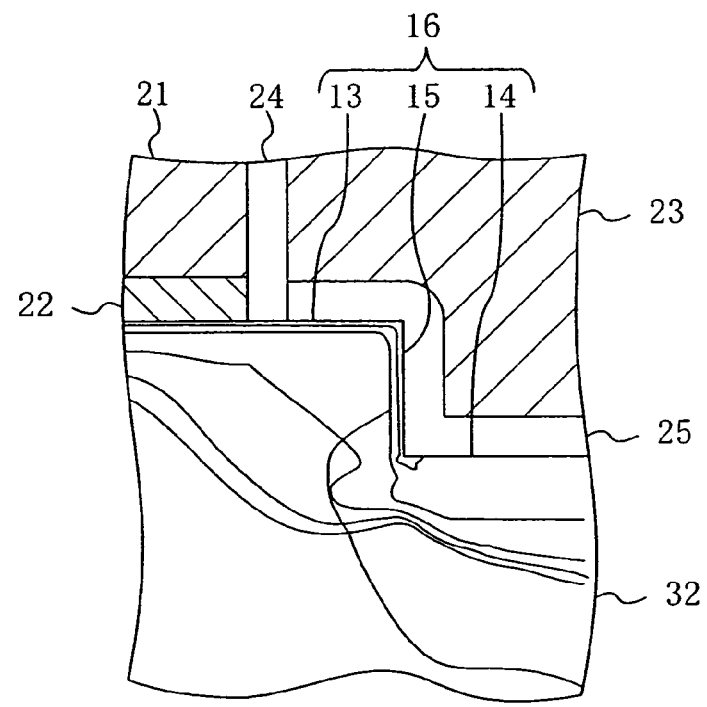
FIG. 3B is an enlarged cross-sectional view of a stepped portion and its vicinity in a conventional split-gate nonvolatile semiconductor memory device, which shows the result of simulation using a calculator for a current density during a write operation.

FIG. 3A shows the result of calculating a current density during the write operation in the vicinity of the stepped portion 16 in the nonvolatile semiconductor memory device according to the present embodiment by simulation using a calculator. FIG. 3B is for comparison, which shows the result of simulation in a conventional nonvolatile semiconductor memory device unformed with the depletion control layer 33.

As shown in FIG. 3A, the depletion control layer 33 in the semiconductor memory device according to the present embodiment is not depleted because of a p-type impurity contained therein at a high concentration. Instead, the portion of the semiconductor substrate 11 enclosed with the first surface region 13, the step side region 15, and the depletion control layer 33 is depleted to function as a channel region. As a result, electrons in the channel flow expansively toward the step side region 15.

Since a path of carriers is blocked by the depletion control layer 33, charges are accumulated in the floating gate electrode 23 to lower a potential at the floating gate electrode 23. Even if the electrons are strongly attracted to the drain region 32, the electrons passing through the portion of the channel region underlying the control gate electrode 21 are prevented from flowing directly into the drain region 32 so that the path of carriers flowing toward the lower corner of the stepped portion is retained. This provides a steady carrier path irrespective of the potential at the floating gate electrode 23 and improves the efficiency with which carriers are injected into the floating gate electrode 23.

In the conventional nonvolatile semiconductor memory device shown in FIG. 3B, by contrast, a region at a distance from the first surface region 13 and side surface region 15 of the stepped portion 16 is depleted disadvantageously during a write operation because of a p-type impurity contained therein at a low concentration so that the region functions as a channel. As a result, electrons in the channel flow directly into the drain region 32 without passing through the maximum electron temperature region generated in the vicinity of the lower corner of the stepped portion 16. This reduces the probability that the electrons are injected into the floating gate electrode 23.

The depletion control layer 33 also has the following effects. Since the depletion control layer 33 composed of the heavily doped p-type impurity region is formed to adjoin the end portion of the drain region 32, a pn junction with a sharp concentration gradient is formed at the interface between the depletion control layer 33 and the drain region 32 so that a high electric field is generated at the interface. By providing the depletion control layer 33 such that the high electric field generated at the interface therebetween is located in the vicinity of the lower corner of the stepped portion 16, the electron temperature in the high electron temperature region generated in the vicinity of the lower corner of the stepped portion 16 increases drastically, which greatly increases a write speed.

If the drain region 32 thoroughly covers the lower corner of the stepped portion 16, the potential at the corner is held high during the write operation due to the drain potential so that the potential across the step side region 15 presents a sharp gradient. As a result, the high electron temperature region generated in the vicinity of the lower corner of the stepped portion 16 expands to the step side region 15 and the write speed is increased.

Although the present embodiment has formed the step side region 15 of the stepped portion 16 which is nearly perpendicular to the second surface region 14, the angle formed between the step side region 15 and the second surface region 14 may be obtuse.

A description will be given herein below to a method for fabricating the nonvolatile semiconductor memory device thus constituted with reference to the drawings.

FIGS. 4A to 6B show the cross-sectional structures of the nonvolatile semiconductor memory device according to the first embodiment in the individual process steps of the fabrication method therefor.

Figure 4A:
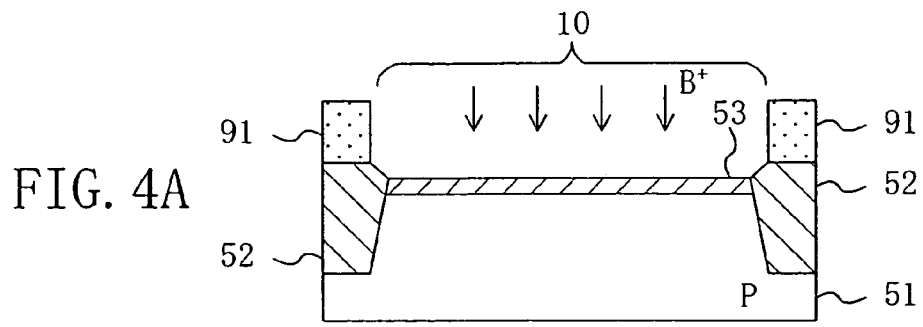
FIGS. 4A to 4D are cross-sectional views illustrating the individual process steps of a method for fabricating the split-gate nonvolatile semiconductor memory device according to the first embodiment.

First, as shown in FIG. 4A, an isolation layer 52 having, e.g., a trench isolation structure, is formed in a semiconductor substrate 51 composed of p-type silicon. Then, a protective oxide film 53 with a thickness of about 20 nm is formed by thermal oxidation or CVD on an active region 10 surrounded by the isolation layer 52. Thereafter, a first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 through the protective oxide film 53 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of about $0.5 \times 10^{13}$ cm$^{-2}$ to $1 \times 10^{13}$ cm$^{-2}$ are further implanted into the entire surface of the active region 10 with an implant energy of about 30 keV through the protective oxide film 53.

Figure 4B:
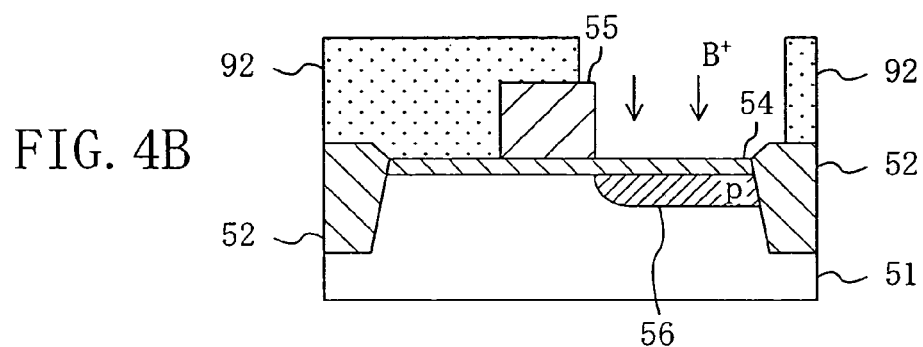

Next, as shown in FIG. 4B, the first resist pattern 91 and the protective oxide film 53 are removed and then a gate oxide film 54 serving as a first insulating film is formed again on the active region 10 by CVD or thermal oxidation. Thereafter, a first polysilicon film is deposited by, e.g., CVD over the entire surface of the semiconductor substrate 51. The deposited first polysilicon film is patterned by photolithography to form a control gate electrode 55 composed of polysilicon. Subsequently, a second resist pattern 92 having an opening over the region of the active region 10 to be formed with a drain is formed on the semiconductor substrate 51. By using the formed second resist pattern 92 and the control gate electrode 55 as a mask, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 15 keV, whereby a heavily doped p-type impurity layer 56 is formed in the drain formation region.

Figure 4C:
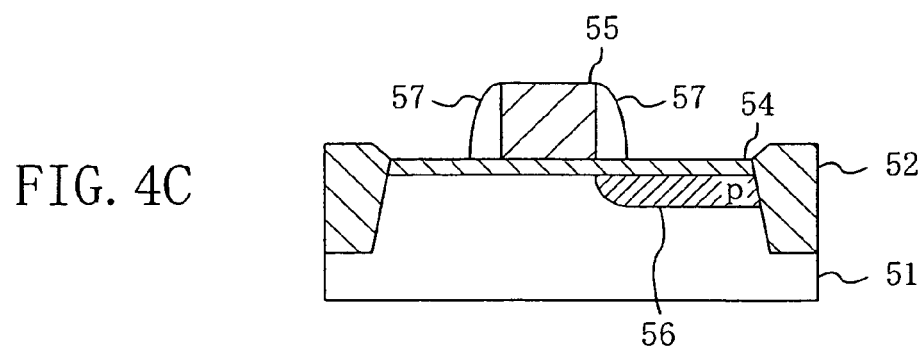

Then, as shown in FIG. 4C, the second resist pattern 92 is removed. Thereafter, a BPSG film is deposited by CVD over the entire surface of the semiconductor substrate 51. Subsequently, anisotropic etching is performed with respect to the deposited BPSG film to form sidewalls 57 composed of the BPSG film on the side surfaces of the control gate electrode 55. By adjusting the thickness of the deposited BPSG film, the distance between the side surface of the control gate electrode 55 and a stepped portion, which will be formed in the semiconductor substrate 51 in the subsequent step, can be determined by self alignment.

Figure 4D:
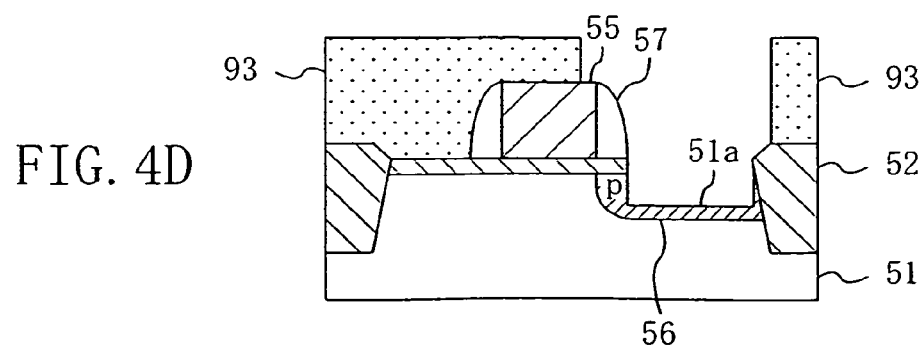

Next, as shown in FIG. 4D, a third resist pattern 93 having an opening over the drain formation region is formed on the semiconductor substrate 51. By using the formed third resist pattern 93, the gate electrode 55, and the sidewalls 57 as a mask, dry etching is performed with respect to the semiconductor substrate 51, thereby forming a recessed portion 51a in the drain formation region of the semiconductor substrate 51.

Figure 5A:
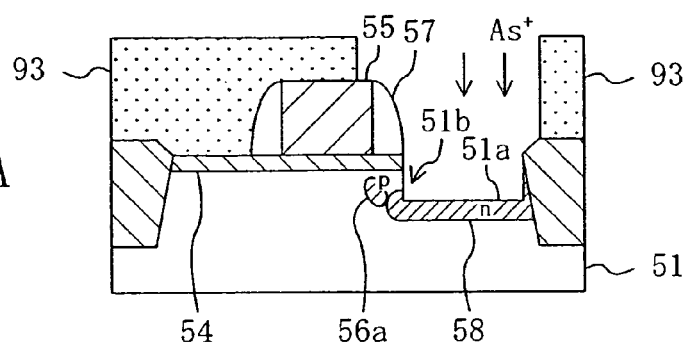
FIGS. 5A to 5D are cross-sectional views illustrating the individual process steps of the method for fabricating the split-gate nonvolatile semiconductor memory device according to the first embodiment.

Next, as shown in FIG. 5A, arsenic (As) ions at an implant dose of, e.g., about $0.5 \times 10^{14}$ cm$^{-2}$ to $5 \times 10^{14}$ cm$^{-2}$ are implanted into the semiconductor substrate 51 with an implant energy of about 10 keV by using the third resist pattern 93, the gate electrode 55, and the sidewalls 57 as a mask, whereby a lightly doped n-type drain region 58 is formed in the drain formation region.

At this time, the concentration of the p-type impurity in the portion of the heavily doped p-type impurity layer 56 underlying the sidewall 57 is lowered by a compensating effect exerted by the n-type impurity implanted during the formation of the lightly doped drain region 58. What results is a depletion control layer 56a composed of the heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region.

Figure 5B:
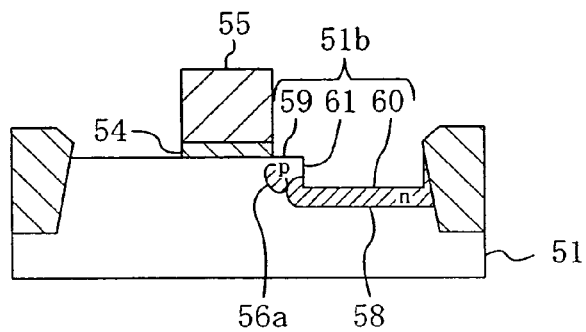

Next, as shown in FIG. 5B, the third resist pattern 93 is removed and then the sidewalls 57 and the exposed portion of the gate oxide film 54 are removed by wet etching, whereby the stepped portion 51b composed of a first surface region 59 serving as an upper stage, a second surface region 60 serving as a lower stage, and a step side region 61 connecting the upper and lower stages and the side surface of the control gate electrode 55 are exposed.

Figure 5C:
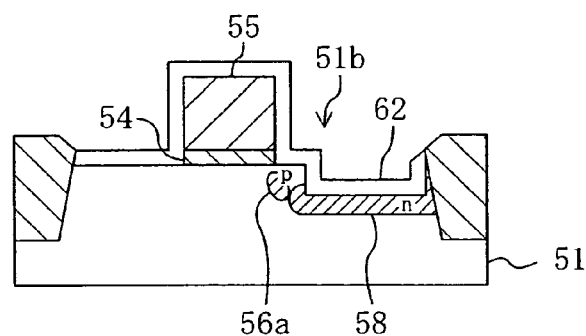

Next, as shown in FIG. 5C, a thermal oxide film 62 serving as second and third insulating films is formed by thermal oxidation on the exposed surface of the semiconductor substrate 51 including the stepped portion 51b and on the surface of the control gate electrode 55. The thermal oxide film 62 may also be a silicon dioxide film formed by CVD or the like.

Figure 5D:
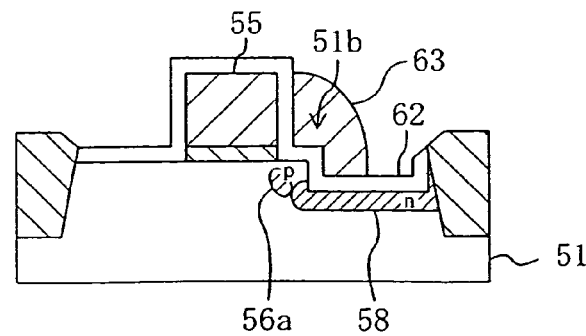

Next, as shown in FIG. 5D, a second polysilicon film is deposited by, e.g., CVD over the entire surface of the semiconductor substrate 51 including the control gate electrode 55. By performing anisotropic etching with respect to the deposited second polysilicon film, a floating gate electrode 63 composed of polysilicon, capacitively coupled to the side surface of the control gate electrode 55 closer to the stepped portion 51b with the thermal oxide film 62 interposed therebetween, and opposed to the second surface region 60 with the thermal oxide film 62 interposed therebetween is formed by self alignment so as to cover up the stepped portion 51b. The region of the thermal oxide film 62 sandwiched between the floating gate electrode 63 and the semiconductor substrate 51 functions as a tunnel film.

Figure 6A:
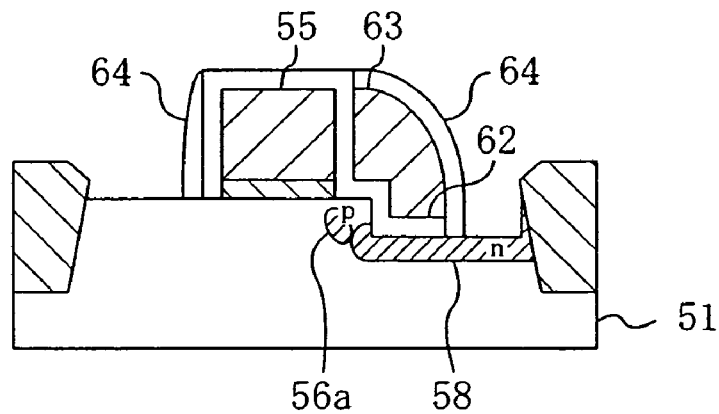
FIGS. 6A and 6B are cross-sectional views illustrating the individual process steps of the method for fabricating the split-gate nonvolatile semiconductor memory device according to the first embodiment.

Next, as shown in FIG. 6A, an insulating film 64 composed of a silicon dioxide or the like is formed over the entire surface of the semiconductor substrate 51. By subsequently etching the formed insulating film 64, the semiconductor substrate 51 is exposed.

Figure 6B:
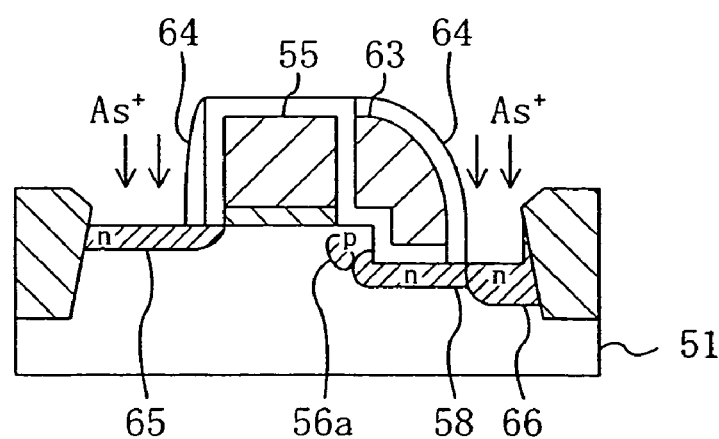

Next, as shown in FIG. 6B, arsenic (As) ions are implanted into the semiconductor substrate 51 by using the control gate electrode 55, the floating gate electrode 63, and the insulating film 64 as a mask so that a heavily doped source region 65 is formed in the region of the semiconductor substrate 51 opposite to the floating gate electrode 63 relative to the control gate electrode 55 and a heavily doped drain region 66 is formed in the region of the semiconductor substrate 51 closer to the floating gate electrode 63 than to the control gate electrode 55 and connecting to the lightly doped drain region 58, whereby the memory element in the nonvolatile semiconductor memory device is completed.

Thus, in accordance with the method for fabricating the nonvolatile semiconductor memory device of the first embodiment, the heavily doped p-type impurity layer 56 is formed in the drain formation region of the semiconductor substrate 51. Then, the recessed portion 51a is formed in the semiconductor substrate 51 by using the sidewalls 57 on the control gate electrode 55 as a mask, whereby the stepped portion 51b using the portion of the semiconductor substrate 51 underlying the sidewall 57 as the first surface region 59 (upper stage) and using the bottom surface of the recessed portion 51a as the second surface region 60 (lower stage) is formed. In subsequently forming the lightly doped n-type drain region 58 by implantation in the second surface region 60, the depletion control layer 56a having a desired impurity profile and located discretely in spaced apart and opposing relation to the upper corner of the stepped portion 51b to adjoin the lightly doped drain region 58 can be formed reliably by the compensating effect exerted on the heavily doped impurity layer 56.

Embodiment 2

A second embodiment of the present invention will be described with reference to the drawings.

Figure 7:
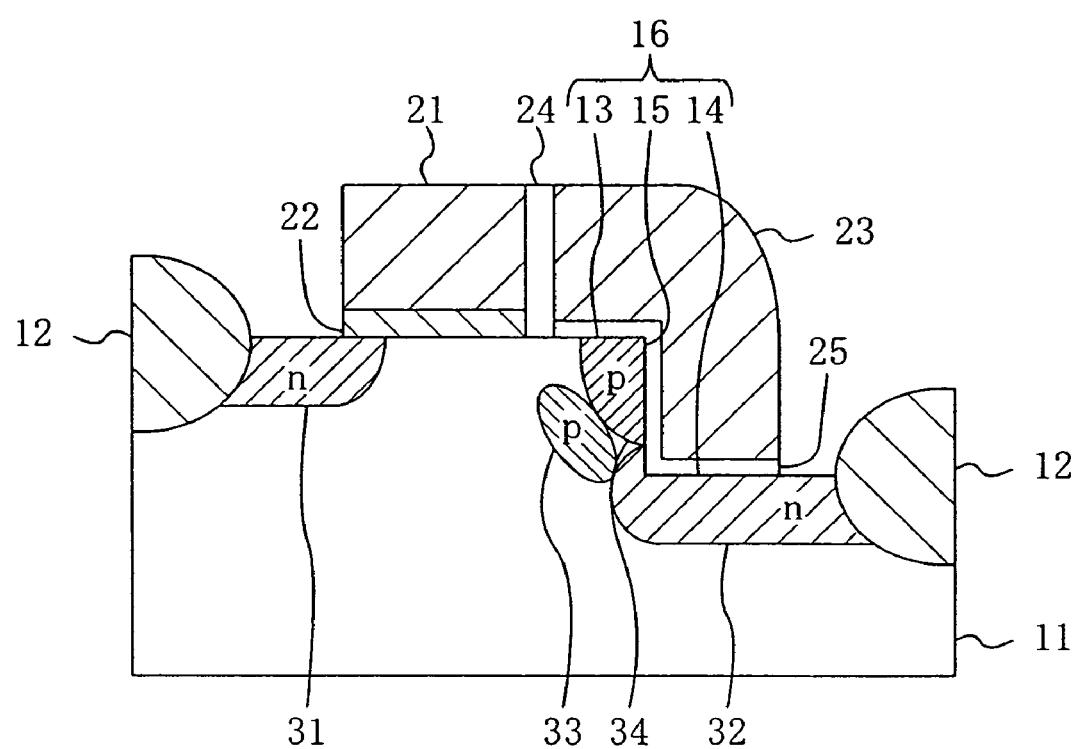
FIG. 7 is a structural cross-sectional view of a memory element in a split-gate nonvolatile semiconductor memory device according to a second embodiment of the present invention.

FIG. 7 shows a cross-sectional structure of a memory element in a split-gate nonvolatile semiconductor memory device according to the second embodiment. In FIG. 7, the description of the same components as used in the first embodiment and shown in FIG. 1 will be omitted by retaining the same reference numerals.

As shown in FIG. 7, the nonvolatile semiconductor memory device according to the second embodiment features a high-electric-field forming layer 34 formed between the upper corner of the stepped portion 16 and the depletion control layer 33 and composed of a p-type impurity region having the same conductivity type as the depletion control layer 33. The concentration of a p-type impurity in the high-electric-field forming layer 34 has been adjusted to be lower than the concentration of a p-type impurity in the depletion control layer 33 and higher than the concentration of a p-type impurity in the semiconductor substrate 11.

Since the second embodiment has provided the p-type high-electric-field forming layer 34 between the upper corner of the stepped portion 16 and the depletion control layer 33, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the drain region 32 to overlap each of the high electric field generated by the lower corner of the stepped portion 16 and a high electric field generated at the interface between the depletion control layer 33 and the drain region 32, so that an electron temperature in the vicinity of the lower corner of the stepped portion 16 is further increased. This increases the number of electrons in the channel that have become hot electrons and remarkably improves the efficiency with which the electrons are injected into the floating gate electrode 23.

In addition, the high-electric-field forming layer 34 formed independently of the depletion control layer 33 achieves the effect of enhancing the controllability of the threshold voltage of the memory element.

As described in the first embodiment, for the portion of the semiconductor substrate 11 enclosed with the depletion control layer 33, the first surface region 13, and the step side region 15 to function as the channel and for the channel electrons to retain a path of carriers flowing expansively toward the step side region 15, the high-electric-field forming layer 34 preferably has an impurity concentration sufficient to be depleted during a write operation.

In the present embodiment also, the angle formed between the step side region 15 and the second surface region 14 may be obtuse.

A description will be given herein below to a method for fabricating the nonvolatile semiconductor memory device thus constituted with reference to the drawings.

FIGS. 8A to 10B show the cross-sectional structures of the nonvolatile semiconductor memory device according to the second embodiment in the individual process steps of the fabrication method therefor.

Figure 8A:
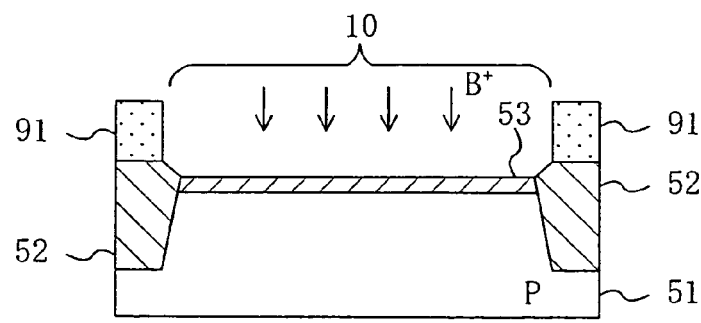
FIGS. 8A to 8D are cross-sectional views illustrating the individual process steps of a method for fabricating the split-gate nonvolatile semiconductor memory device according to the second embodiment.

First, as shown in FIG. 8A, the isolation layer 52 having, e.g., a trench isolation structure, is formed in the semiconductor substrate 51 composed of p-type silicon. Then, the protective oxide film 53 with a thickness of about 20 nm is formed by thermal oxidation or CVD on the active-region 10 surrounded by the isolation layer 52. Thereafter, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 through the protective oxide film 53 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of about $0.5 \times 10^{13}$ cm$^{-2}$ to $1 \times 10^{13}$ cm$^{-2}$ are further implanted into the entire surface of the active region 10 with an implant energy of about 30 keV through the protective oxide film 53.

Figure 8B:
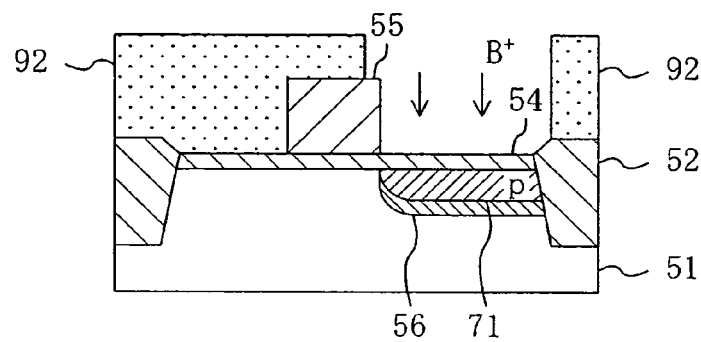

Next, as shown in FIG. 8B, the first resist pattern 91 and the protective oxide film 53 are removed and then the gate oxide film 54 serving as the first insulating film is formed again on the active region 10 by CVD or thermal oxidation. Thereafter, the first polysilicon film is deposited by, e.g., CVD over the entire surface of the semiconductor substrate 51. The deposited first polysilicon film is patterned by photolithography to form the control gate electrode 55 composed of polysilicon. Subsequently, the second resist pattern 92 having an opening over the region of the active region 10 to be formed with the drain is formed on the semiconductor substrate 51. By using the formed second resist pattern 92 and the control gate electrode 55 as a mask, boron (B) ions are implanted in two steps with different acceleration voltages. In the first step, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 30 keV, whereby a first heavily doped p-type impurity layer 56 is formed in the drain formation region. In the second step, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 15 keV, whereby a second heavily doped p-type impurity layer 71 having a junction depth shallower than that of the first heavily doped impurity layer 56 is formed in the drain formation region.

Figure 8C:
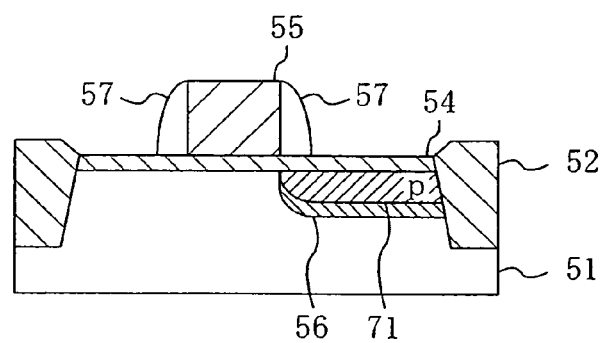

Then, as shown in FIG. 8C, the second resist pattern 92 is removed. Thereafter, the BPSG film is deposited by CVD over the entire surface of the semiconductor substrate 51. Subsequently, anisotropic etching is performed with respect to the deposited BPSG film to form the sidewalls 57 composed of the BPSG film on the side surfaces of the control gate electrode 55. By adjusting the thickness of the deposited BPSG film, the distance between the side surface of the control gate electrode 55 and the stepped portion, which will be formed in the semiconductor substrate 51 in the subsequent step, can be determined by self alignment.

Figure 8D:
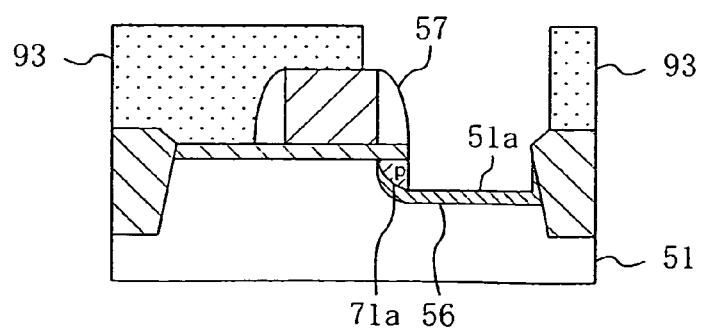

Next, as shown in FIG. 8D, the resist pattern 93 having an opening over the drain formation region is formed on the semiconductor substrate 51. By using the formed third resist pattern 93, the gate electrode 55, and the sidewalls 57 as a mask, dry etching is performed with respect to the semiconductor substrate 51, thereby forming the recessed portion 51a in the drain formation region of the semiconductor substrate 51.

Figure 9A:
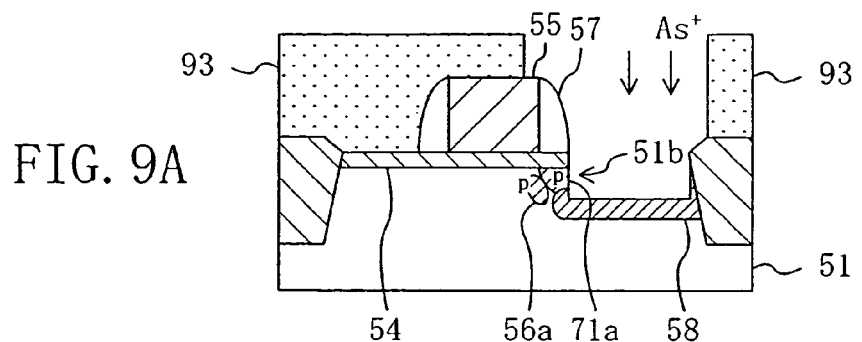
FIGS. 9A to 9D are cross-sectional views illustrating the individual process steps of the method for fabricating the split-gate nonvolatile semiconductor memory device according to the second embodiment.

Next, as shown in FIG. 9A, arsenic (As) ions at an implant dose of, e.g., about $0.5 \times 10^{14}$ cm$^{-2}$ to $5 \times 10^{14}$ cm$^{-2}$ are implanted into the semiconductor substrate 51 with an implant energy of about 10 keV by using the third resist pattern 93, the gate electrode 55, and the sidewalls 57 as a mask, whereby the lightly doped n-type drain region 58 is formed in the drain formation region.

At this time, the concentration of the p-type impurity in the portion of the heavily doped p-type impurity layer 56 underlying the sidewall 57 is lowered by the compensating effect exerted by the n-type impurity implanted during the formation of the lightly doped drain region 58. What results is the depletion control layer 56a composed of the first heavily doped p-type impurity layer 56 and formed in the stepped portion 51b of the recessed portion 51a in the semiconductor substrate 51 closer to the control gate electrode 55 to extend from a position located under the control gate electrode 55c and at a distance from the upper corner of the stepped portion 51b toward the lower corner of the stepped portion 51b and adjoin the lightly doped drain region 58 without reaching the step side region.

At the same time, a high-electric-field forming layer 71a which is lower in concentration than the first heavily doped impurity layer 56 due to the compensating effect during the formation of the lightly doped drain region 58 can be formed from the second heavily doped p-type impurity layer 71 to be located between the upper corner of the stepped portion 51b and the depletion control layer 56a.

Figure 9B:
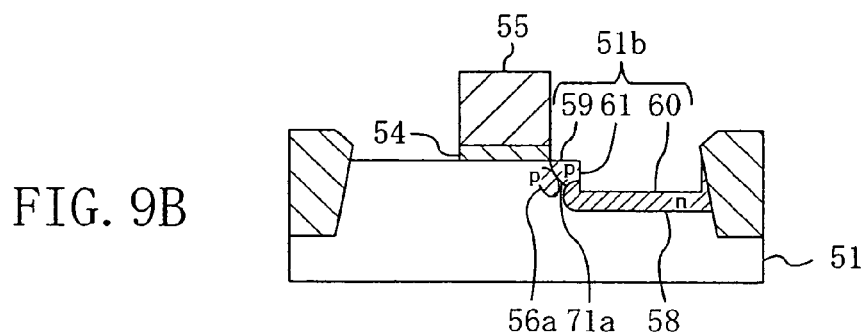

Next, as shown in FIG. 9B, the third resist pattern 93 is removed and then the sidewalls 57 and the exposed portion of the gate oxide film 54 are removed by wet etching, whereby the stepped portion 51b composed of the first surface region 59 serving as the upper stage, the second surface region 60 serving as the lower stage, and the step side region 61 connecting the upper and lower stages and the side surface of the control gate electrode 55 are exposed.

Figure 9C:
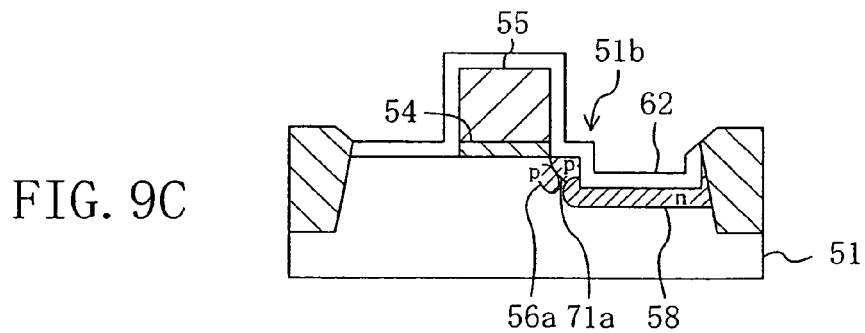

Next, as shown in FIG. 9C, the thermal oxide film 62 serving as the second and third insulating films is formed by thermal oxidation on the exposed surface of the semiconductor substrate 51 including the stepped portion 51b and on the surface of the control gate electrode 55. The thermal oxide film 62 may also be a silicon dioxide film formed by CVD or the like.

Figure 9D:
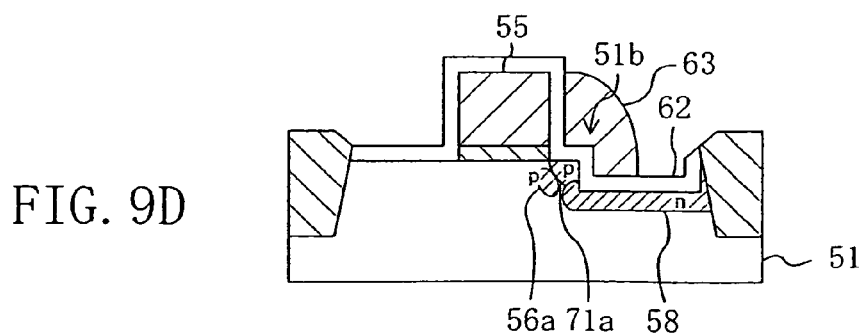

Next, as shown in FIG. 9D, the second polysilicon film is deposited by, e.g., CVD over the entire surface of the semiconductor substrate 51 including the control gate electrode 55. By performing anisotropic etching with respect to the deposited second polysilicon film, the floating gate electrode 63 composed of polysilicon, capacitively coupled to the side surface of the control gate electrode 55 closer to the stepped portion 51b with the thermal oxide film 62 interposed therebetween, and opposed to the second surface region 60 with the thermal oxide film 62 interposed therebetween is formed by self alignment to cover up the stepped portion 51b. The region of the thermal oxide film 62 sandwiched between the floating gate electrode 63 and the semiconductor substrate 51 functions as the tunnel film.

Figure 10A:
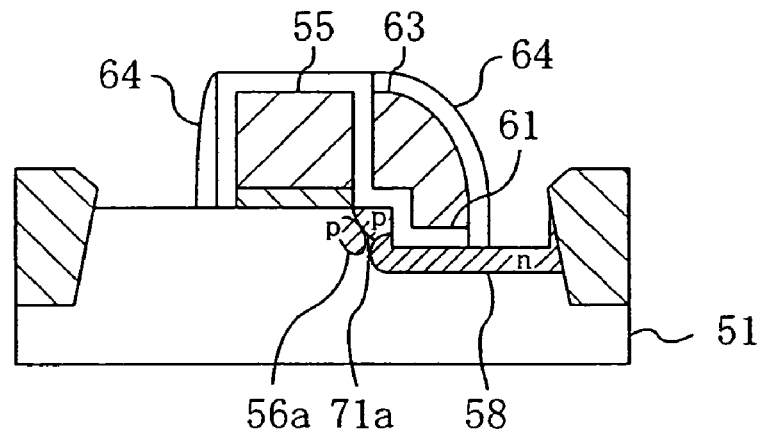
FIGS. 10A and 10B are cross-sectional views illustrating the individual process steps of the method for fabricating the split-gate nonvolatile semiconductor memory device according to the second embodiment.

Next, as shown in FIG. 10A, the insulating film 64 composed of a silicon dioxide or the like is formed over the entire surface of the semiconductor substrate 51. By subsequently etching the formed insulating film 64, the semiconductor substrate 51 is exposed.

Figure 10B:
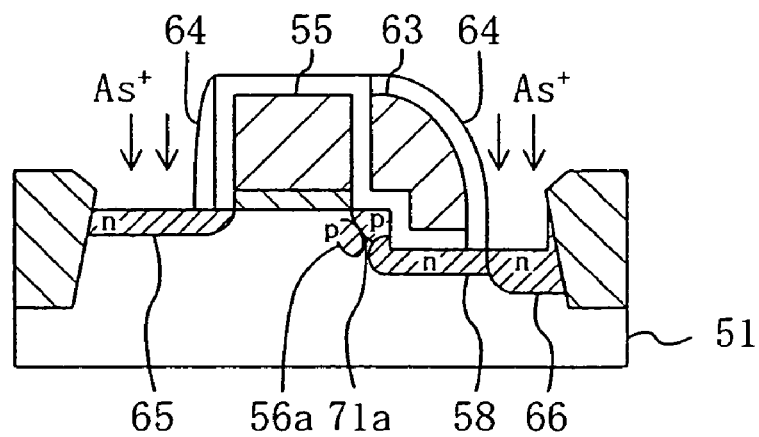

Next, as shown in FIG. 10B, arsenic (As) ions are implanted into the semiconductor substrate 51 by using the control gate electrode 55, the floating gate electrode 63, and the insulating film 64 as a mask so that the heavily doped source region 65 is formed in the region of the semiconductor substrate 51 opposite to the floating gate electrode 63 relative to the control gate electrode 55 and a heavily doped drain region 66 is formed in the region of the semiconductor substrate 51 closer to the floating gate electrode 63 than to the control gate electrode 55 and connecting to the lightly doped drain region 58, whereby the memory element in the nonvolatile semiconductor memory device is completed.

Thus, in accordance with the method for fabricating the nonvolatile semiconductor memory device of the second embodiment, the first heavily doped p-type impurity layer 56 and the second heavily doped impurity layer 71 having a junction shallower than that of the first heavily doped impurity layer 56 are formed in the drain formation region of the semiconductor substrate 51. Then, the recessed portion 51a is formed in the semiconductor substrate 51 by using the sidewalls 57 on the control gate electrode 55 as a mask, whereby the stepped portion 51b using the portion of the semiconductor substrate 51 underlying the sidewall 57 as the first surface region (upper stage) and using the bottom surface of the recessed portion 51a as the second surface region 60 (lower stage) is formed. In subsequently forming the lightly doped n-type drain region 58 by implantation in the second surface region 60, the depletion control layer 56a having a desired impurity profile and located discretely in spaced apart and opposing relation to the upper corner of the stepped portion 51b to adjoin the lightly doped drain region 58 can be formed reliably by the compensating effect exerted on the first heavily doped impurity layer 56. In addition, the high-electric-field forming layer 71a composed of the second heavily doped impurity layer 71 and having a desired impurity profile can be formed between the upper corner of the stepped portion 51b and the depletion control layer 56a.

Although the second embodiment has formed the first and second heavily doped impurity layers 56 and 71 by performing the two consecutive steps of ion implantation using the same third resist pattern 93 and thereby formed different impurity profiles desired in the respective heavily doped impurity layers, it will easily be appreciated that the desired impurity profiles can also be achieved in the first and second heavily doped impurity layers 56 and 71 even if the first and second steps of ion implantation are performed by using different mask patterns.

Embodiment 3

A third embodiment of the present invention will be described with reference to the drawings.

Figure 11:
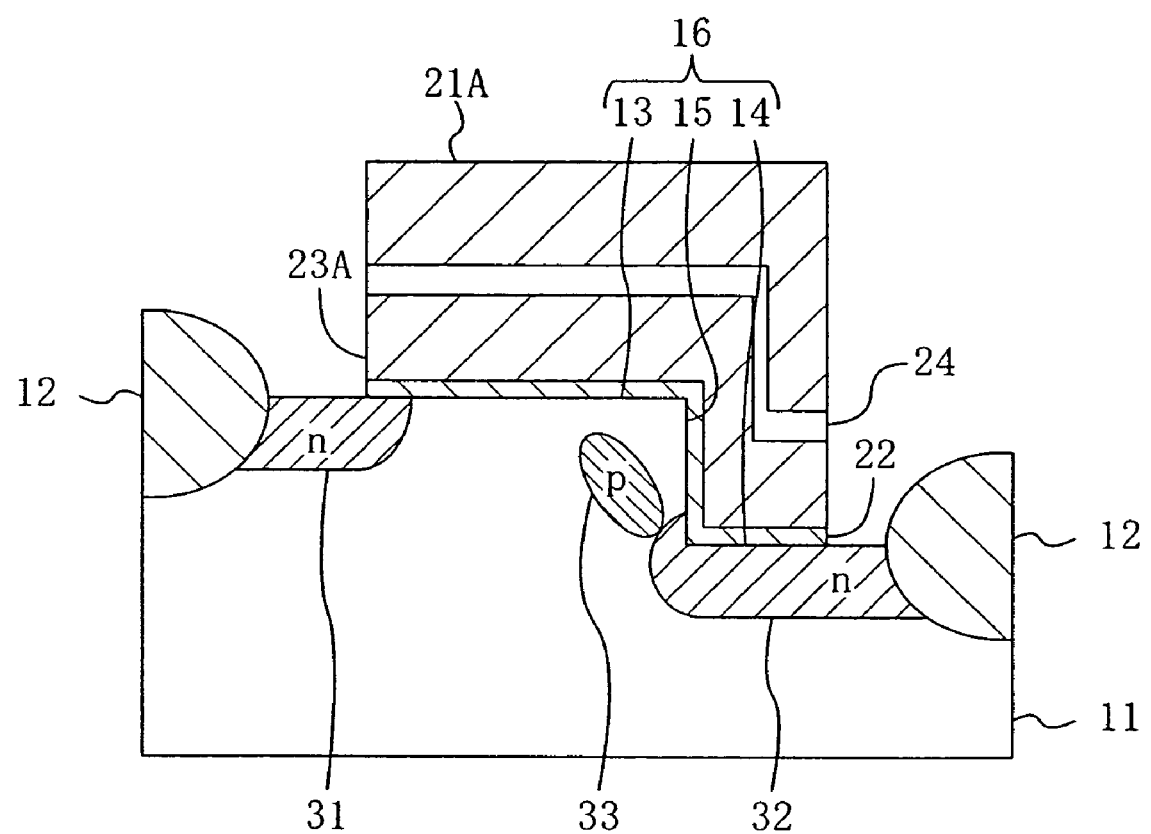
FIG. 11 is a structural cross-sectional view of a memory element in a stacked-gate nonvolatile semiconductor memory device according to a third embodiment of the present invention.

FIG. 11 shows a cross-sectional structure of a memory element in a stacked-gate nonvolatile semiconductor memory device according to the third embodiment. In FIG. 11, the description of the same components as shown in FIG. 1 will be omitted by retaining the same reference numerals.

The nonvolatile semiconductor memory device according to the third embodiment comprises a floating gate electrode 23A formed to cover up the stepped portion 16 formed in the active region of the semiconductor substrate 11 with the first insulating film 22 serving as a tunnel insulating film interposed therebetween and a control gate electrode 21A formed on the floating gate electrode with the second insulating film 24 interposed therebetween to be capacitively coupled to the floating gate electrode 23A.

Thus, the nonvolatile semiconductor memory device according to the third embodiment is of a stacked gate type having the drain region 32 in the second surface region 14 serving as the lower stage of the stepped portion 16, while having the floating gate electrode 23A and the control gate electrode 21A stacked successively on the substrate to cover up the stepped portion. The nonvolatile semiconductor memory device according to the present embodiment has the depletion control layer 33 composed of a heavily doped impurity region of the conductivity type opposite to that of the drain region 32 and formed within the semiconductor substrate 11 to extend from a position located under the first surface region 13 and at a distance from the upper corner of the stepped portion 16 toward the lower corner of the stepped portion 16 and adjoin the drain region 32 without reaching the step side region 15.

Since the depletion control layer 33 of the conductivity type opposite to that of the drain region is provided at the position at a distance from the upper corner of the stepped portion 16 to adjoin the drain region 32, similarly to the first embodiment, the depletion control layer 33 containing a p-type impurity at a high concentration is not depleted during a write operation. Instead, the portion of the semiconductor substrate 11 enclosed with the first surface region 13, the step side region 15, and the depletion control layer 33 is depleted to function as a channel. This causes electrons in the channel to flow expansively toward the step side region 15 and improves the efficiency with which carriers are injected into the floating gate electrode 23A.

Moreover, since the depletion control layer 33 composed of the heavily doped p-type impurity region is formed to adjoin the end portion of the n-type drain region 32, a pn junction with a sharp concentration gradient is formed at the interface between the depletion control layer 33 and the drain region 32 so that a high electric field is generated at the interface. By providing the depletion control layer 33 such that the high electric field generated at the interface therebetween is located in the vicinity of the lower corner of the stepped portion 16, the electron temperature in the high electron temperature region generated in the vicinity of the lower corner of the stepped portion 16 increases drastically, which greatly increases a write speed.

If the drain region 32 thoroughly covers the lower corner of the stepped portion 16, the potential at the corner is held high during the write operation due to the drain potential so that the potential in the step side region 15 presents a sharp gradient. As a result, the high electron temperature region generated in the vicinity of the lower corner of the stepped portion 16 expands to the step side region 15 and the write speed is increased.

In the present embodiment also, the angle formed between the step side region 15 and the second surface region 14 may be obtuse.

A description will be given herein below to a method for fabricating the nonvolatile semiconductor memory device thus constituted with reference to the drawings.

FIGS. 12A to 14 show the cross sectional structures of the nonvolatile semiconductor memory device according to the third embodiment in the individual process steps of the fabrication method therefor.

Figure 12A:
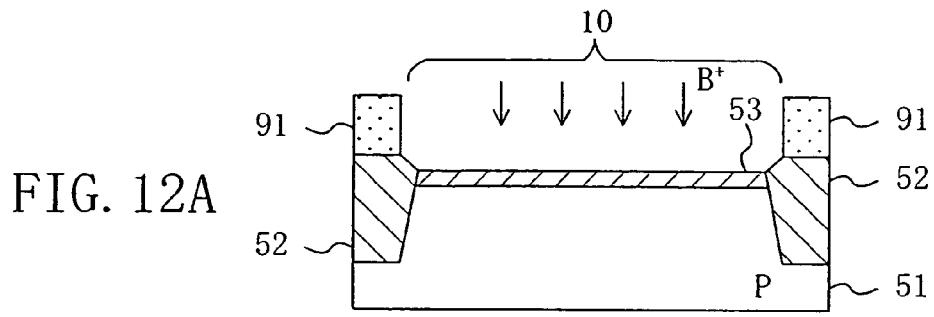
FIGS. 12A to 12D are cross-sectional views illustrating the individual process steps of the method for fabricating the stacked-gate nonvolatile semiconductor memory device according to the third embodiment.

First, as shown in FIG. 12A, the isolation layer 52 having, e.g., a trench isolation structure, is formed on the semiconductor substrate 51 composed of p-type silicon. Then, the protective oxide film 53 with a thickness of about 20 nm is formed by thermal oxidation or CVD on the active region 10 surrounded by the isolation layer 52. Thereafter, the first resist pattern 91 including a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-1}$ are implanted into the semiconductor substrate 51 through the protective oxide film 53 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of about $0.5 \times 10^{13}$ cm$^{-2}$ to $1 \times 10^{13}$ cm$^{-2}$ are further implanted into the entire surface of the active region 10 with an implant energy of about 30 keV through the protective oxide film 53.

Figure 12B:
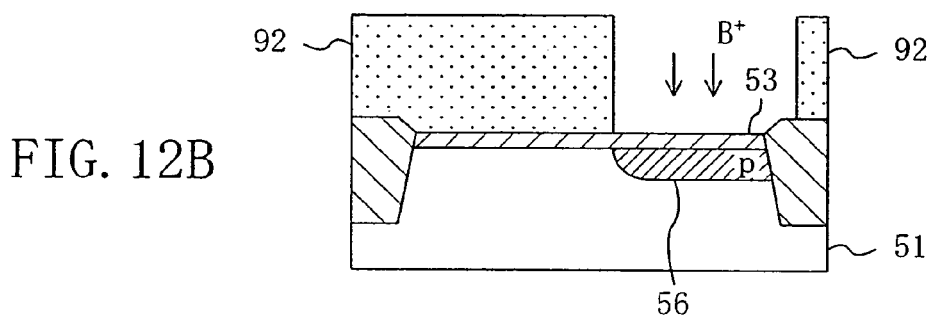

Next, as shown in FIG. 12B, the first resist pattern 91 is removed and then the second resist pattern 92 having an opening over the drain formation region of the active region 10 is formed on the semiconductor substrate 51. By using the formed second resist pattern 92 as a mask, boron (B) ions at an implant dose of, e.g., about $0.5 \times 10^{13}$ cm$^{-2}$ to $1 \times 10^{14}$ cm$^{-1}$ are implanted into the semiconductor substrate 51 through the gate oxide film 54 with an implant energy of about 15 keV, whereby the heavily doped p-type impurity layer 56 is formed in the drain formation region.

Figure 12C:
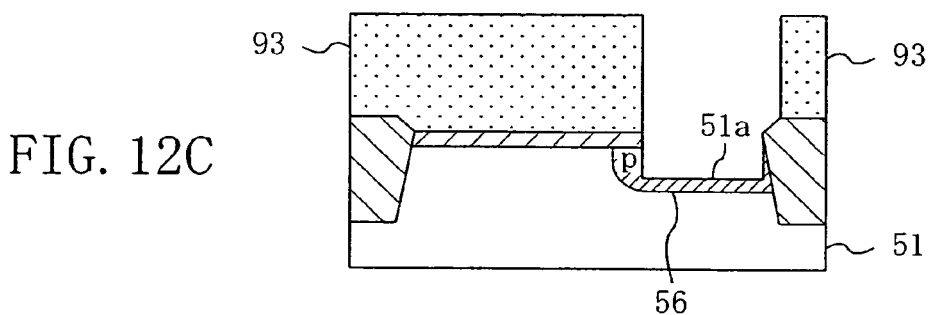

Then, as shown in FIG. 12C, the second resist pattern 92 is removed and the third resist pattern 93 for masking a region to be formed with a source and the end portion of the heavily doped impurity layer 56 closer to the source formation region is formed on the semiconductor substrate 51. By using the formed third resist pattern 93 as a mask, dry etching is performed with respect to the semiconductor substrate 51, thereby forming the recessed portion 51a in the drain formation region of the semiconductor substrate 5i. At this time, the dimension of the depletion control layer 56a in the direction of the gate length, which will be formed from the heavily doped impurity layer 56 in the subsequent step, can be optimized by adjusting the amount of masking (overlapping) the end portion of the heavily doped impurity layer 56 closer to the source formation region.

Figure 12D:
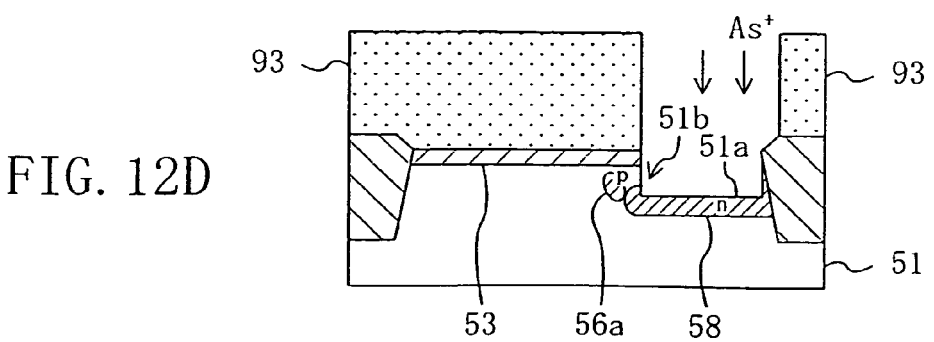

Next, as shown in FIG. 12D, arsenic (As) ions at an implant dose of, e.g., about $0.5 \times 10^{14}$ cm$^{-2}$ to $5 \times 10^{14}$ cm$^{-2}$ are implanted into the semiconductor substrate 51 with an implant energy of about 10 keV by using the third resist pattern 93 as a mask, whereby the lightly doped n-type drain region 58 is formed in the drain formation region.

At this time, the concentration of the p-type impurity in the portion of the heavily doped p-type impurity layer 56 underlying the sidewall 57 is lowered by the compensating effect exerted by the n-type impurity implanted during the formation of the lightly doped drain region 58. What results is the depletion control layer 56a composed of the heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region.

Figure 13A:
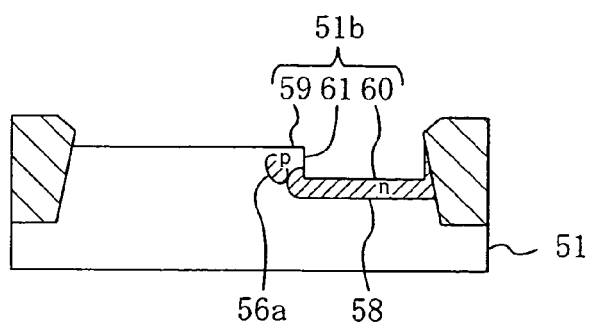
FIGS. 13A to 13D are cross-sectional views illustrating the individual process steps of the method for fabricating the stacked-gate nonvolatile semiconductor memory device according to the third embodiment.

Next, as shown in FIG. 13A, the third resist pattern 93 and the protective oxide film 53 are removed, whereby the stepped portion 51b composed of the upper surface of the semiconductor substrate 51, i.e., the first surface region 59 serving as the upper stage, the second surface region 60 serving as the lower stage, and the step side region 61 connecting the upper and lower stages is exposed.

Figure 13B:
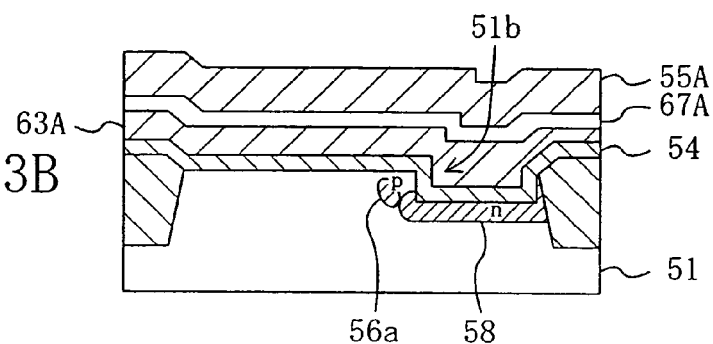

Next, as shown in FIG. 13B, the gate oxide film 54 serving as the first insulating film is formed on the exposed surface of the semiconductor substrate 51 including the stepped portion 51b. Then, a first polysilicon film 63A, a silicon dioxide film 67A serving as the second insulating film, and a second polysilicon film 55A are deposited by, e.g., CVD over the entire surface of the gate oxide film 54. The silicon dioxide film 67A may also be formed as a thermal oxide film.

Figure 13C:
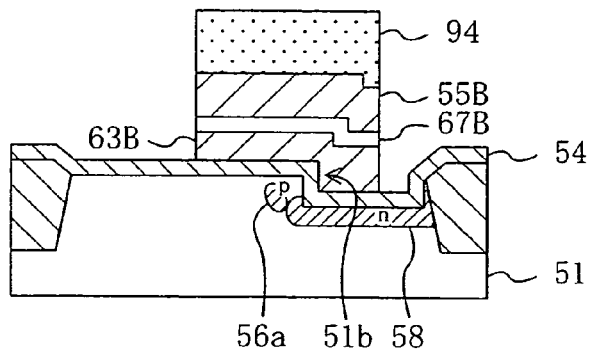

Next, as shown in FIG. 13C, a fourth resist pattern 94 including a pattern for a gate electrode which covers up the stepped portion 51b is formed on the second polysilicon film. 55A. By using the formed fourth resist pattern 94 as a mask, anisotropic etching is performed with respect to the second polysilicon film 55A, the silicon dioxide film 67A, and the first polysilicon film 63A, thereby forming a floating gate electrode 63B composed of the first polysilicon film 63A, a capacitance insulating film 67B composed of the silicon dioxide film 67A, and a floating gate electrode 55B composed of the second polysilicon film 55A. The gate oxide film 54 between the semiconductor substrate 51 and the floating gate electrode 63B functions as the tunnel film.

Figure 13D:
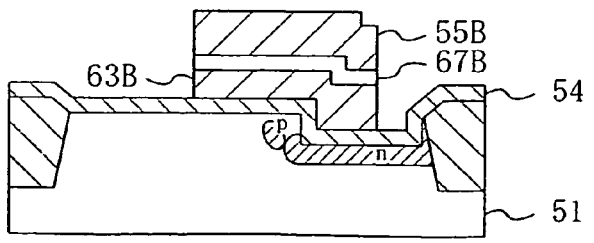
Figure 14:
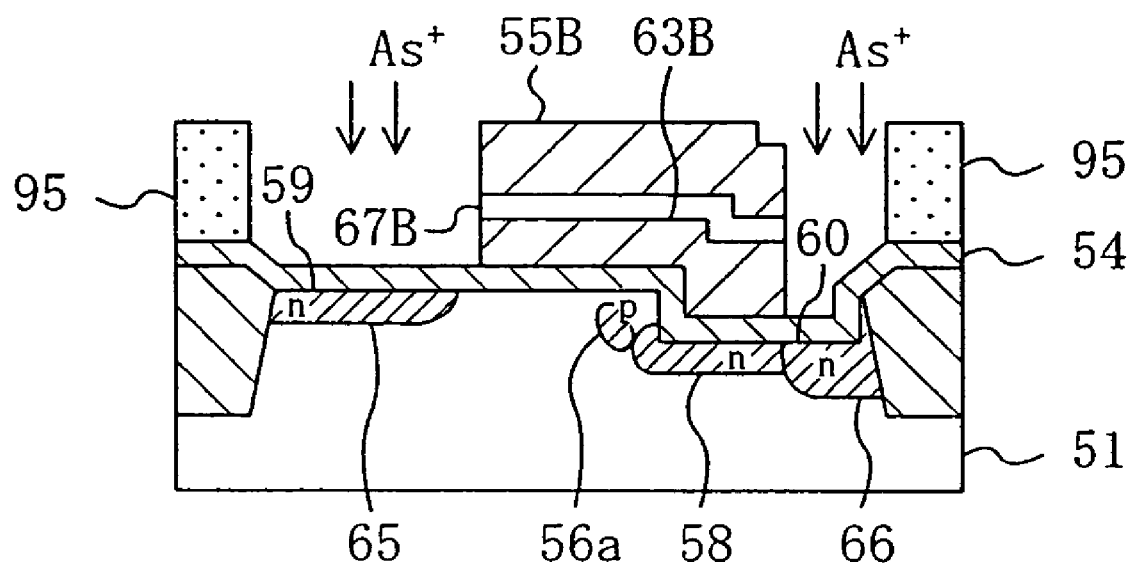
FIG. 14 is a cross-sectional view illustrating the process step of the method for fabricating the stacked-gate nonvolatile semiconductor memory device according to the third embodiment.

Next, as shown in FIG. 13D, the fourth resist pattern 94 is removed. Then, as shown in FIG. 14, a fifth resist pattern 95 having an opening over the source formation region and the drain formation region is formed. By using the formed fifth resist pattern 95 and the control gate electrode 55B as a mask, arsenic (As) ions are implanted into the semiconductor substrate 51 so that the heavily doped source region 65 is formed in the first surface region 59 of the semiconductor substrate 51 and the heavily doped drain region 66 is formed in the area of the second surface region 60 of the semiconductor substrate 51 connecting to the lightly doped drain region 58, whereby the memory element in the stacked-gate nonvolatile semiconductor memory device is completed.

Thus, in accordance with the method for fabricating the nonvolatile semiconductor memory device of the third embodiment, the heavily doped p-type impurity layer 56 is formed in the drain formation region of the semiconductor substrate 51. Then, the recessed portion 51a is formed in the semiconductor substrate 51 by masking the end portion of the heavily doped impurity layer 56 closer to the source region, whereby the stepped portion 51b using the portion of the semiconductor substrate 51 underlying the sidewall 57 as the first surface region 59 (upper stage) and using the bottom surface of the recessed portion 51a as the second surface region 60 (lower stage) is formed. In subsequently forming the lightly doped n-type drain region 58 by implantation in the second surface region 60, the depletion control layer 56a having a desired impurity profile and located discretely in spaced apart and opposing relation to the upper corner of the stepped portion 51b to adjoin the lightly doped drain region 58 can be formed reliably by the compensating effect exerted on the heavily doped impurity layer 56.

Embodiment 4

A fourth embodiment of the present invention will be described with reference to the drawings.

Figure 15:
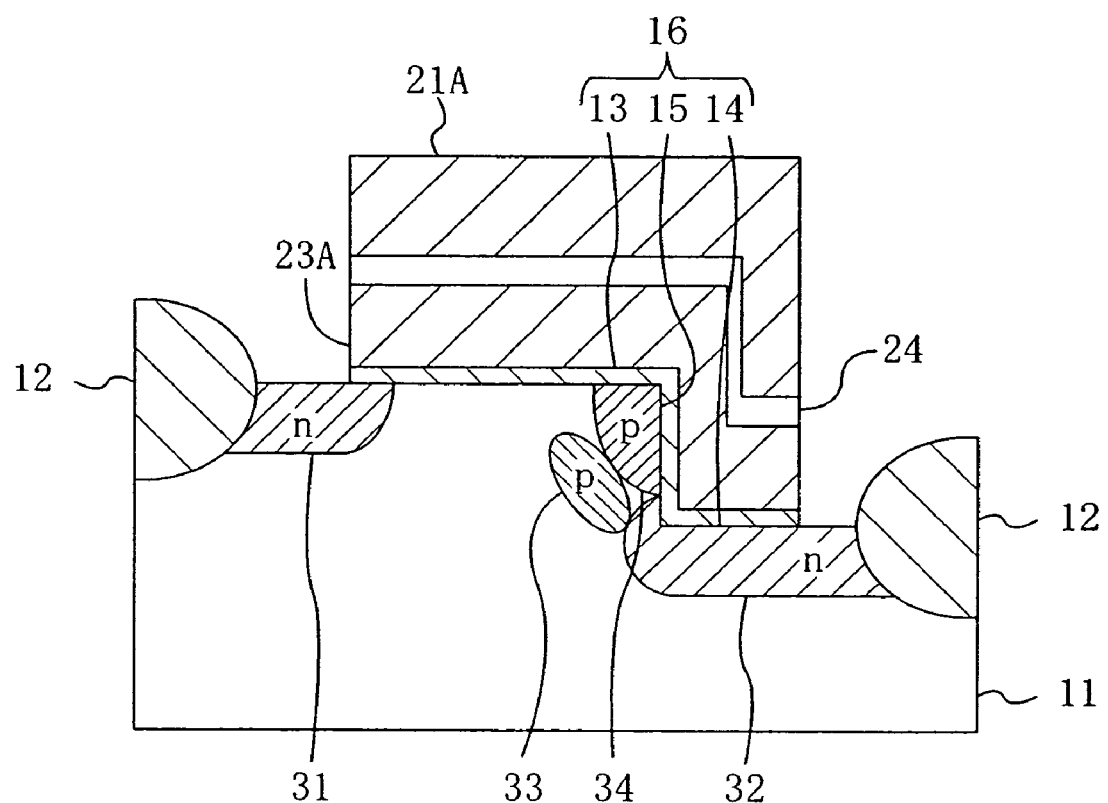
FIG. 15 is a structural cross-sectional view of a memory element in a stacked-gate nonvolatile semiconductor memory device according to a fourth embodiment of the present invention.

FIG. 15 shows a cross-sectional structure of a memory element in a stacked-gate nonvolatile semiconductor memory device according to the fourth embodiment. In FIG. 15, the description of the same components as used in the third embodiment and shown in FIG. 11 will be omitted by retaining the same reference numerals.

As shown in FIG. 15, the nonvolatile semiconductor memory device according to the fourth embodiment features the high-electric-field forming layer 34 composed of a p-type impurity region having the same conductivity type as the depletion control layer and formed between the upper corner of the stepped portion 16 and the depletion control layer 33. The concentration of a p-type impurity in the high-electric-field forming layer 34 has been adjusted to be lower than the concentration of a p-type impurity in the depletion control layer 33 and higher than the concentration of a p-type impurity in the semiconductor substrate 11.

Since the fourth embodiment has provided the p-type high-electric-field forming layer 34 between the upper corner of the stepped portion 16 and the depletion control layer 33, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the drain region 32 to overlap each of the high electric field generated by the lower corner of the stepped portion 16 and the high electric field generated at the interface between the depletion control layer 33 and the drain region 32, so that the electron temperature in the vicinity of the lower corner of the stepped portion 16 is further increased. This increases the number of electrons in the channel that have become hot electrons and remarkably improves the efficiency with which the electrons are injected into the floating gate electrode 23.

In addition, the high-electric-field forming layer 34 formed independently of the depletion control layer 33 achieves the effect of enhancing the controllability of the threshold voltage of the memory element.

As described in the first embodiment, for the portion of the semiconductor substrate 11 enclosed with the depletion control layer 33, the first surface region 13, and the step side region 15 to function as the channel and for the channel electrons to retain a path of carriers flowing expansively toward the step side region 15, the high-electric-field forming layer 34 preferably has an impurity concentration sufficient to be depleted during a write operation.

In the present embodiment also, the angle formed between the step side region 15 and the second surface region 14 may be obtuse.

A description will be given herein below to a method for fabricating the nonvolatile semiconductor memory device thus constituted with reference to the drawings.

FIGS. 16A to 18 show the cross-sectional structures of the nonvolatile semiconductor memory device according to the fourth embodiment in the individual process steps of the fabrication method therefor.

Figure 16A:
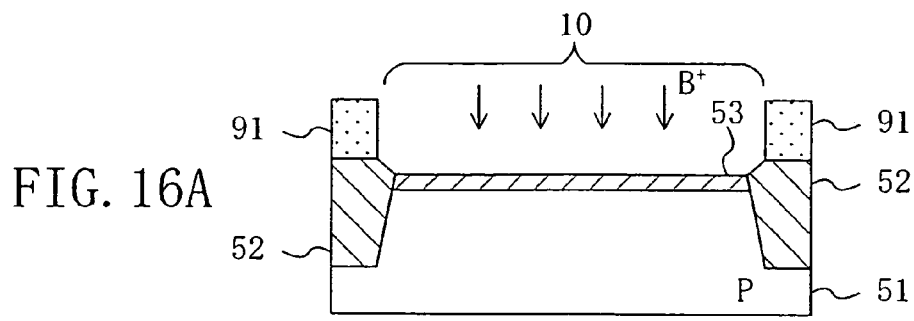
FIGS. 16A to 16D are cross-sectional views illustrating the individual process steps of the method for fabricating the stacked-gate nonvolatile semiconductor memory device according to the fourth embodiment.

First, as shown in FIG. 16A, the isolation layer 52 having, e.g., a trench isolation structure, is formed in the semiconductor substrate 51 composed of p-type silicon. Then, the protective oxide film 53 with a thickness of about 20 nm is formed by thermal oxidation or CVD on the active region 10 surrounded by the isolation layer 52. Thereafter, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 through the protective insulating film 53 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of about $0.5 \times 10^{13}$ cm$^{-2}$ to $1 \times 10^{13}$ cm$^{-2}$ are further implanted into the entire surface of the active region 10 with an implant energy of about 30 kev through the protective oxide film 53.

Figure 16B:
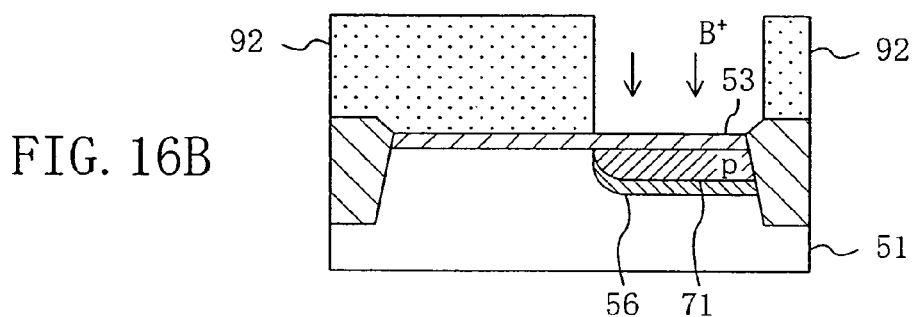

Next, as shown in FIG. 16B, the first resist pattern 91 is removed and then the second resist pattern 92 having an opening over the drain formation region of the active region 10 is formed on the semiconductor substrate 51. By using the formed second resist pattern 92 as a mask, boron (B) ions are implanted in two steps with different acceleration voltages. In the first step, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 30 keV, whereby the first heavily doped p-type impurity layer 56 is formed in the drain formation region. In the second step, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 15 keV, whereby the second heavily doped p-type impurity layer 56 having a junction depth shallower than that of the first heavily doped impurity layer 56 is formed in the drain formation region.

Figure 16C:
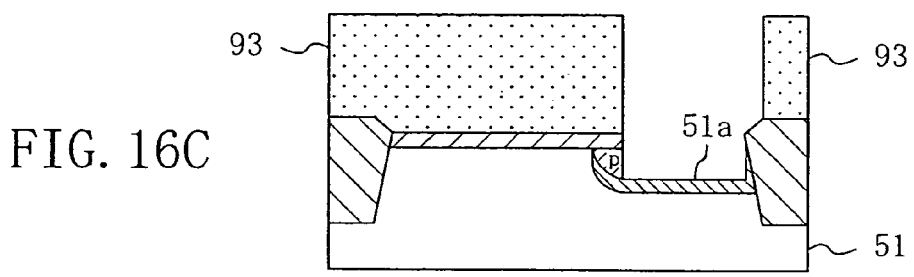

Then, as shown in FIG. 16C, the second resist pattern 92 is removed and the resist pattern 93 for masking the source formation region and the end portion of the heavily doped impurity layer 56 closer to the source formation region is formed on the semiconductor substrate 51. By using the formed third resist pattern 93 as a mask, dry etching is performed with respect to the semiconductor substrate 51, thereby forming the recessed portion 51a in the drain formation region of the semiconductor substrate 51. At this time, the dimension of the depletion control layer 56a in the direction of the gate length, which will be formed from the heavily doped impurity layer 56 in the subsequent step, can be optimized by adjusting the amount of masking the end portion of the first heavily doped impurity layer 56 closer to the source formation region.

Figure 16D:
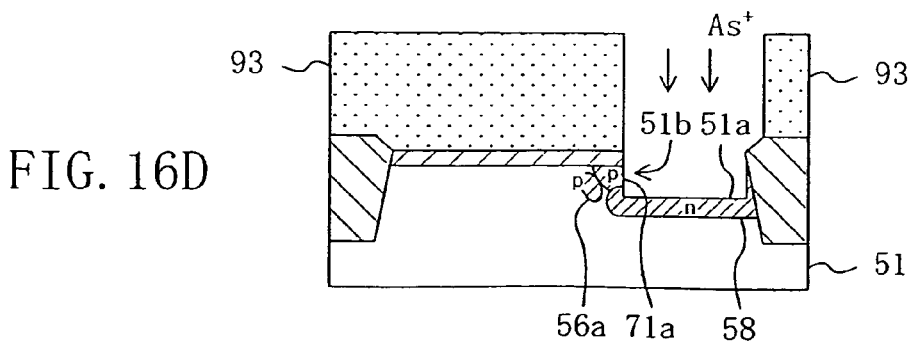

Next, as shown in FIG. 16D, arsenic (As) ions at an implant dose of, e.g., about $0.5 \times 10^{14}$ cm$^{-2}$ to $5 \times 10^{14}$ cm$^{-2}$ are implanted into the semiconductor substrate 51 with an implant energy of about 10 keV by using the third resist pattern 93 as a mask, whereby the lightly doped n-type drain region 38 is formed in the drain formation region.

At this time, the concentration of the p-type impurity in the portion of the first heavily doped p-type impurity layer 56 underlying the sidewall 57 is lowered by the compensating effect exerted by the n-type impurity implanted during the formation of the lightly doped drain region 58. What results is the depletion control layer 56a composed of the first heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region.

At the same time, the high-electric-field forming layer 71a which is lower in concentration than the first heavily doped impurity layer 56 due to the compensating effect during the formation of the lightly doped drain region 58 can be formed from the second heavily doped p-type impurity layer 71 to be located between the upper corner of the stepped portion 51b and the depletion control layer 56a.

Figure 17A:
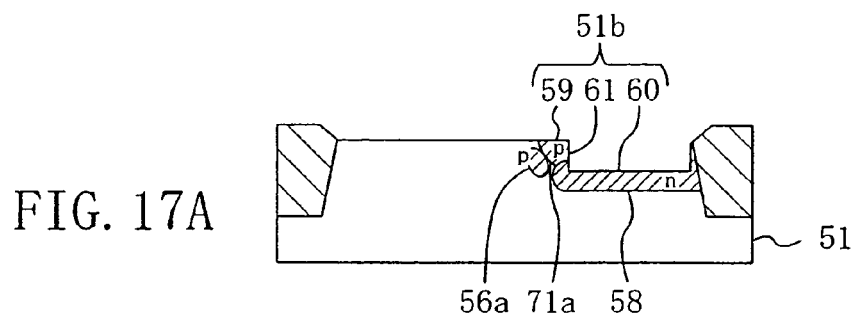
FIGS. 17A to 17D are cross-sectional views illustrating the individual process steps of the method for fabricating the stacked-gate nonvolatile semiconductor memory device according to the fourth embodiment.

Next, as shown in FIG. 17A, the third resist pattern 93 and the protective oxide film 53 are removed, whereby the stepped portion 51b composed of the upper surface of the semiconductor substrate 51, i.e., the first surface region 59 serving as the upper stage, the second surface region 60 serving as the lower stage, and the step side region 61 connecting the upper and lower stages is exposed.

Figure 17B:
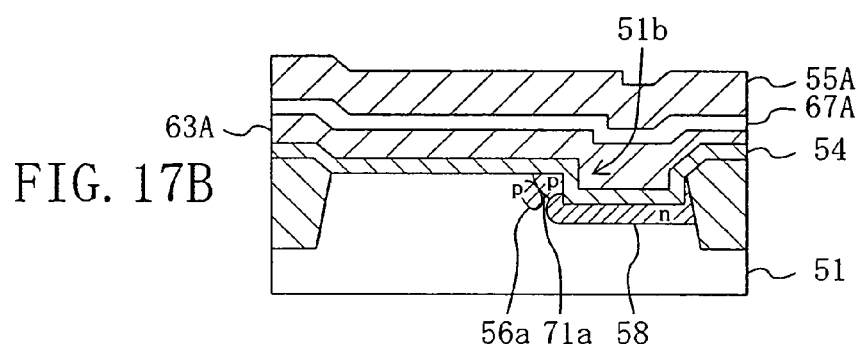

Next, as shown in FIG. 17B, the gate oxide film 54 serving as the first insulating film is formed on the exposed surface of the semiconductor substrate 51 including the stepped portion 51b. Then, the first polysilicon film 63A, the silicon dioxide film 67A as the second insulating film, and the second polysilicon film 55A are deposited by, e.g., CVD over the entire surface of the gate oxide film 54. The silicon dioxide film 67A may also be formed as a thermal oxide film.

Figure 17C:
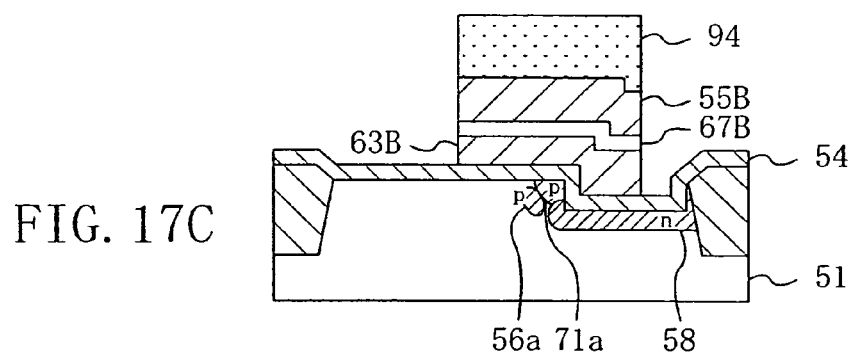

Next, as shown in FIG. 17C, a fourth resist pattern 94 including the pattern for the gate electrode which covers up the stepped portion 51b is formed on the second polysilicon film 55A. By using the formed fourth resist pattern 94 as a mask, anisotropic etching is performed with respect to the second polysilicon film 55A, the silicon dioxide film 67A, and the first polysilicon film 63A, thereby forming the floating gate electrode 63B composed of the first polysilicon film 63A, the capacitance insulating film 67B composed of the silicon dioxide film 67A, and the floating gate electrode 55B composed of the second polysilicon film 55A. The gate oxide film 54 between the semiconductor substrate 51 and the floating gate electrode 63B functions as the tunnel film.

Figure 17D:
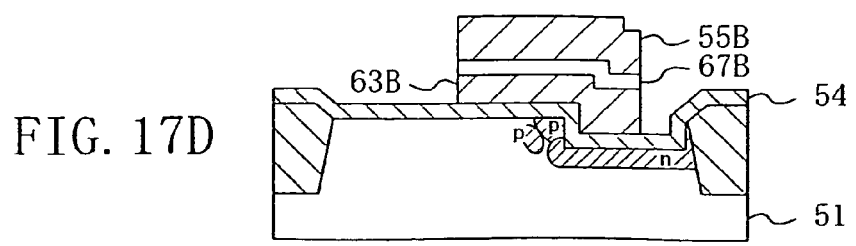
Figure 18:
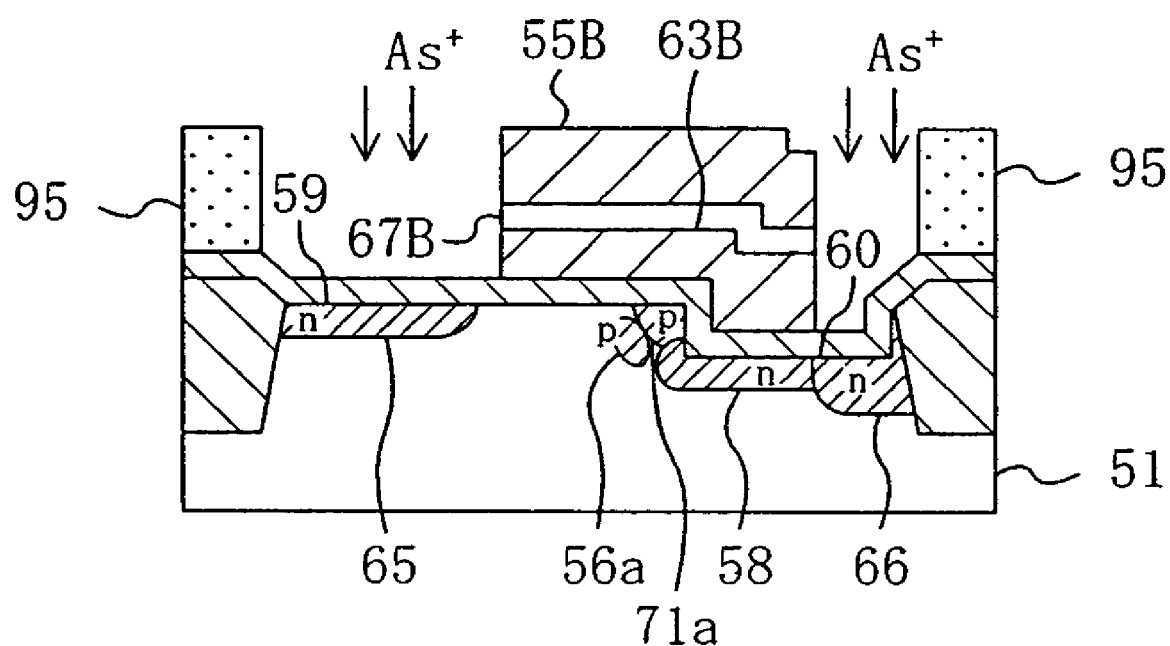
FIG. 18 is a cross-sectional view illustrating the process step of the method for fabricating the stacked-gate nonvolatile semiconductor memory device according to the fourth embodiment.

Next, as shown in FIG. 17D, the fourth resist pattern 94 is removed. Then, as shown in FIG. 18, the fifth resist pattern 95 having an opening over the source formation region and the drain formation region is formed. By using the formed fifth resist pattern 95 and the control gate electrode 55B as a mask, arsenic (As) ions are implanted into the semiconductor substrate 51 so that the heavily doped source region 65 is formed in the first surface region 59 of the semiconductor substrate 51 and the heavily doped drain region 66 is formed in the area of the second surface region 60 of the semiconductor substrate 51 connecting to the lightly doped drain region 58, whereby the memory element in the stacked-gate nonvolatile semiconductor memory device is completed.

Thus, in accordance with the method for fabricating the nonvolatile semiconductor memory device of the fourth-embodiment, the first heavily doped p-type impurity layer 56 and the second heavily doped impurity layer 71 having a junction shallower than that of the first heavily doped impurity layer 56 are formed in the drain formation region of the semiconductor substrate 51. Then, the recessed portion 51a is formed in the semiconductor substrate 51 by masking the respective end portions of the first and second heavily doped impurity layer 56 and 71 closer to the source region, whereby the stepped portion 51b using the portion of the semiconductor substrate 51 underlying the sidewall 57 as the first surface region (upper stage) and using the bottom surface of the recessed portion 51a as the second surface region 60 (lower stage) is formed. In subsequently forming the lightly doped drain region 58 by implantation in the second surface region 60, the depletion control layer 56a having a desired impurity profile and located discretely in spaced apart and opposing relation to the upper corner of the stepped portion 51b to adjoin the lightly doped drain region 58 can be formed reliably by the compensating effect exerted on the first heavily doped impurity layer 56. In addition, the high-electric-field forming layer 71a composed of the second heavily doped impurity layer 71 and having a desired impurity profile can be formed between the upper corner of the stepped portion 51b and the depletion control layer 56a.

Although the fourth embodiment has formed the first and second heavily doped impurity layers 56 and 71 by performing the two consecutive-steps of ion implantation using the same second resist pattern 91 and thereby formed different impurity profiles desired in the respective heavily doped impurity layers, it will easily be appreciated that the desired impurity profiles can also be achieved in the first and second heavily doped impurity layers 56 and 71 even if the first and second steps of ion implantation are performed by using different mask patterns.

Embodiment 5

A fifth embodiment of the present invention will be described with reference to the drawings.

Each of the first to fourth embodiments described above has provided the depletion control layer 33 located discretely in spaced apart and opposing relation to the stepped portion 16 in the semiconductor substrate 11 such that a carrier path in the channel region formed under the floating gate electrode 23 during, e.g., a write operation is formed along the step side region 15 and carriers flow through the high electron temperature region generated under the stepped portion 16, thereby improving the efficiency with which carriers are injected into the floating gate electrode 23.

By contrast, the fifth embodiment applies, to the semiconductor substrate, a substrate voltage of a polarity opposite to that of the drain voltage during a write operation instead of providing the depletion control layer 33 of the conductivity type opposite to that of the drain region such that the carrier path in the channel region is formed along the step side region 15.

The present embodiment will be described herein below by using split-gate and stacked-gate nonvolatile semiconductor memory devices shown in FIGS. 19A and 19B, respectively.

Figure 19A:
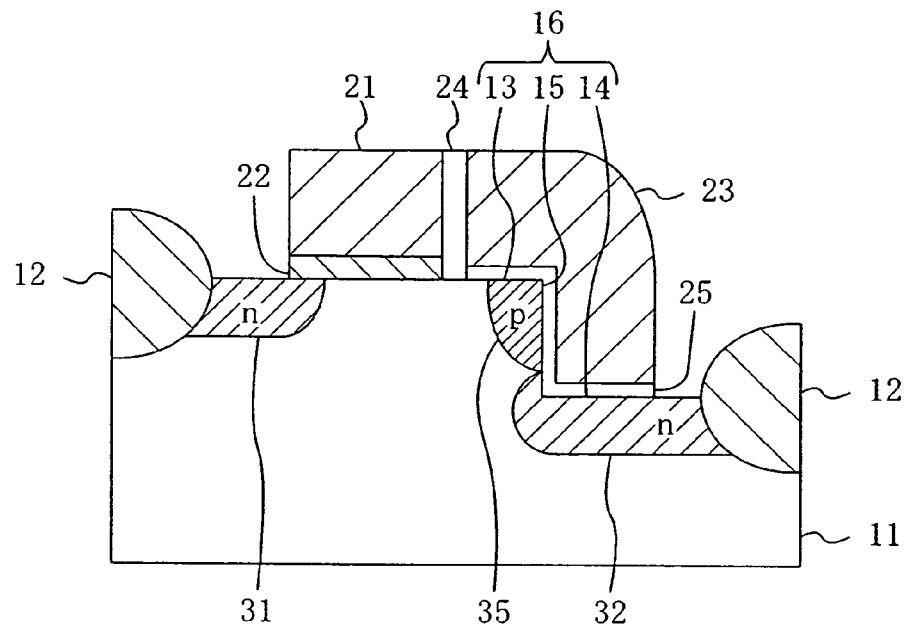
FIG. 19A is a structural cross-sectional view of a memory element in a split-gate nonvolatile semiconductor memory device according to a fifth embodiment of the present invention.
Figure 19B:
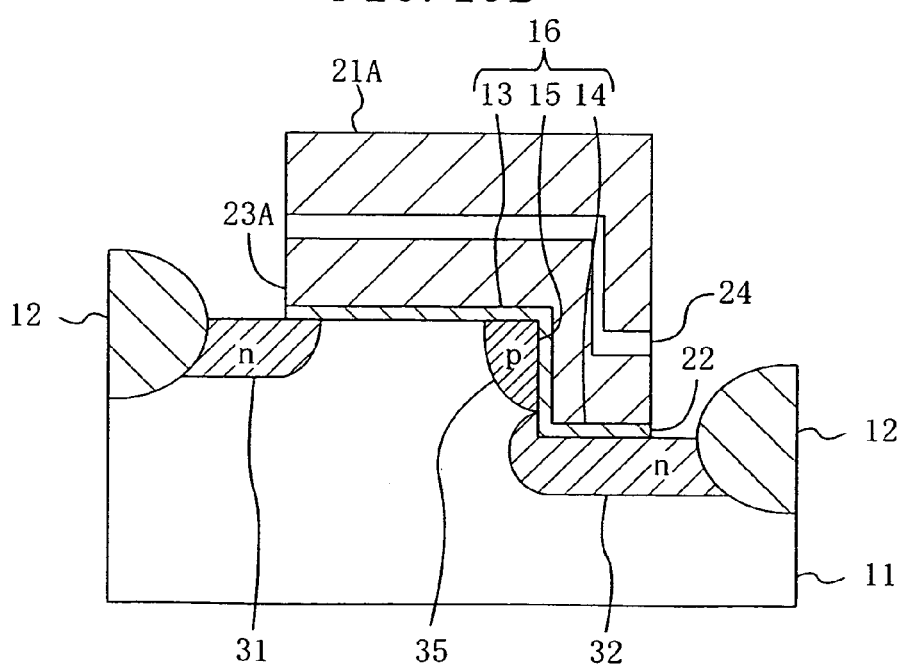
FIG. 19B is a structural cross-sectional view of a memory element in a stacked-gate nonvolatile semiconductor memory device according to the fifth embodiment.

FIGS. 19A and 19B show respective cross-sectional structures of memory elements in the nonvolatile semiconductor memory devices according to the present embodiment, of which FIG. 19A shows the split-gate type and FIG. 19B shows the stacked-gate type. In FIG. 19A, the description of the same components as shown in FIG. 1 will be omitted by retaining the same reference numerals. In FIG. 19B, the description of the same components as shown in FIG. 11 will be omitted by retaining the same reference numerals.

First, as shown in FIG. 19A, the nonvolatile semiconductor memory device according to the fifth embodiment features the heavily doped impurity region 35 which is higher in the concentration of a p-type impurity than the semiconductor substrate 11 and formed in the upper corner of the stepped portion 16 as well as a negative voltage applied to the substrate during a write operation.

The heavily doped impurity region 35 has the effect of increasing the electron temperature in the step side region 15 and controlling the threshold voltage of the memory element.

In such a heavily doped impurity region 35, depletion is less likely to occur so that the channel is less likely to be formed and electrons are more likely to flow in the vicinity of the interface between the heavily doped impurity region 35 and the semiconductor substrate 11. Since the electrons flow along a path at a distance from the upper and lower corners of the stepped portion, they flow directly into the drain electrode 32 without passing through the high electron temperature region generated in the vicinity of the lower corner of the stepped portion and do not contribute to the injection of carriers into the floating gate electrode 23.

In the present embodiment, therefore, a negative voltage, e.g., a voltage on the order of −1.0 V to −5.0 V is applied to the semiconductor substrate 11 during a write operation such that the electrons flow expansively toward the step side region 15 to form a path of carriers flowing toward the high electron temperature region generated in the vicinity of the lower corner of the stepped portion 16.

This is because the application of a negative voltage to the semiconductor substrate 11 formed with the stepped portion 16 provides the region in the vicinity of the upper corner of the stepped portion 16 with the same effect as achieved when a potential at the floating gate electrode 23 is relatively increased so that the electrons are attracted to the surface of the semiconductor substrate 11. As a result, the carrier path can be formed in the region enclosed with the upper corner of the stepped portion 16 as shown in FIG. 3A without providing the depletion control layer 33.

Since the nonvolatile semiconductor memory device according to the present embodiment is increased in current density only during the application of the substrate potential, power consumption when a write operation is not performed can be reduced significantly.

As shown in FIG. 19B, the stacked-gate nonvolatile semiconductor memory device can also achieve effects equal to those achieved by the split-gate nonvolatile semiconductor memory device shown in FIG. 19A if the heavily doped impurity region 35 which is higher in the concentration of a p-type impurity than the semiconductor substrate 11 is formed in the upper corner of the stepped portion 16 and a negative voltage is applied to the substrate during a write operation.

In a nonvolatile semiconductor memory device provided with the depletion control layer 33 as shown in each of the first to fourth embodiments also, the efficiency of carrier injection can further be improved by applying the substrate voltage during a write operation.

Even in a nonvolatile semiconductor memory device in which the heavily doped impurity region 35 is not provided in the upper corner of the stepped portion 16 also, the efficiency of carrier injection can also be improved by applying a negative substrate voltage during a write operation.

Although each of the memory elements according to the first to fifth embodiments has been described as an n-channel element, the same effects are achievable with a p-channel element in which each of the source and drain regions has the p-type conductivity. In this case, the depletion control layer has the n-type conductivity opposite to the conductivity type of the drain region and the substrate voltage applied during a write operation has the positive polarity.

Although the present embodiment has described the effects achieved by the application of the substrate voltage during a write operation, the same effects are achievable by properly changing the drain voltage or the control gate voltage.

Embodiment 6

A sixth embodiment of the present invention will be described with reference to the drawings.

Figure 20:
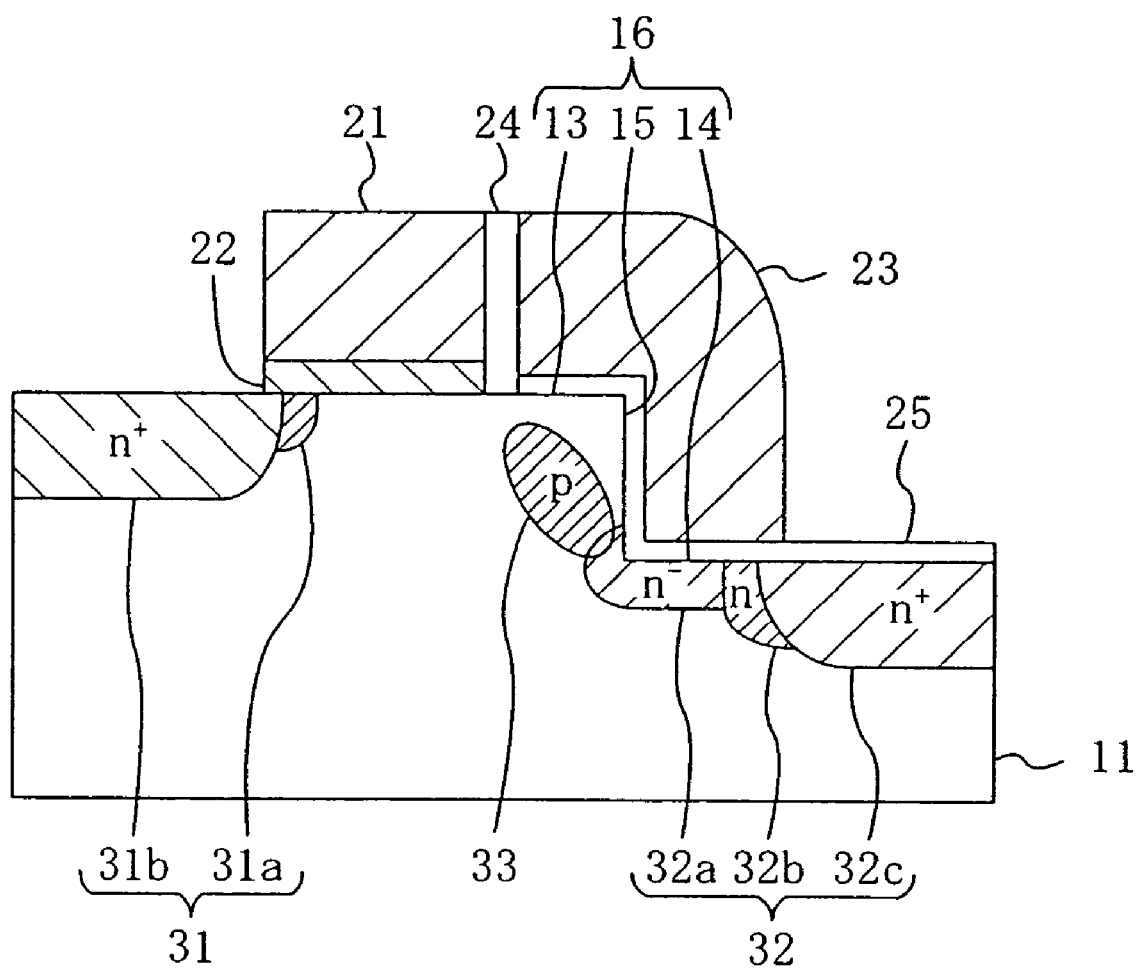
FIG. 20 is a structural cross-sectional view of a memory element in a split-gate nonvolatile semiconductor memory device according to a sixth embodiment of the present invention.

FIG. 20 shows a cross-sectional structure of a memory element in a split-gate nonvolatile semiconductor memory device according to the sixth embodiment. In FIG. 20, the description of the same components as used in the first embodiment and shown in FIG. 1 will be omitted by retaining the same reference numerals.

As shown in FIG. 20, the nonvolatile semiconductor memory device according to the sixth embodiment features the source region 31 which is composed of a middle-concentration layer 31a formed at the end portion closer to the channel region and a high-concentration layer 31b formed externally of and having a higher impurity concentration than the middle-concentration layer 31a as well as a drain region 32 which is composed of a low-concentration layer 32a, the middle-concentration layer 32b, and the high-concentration layer 32c such that their impurity concentrations are progressively outwardly higher with distance from the channel region. The end portion of the low-concentration layer 32a closer to the channel region is formed to adjoin the depletion control layer 33.

A description will be given herein below to exemplary data write, erase, and read operations performed with respect to the device of the present embodiment with reference to FIGS. 21A and 21B.

Figure 21A:
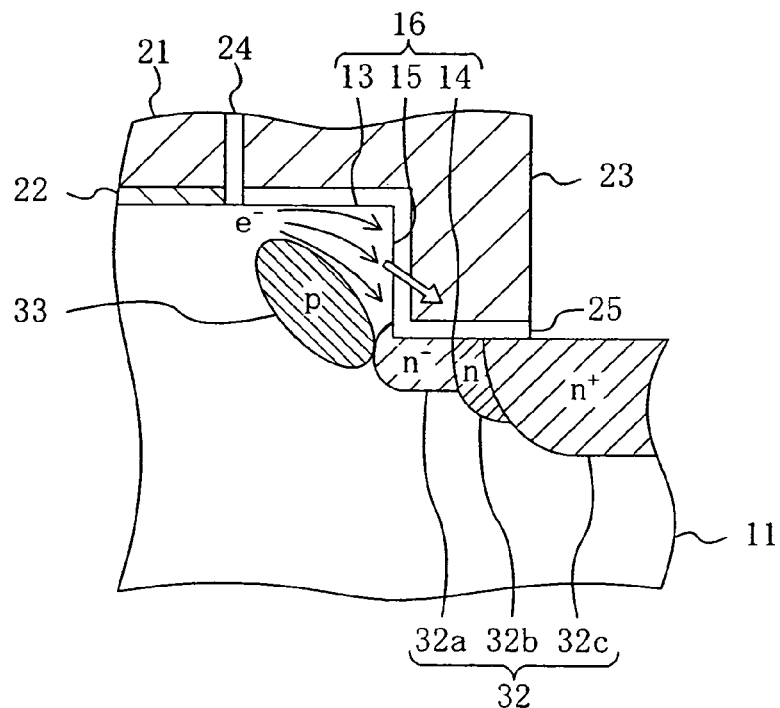

First, during the data write operation shown in FIG. 21A, a voltage of about 4.0 V to 7.0 V is applied to the control gate electrode 21, a voltage of 0 V is applied to the source region (not shown), and a voltage of 4.0 to 6.0 V is applied to the drain region 32. As a result, hot electrons are generated in the vicinity of the corner of the step side region 15 and injected into the floating gate electrode 23 through the step side region 15.

Figure 21B:
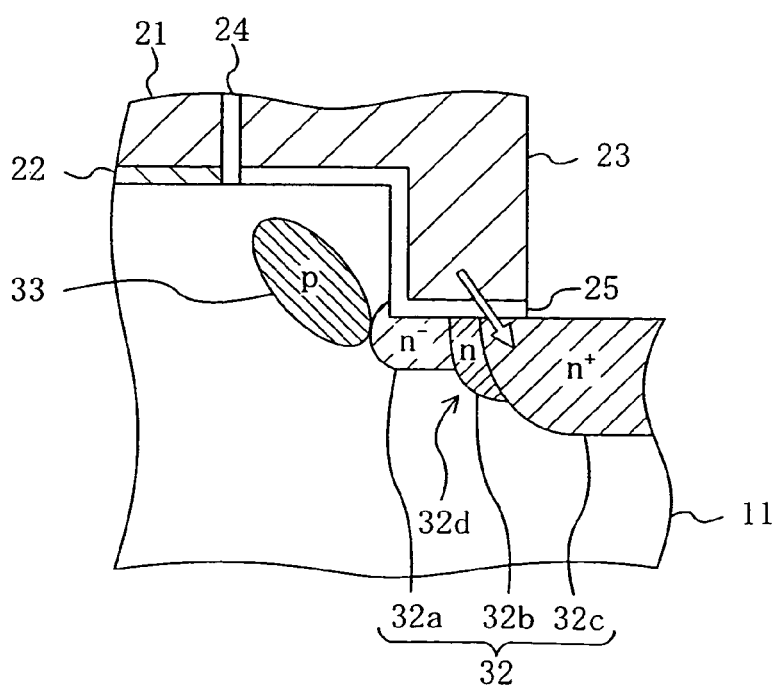

Next, during the data erase operation shown in FIG. 21B, a voltage of −5.0 V is applied to the control gate electrode 21, a voltage of about 4.0 V to 7.0 V is applied to the drain region 32, and a voltage of 0 V is applied to the source region (not shown), whereby the electrons accumulated in the floating gate electrode 23 are extracted in the direction indicated by the arrow toward the drain region 32 through the third insulating film 25 serving as the tunnel oxide film due to a FN tunneling phenomenon.

During the data read operation, a voltage of about 1.0 V to 3.0 V is applied to the source region, a voltage of 0 V is applied to the drain region 32, and a voltage of about 2.0 V to 4.0 V is applied to the control gate electrode 21 or, alternatively, a voltage of 1.0 V to 3.0 V is applied to the drain region 32, a voltage of 0 V is applied to the source region, and a voltage of about 2.0 V to 4.0 V is applied to the control gate electrode 21, whereby a read current different in value depending on an amount of charge accumulated in the floating gate electrode 23 is read to the source region or the drain region.

Thus, the nonvolatile semiconductor memory device according to the sixth embodiment has the stepped portion 16 in which the source region 32 is formed in the first surface region 13 serving as the upper stage and the drain region 32 is formed in the second surface region 1 serving as the lower stage. In addition, the p-type depletion control layer 33 is formed within the semiconductor substrate 11 to be located at a position adjacent the stepped portion 16 and not reaching each of the first surface region 14 and the step side region 15. Since the depletion control layer 33 has the end portion closer to the drain region 32 in contact with the low-concentration layer 32a of the drain region 32, a current path flowing toward the high electron temperature region generated in the vicinity of the lower corner of the step side region 15 is generated during a write operation. Consequently, electrons which have become hot electrons in the vicinity of the step side region 15 pass through the step side region 15 to be injected into the floating gate electrode 23. This achieves a high efficiency with which the channel electrons are injected into the floating gate electrode 23.

In the sixth embodiment, the drain region 32 is composed of the low-concentration layer 32a, the middle-concentration layer 32b, and the high-concentration layer 32c having impurity concentrations which are progressively higher with distance from the channel region. In other words, the drain region 32 has the concentration of an n-type impurity which is progressively lower with approach toward the channel region. Since the middle-concentration layer 32b lower in impurity concentration than the high-concentration layer 32c is provided in the region 32d underlying the floating gate electrode 23, the intensity of an electric field in the vicinity of the region 32d is reduced during an erase operation so that hot holes generated at the pn junction interface of the region 32d are reduced. This prevents the lowering of the reliability of the third insulating film 25 as the tunnel film.

Although the sixth embodiment has formed the source region 31 composed of the middle-concentration layer 31a and the high-concentration layer 31b as shown in FIG. 20, the source region 31 may be formed to have a uniform concentration.

It will easily be appreciated that equal effects are also achievable with a split-gate flash memory unformed with the stepped portion 16.

A description will be given herein below to a method for fabricating the nonvolatile semiconductor memory device thus constituted with reference to the drawings.

FIGS. 22A to 24D show the cross-sectional structures of the nonvolatile semiconductor memory device according to the sixth embodiment in the individual process steps of the fabrication method therefor.

Figure 22A:
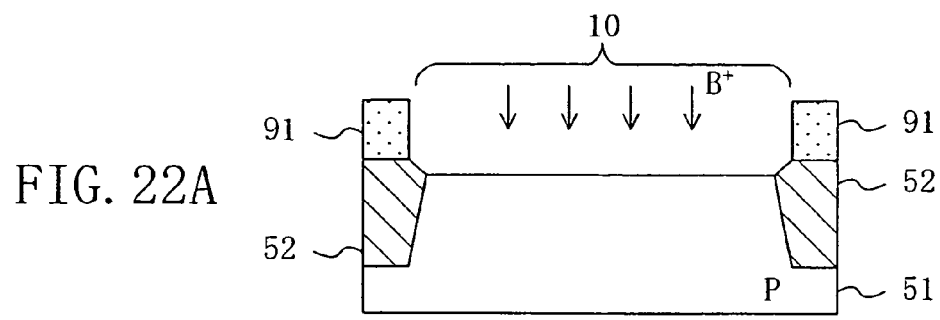
FIGS. 22A to 22D are cross-sectional views illustrating the individual process steps of the method for fabricating the split-gate nonvolatile semiconductor memory device according to the sixth embodiment.

First, as shown in FIG. 22A, the isolation layer 52 having, e.g., a trench isolation structure is formed in the semiconductor substrate 51 composed of p-type silicon. Then, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of about $0.5 \times 10^{13}$ cm$^{-2}$ to $1 \times 10^{13}$ cm$^{-2}$ are further implanted into the entire surface of the active region 10 with an implant energy of about 30 keV.

Figure 22B:
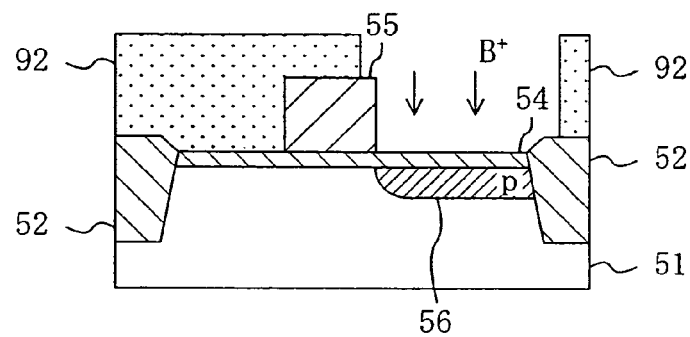

Next, as shown in FIG. 22B, the first resist pattern 91 is removed and then the gate oxide film 54 as the first insulating film is formed on the active region 10 by CVD or thermal oxidation. Thereafter, the first polysilicon film is deposited by, e.g., CVD over the entire surface of the semiconductor substrate 51. The deposited first polysilicon film is patterned by photolithography to form the control gate electrode 55 composed of polysilicon. Subsequently, the second resist pattern 92 having an opening over the drain formation region of the active region 10 is formed on the semiconductor substrate 51. By using the formed second resist pattern 92 and the control gate electrode 55 as a mask, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 15 keV, whereby the heavily doped p-type impurity layer 56 is formed in the drain formation region.

Figure 22C:
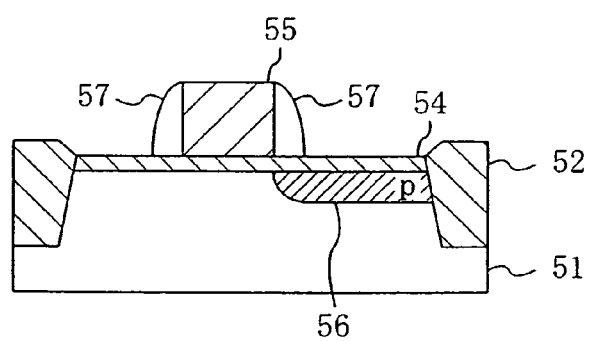

Then, as shown in FIG. 22C, the second resist pattern 92 is removed. Thereafter, the BPSG film is deposited by CVD over the entire surface of the semiconductor substrate 51. Subsequently, anisotropic etching is performed with respect to the deposited BPSG film to form the sidewalls 57 composed of the BPSG film on the side surfaces of the control gate electrode 55. By adjusting the thickness of the deposited BPSG film, the distance between the side surface of the control gate electrode 55 and the stepped portion, which will be formed in the semiconductor substrate 51 in the subsequent step, can be determined by self alignment.

Figure 22D:
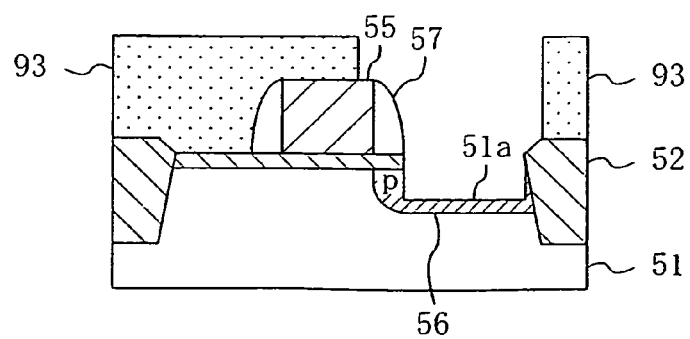

Next, as shown in FIG. 22D, the third resist pattern 93 having an opening over the drain formation region is formed on the semiconductor substrate 51. By using the formed third resist pattern 93, the gate electrode 55, and the sidewalls 57 as a mask, dry etching is performed with respect to the semiconductor substrate 51, thereby forming the recessed portion 51a in the drain formation region of the semiconductor substrate 51.

Figure 23A:
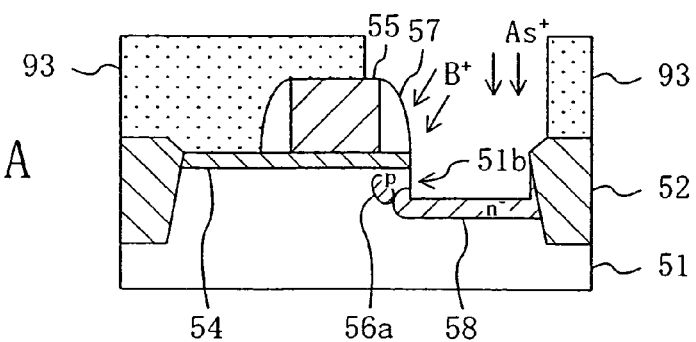
FIGS. 23A to 23D are cross-sectional views illustrating the individual process steps of the method for fabricating the split-gate nonvolatile semiconductor memory device according to the sixth embodiment.

Next, as shown in FIG. 23A, boron (B) ions as a p-type impurity and arsenic (As) ions as an n-type impurity are implanted sequentially by using the third resist pattern 93, the gate electrode 55, and the sidewalls 57 as a mask. As a result, the boron ions and the arsenic ions compensate for, i.e., offset each other in the vicinity of the stepped portion in the semiconductor substrate 51 to form the depletion control layer 56a composed of the heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region. At this time, the boron ions are implanted at a dose of, e.g., about $0.5 \times 10^{14}$ cm$^{-2}$ to $5 \times 10^{14}$ cm$^{-2}$, with an implant energy of about 25 keV, and at an angle of about 30° with respect to a normal to the substrate surface. On the other hand, the arsenic ions are implanted at a dose of, e.g., about $0.5 \times 10^{14}$ cm$^{-2}$ to $5 \times 10^{14}$ cm$^{-2}$ with an implant energy of about 10 keV, and at an angle of about 0° with respect to a normal to the substrate surface.

Figure 23B:
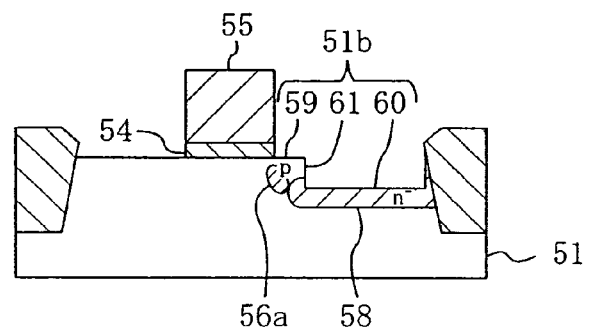

Next, as shown in FIG. 23B, the third resist pattern 93 is removed and then the sidewalls 57 and the exposed portion of the gate oxide film 54 are removed by wet etching, whereby the stepped portion 51b composed of the first surface region 59 serving as the upper stage, the second surface region 60 serving as the lower stage, and the step side region 61 connecting the upper and lower stages and the side surface of the control gate electrode 55 are exposed.

Figure 23C:
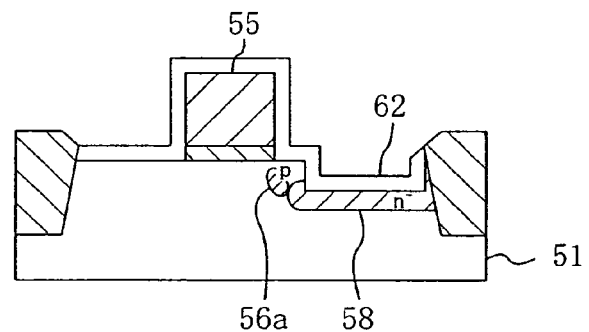

Next, as shown in FIG. 23C, the thermal oxide film 62 serving as the second and third insulating films is formed on the exposed surface of the semiconductor substrate 51 including the stepped portion 51b and on the surface of the control gate electrode 55. The thermal oxide film 62 may also be a silicon dioxide film formed by CVD or the like.

Figure 23D:
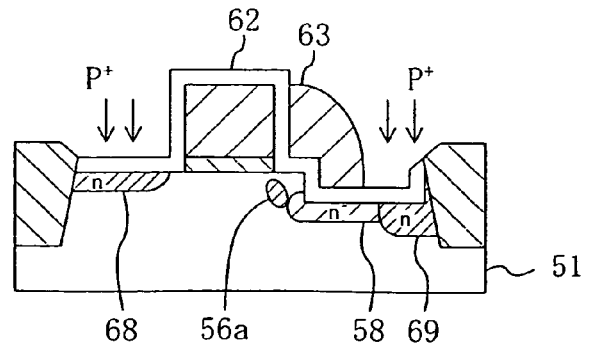

Next, as shown in FIG. 23D, the second polysilicon film is deposited by, e.g., CVD over the entire surface of the semiconductor substrate 51 including the control gate electrode 55. By performing anisotropic etching with respect to the deposited second polysilicon film, the floating gate electrode 63 composed of polysilicon, capacitively coupled to the side surface of the control gate electrode 55 closer to the stepped portion 51b with the thermal oxide film 62 interposed therebetween, and opposed to the second surface region 60 with the thermal oxide film 62 interposed therebetween is formed by self alignment so as to cover up the stepped portion 51b. The region of the thermal oxide film 62 sandwiched between the floating gate electrode 63 and the semiconductor substrate 51 functions as the tunnel film.

Subsequently, phosphorus (P) ions are implanted into the semiconductor substrate 51 by using the control gate electrode 55 and the floating gate electrode 63 as a mask, whereby a moderately doped source region 68 is formed in the region of the semiconductor substrate 51 opposite to the floating gate electrode 63 relative to the control gate electrode 55 and a middle-concentration drain region 69 is formed in the region of the semiconductor substrate 51 closer to the floating gate electrode 63. At this time, the phosphorus ions are implanted at a dose of, e.g., about $5 \times 10^{12}$ cm$^{-2}$ to $5 \times 10^{13}$ cm$^{-2}$ and with an implant energy of about 20 keV.

Figure 24A:
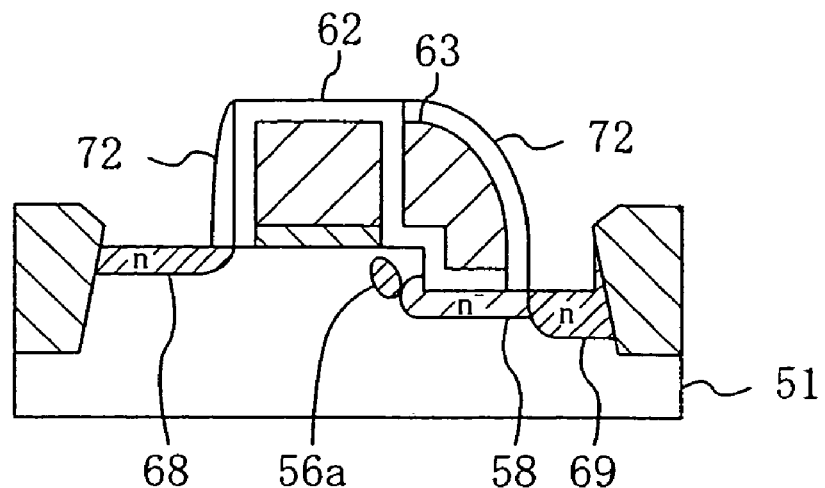
FIGS. 24A and 24B are cross-sectional views illustrating the individual process steps of the method for fabricating the split-gate nonvolatile semiconductor memory device according to the sixth embodiment.

Next, as shown in FIG. 24A, the insulating film 64 composed of a silicon dioxide or the like is formed over the entire surface of the semiconductor substrate 51. The formed insulating film is then etched to form insulating film sidewalls 72 on the respective side surfaces of the control gate electrode 55 and the floating gate electrode 63.

Figure 24B:
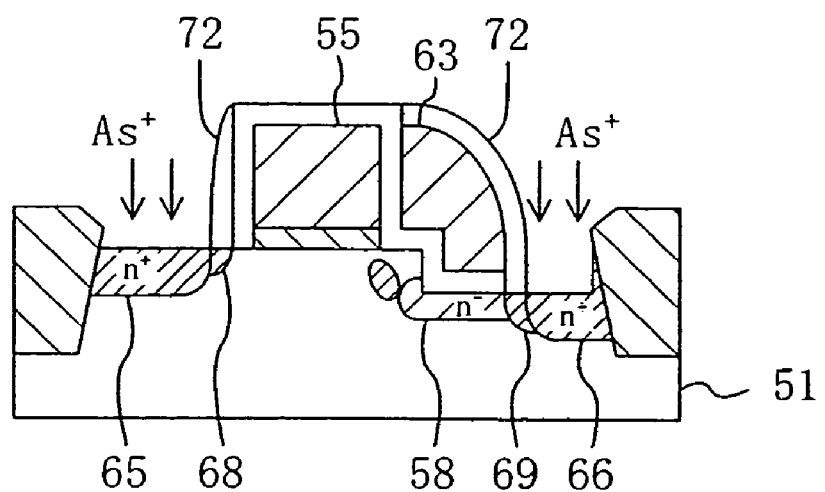

Next, as shown in FIG. 24B, arsenic (As) ions are implanted into the semiconductor substrate 51 by using the control gate electrode 55, the floating gate electrode 63, and the insulating film sidewalls 72 as a mask so that the heavily doped source region 65 is formed in the region of the semiconductor substrate 51 opposite to the floating gate electrode 63 relative to the control gate electrode 55 and the heavily doped drain region 66 is formed in the region of the semiconductor substrate 51 closer to the floating gate electrode 63 than to the control gate electrode 55 and connecting to the moderately doped drain region 69, whereby the memory element in the nonvolatile semiconductor memory device is completed. The arsenic ions are implanted here at an implant dose of, e.g., about $1 \times 10^{15}$ cm$^{-2}$ to $5 \times 10^{15}$ cm$^{-2}$ and with an implant energy of about 40 keV.

Thus, the fabrication method according to the sixth embodiment allows the formation of the p-type depletion control layer 56a in the vicinity of the stepped portion 51b of the p-type semiconductor substrate 51 and ensures the formation of the drain region composed of the lightly doped drain region 58, the moderately doped drain region 69, and the heavily doped drain region 66 in which the concentrations of the n-type impurities are progressively higher with distance from the channel region.

Variation of Embodiment 6

A variation of the sixth embodiment will be described with reference to the drawings.

Figure 25:
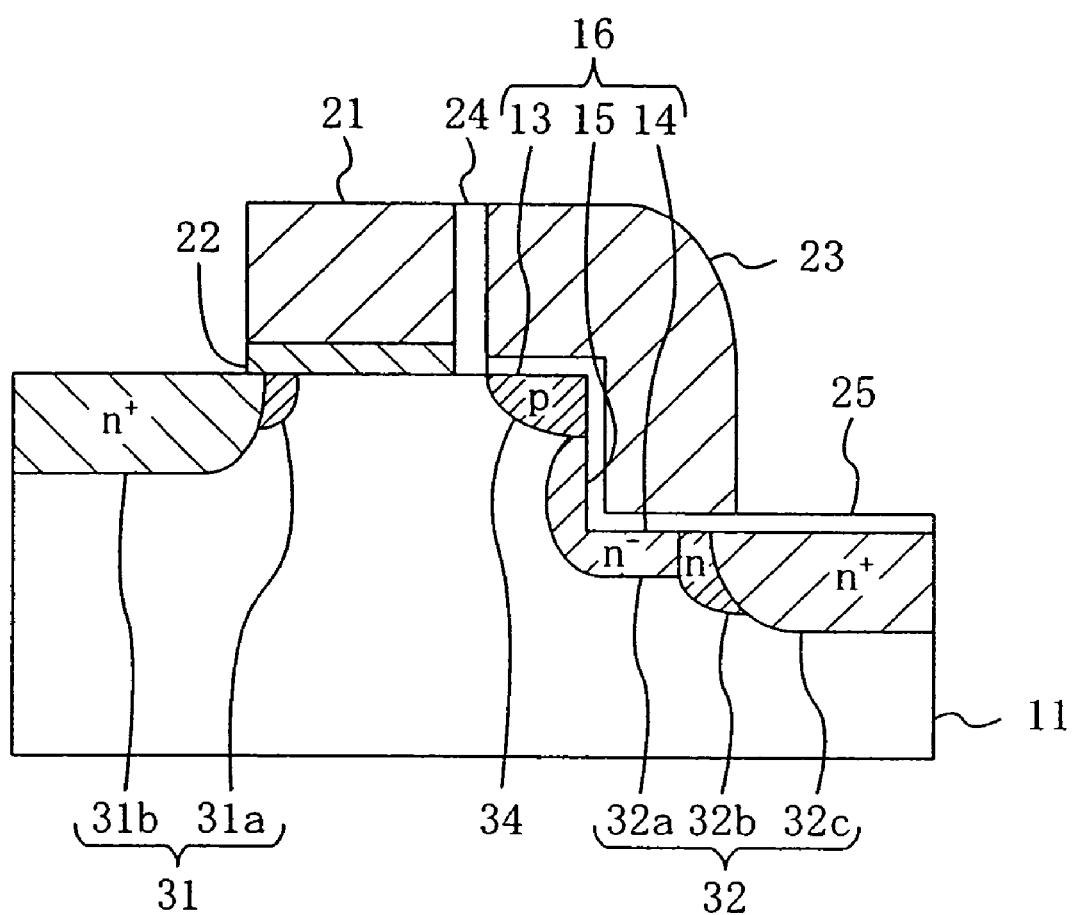
FIG. 25 is a structural cross-sectional view of a memory element in a split-gate nonvolatile semiconductor memory device according to a variation of the sixth embodiment.

FIG. 25 shows a cross-sectional structure of a memory element in a split-gate nonvolatile semiconductor memory device according to the variation of the sixth embodiment. In FIG. 25, the description of the same components as used in the sixth embodiment and shown in FIG. 20 will be omitted by retaining the same reference numerals.

As shown in FIG. 25, the nonvolatile semiconductor memory device according to the variation of the sixth embodiment features the high-electric-field forming layer 34 formed in the upper corner of the stepped portion 16 in place of the depletion control layer and containing a p-type impurity diffused therein. The concentration of a p-type impurity in the high-electric-field forming layer 34 has been adjusted to be higher than the concentration of the p-type impurity in the semiconductor substrate 11. The end portion of the high-electric-field forming layer 34 closer to the drain region 32 is in contact with the low-concentration layer 32a.

With the p-type high-electric-field forming layer 34 provided between the upper corner of the stepped portion 16 and the low-concentration layer 32a of the drain region 32, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the low-concentration layer 32a, so that an electron temperature in the vicinity of the lower corner of the stepped portion 16 is further increased. This increases the number of electrons in the channel that have become hot electrons and remarkably improves the efficiency with which the electrons are injected into the floating gate electrode 23.

The present variation can be implemented by adjusting an implant acceleration voltage and a dose during the implantation of boron (B) ions shown in FIG. 22B or during the implantation of boron (B) ions and arsenic (As) ions shown in 23A, e.g., by increasing the dose of the boron ions implanted at the angle shown in FIG. 23A. It is also possible to perform only the step of implanting the boron (B) ions and the arsenic (As) ions shown in FIG. 23A without performing the implantation of the boron (B) ions shown in FIG. 22B.

Although the present variation has also formed the source region 31 composed of the middle-concentration layer 31a and the high-concentration layer 31b, the source region 31 may also be formed to have a uniform concentration.

Equal effects are also achievable with a split-gate flash memory unformed with the stepped portion 16.

Embodiment 7

A seventh embodiment of the present invention will be described with reference to the drawings.

Figure 26:
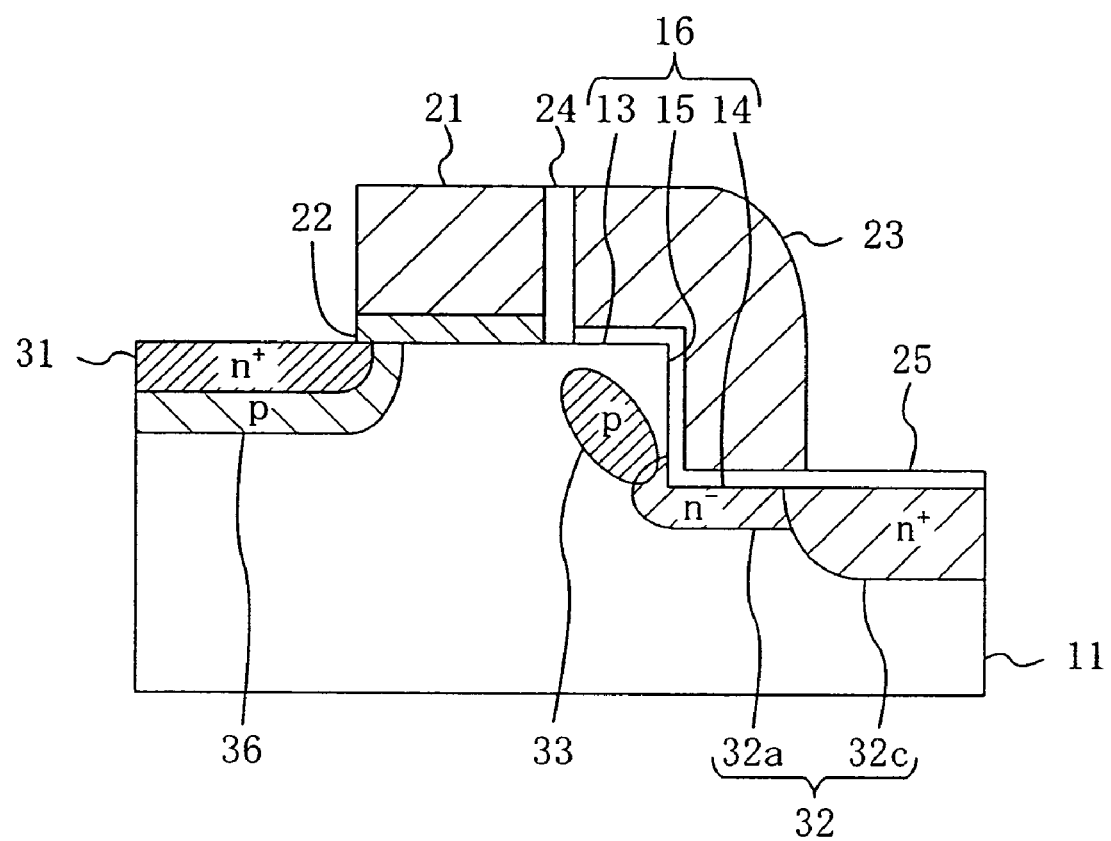
FIG. 26 is a structural cross-sectional view of a memory element in a split-gate nonvolatile semiconductor memory device according to a seventh embodiment of the present invention.

FIG. 26 shows a cross-sectional structure of a memory element in a split-gate nonvolatile semiconductor memory device according to the seventh embodiment. In FIG. 26, the description of the same components as used in the sixth embodiment and shown in FIG. 20 will be omitted by retaining the same reference numerals.

As shown in FIG. 26, the nonvolatile semiconductor memory device according to the seventh embodiment features a short-channel-effect suppressing region 36 which is composed of a p-type impurity region and formed in a portion of the first surface region 13 underlying the outer peripheral portion of the source region 31 so as to cover the junction interface of the source region 31 with the semiconductor substrate 11. Since the p-type short-channel-effect suppressing region 36 is provided between the n-type source region 31 and the channel region, the intensity of an electric field between the source region 31 and the drain region 32 is reduced, which suppresses a short-channel effect and allows device size reduction.

A description will be given herein below to a method for fabricating the nonvolatile semiconductor memory device thus constituted with reference to the drawings.

FIGS. 27A to 29 show the cross-sectional structures of the nonvolatile semiconductor memory device according to the first embodiment in the individual process steps of the fabrication method therefor.

Figure 27A:
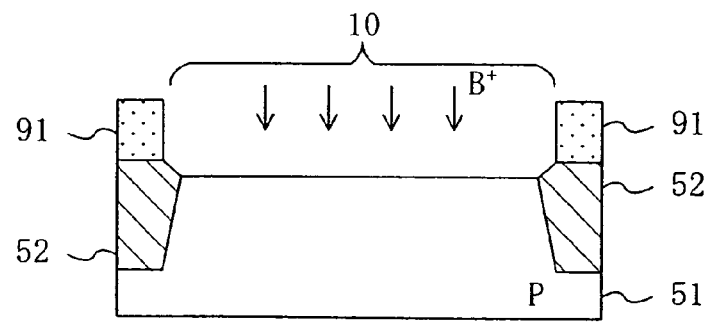
FIGS. 27A to 27D are cross-sectional views illustrating the individual process steps of the method for fabricating the split-gate nonvolatile semiconductor memory device according to the seventh embodiment.

First, as shown in FIG. 27A, the isolation layer 52 having, e.g., a trench isolation structure, is formed in the semiconductor substrate 51 composed of p-type silicon. Then, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of, e.g., $0.5 \times 10^{13}$ cm$^{-2}$ to $1 \times 10^{13}$ cm$^{-2}$ are further implanted into the entire surface of the active region 10 with an implant energy of about 30 keV.

Figure 27B:
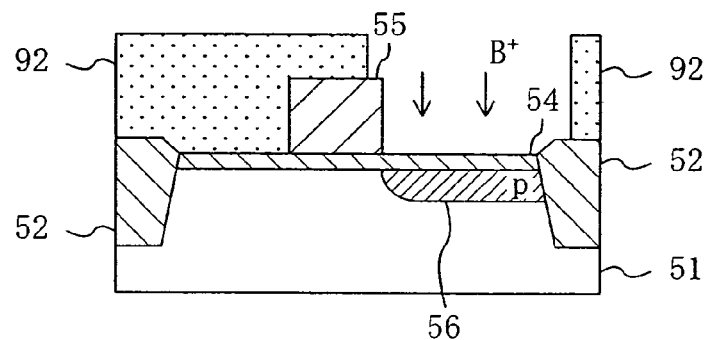

Next, as shown in FIG. 27B, the first resist pattern 91 is removed and then the gate oxide film 54 as the first insulating film is formed on the active region 10 by CVD or thermal oxidation. Thereafter, the first polysilicon film is deposited by, e.g., CVD over the entire surface of the semiconductor substrate 0.51. The deposited first polysilicon film is patterned by photolithography to form the control gate electrode 55 composed of polysilicon. Subsequently, the second resist pattern 92 having an opening over the drain formation region of the active region 10 is formed on the semiconductor substrate 51. By using the formed second resist pattern 92 and the control gate electrode 55 as a mask, boron (B) ions at an implant dose of, e.g., about $0.5 \times 10^{13}$ cm$^{-2}$ to $1 \times 10^{14}$ cm$^{-2}$ are implanted into the semiconductor substrate 51 through the gate oxide film 54 with an implant energy of about 15 keV, whereby the heavily doped p-type impurity layer 56 is formed in the drain formation region.

Figure 27C:
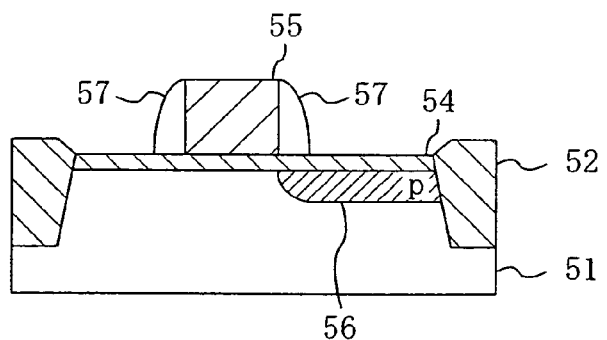

Then, as shown in FIG. 27C, the second resist pattern 92 is removed. Thereafter, the BPSG film is deposited by CVD over the entire surface of the semiconductor substrate 51. Subsequently, anisotropic etching is performed with respect to the deposited BPSG film to form the sidewalls 57 composed of the BPSG film on the side surfaces of the control gate electrode 55. By adjusting the thickness of the deposited BPSG film, the distance between the side surface of the control gate electrode 55 and the stepped portion, which will be formed in the semiconductor substrate 51 in the subsequent step, can be determined by self alignment.

Figure 27D:
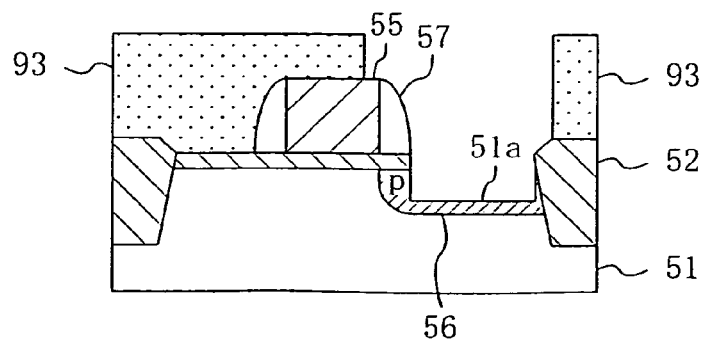

Next, as shown in FIG. 27D, the third resist pattern 93 having an opening over the drain formation region is formed on the semiconductor substrate 51. By using the formed third resist pattern 93, the gate electrode 55, and the sidewalls 57 as a mask, dry etching is performed with respect to the semiconductor substrate 51, thereby forming the recessed portion 51a in the drain formation region of the semiconductor substrate 51.

Figure 28A:
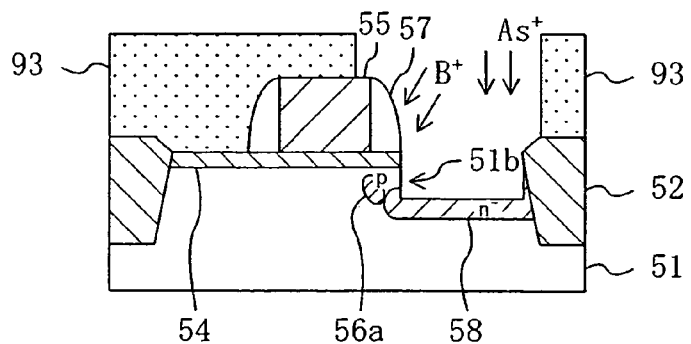
FIGS. 28A to 28D are cross-sectional views illustrating the individual process steps of the method for fabricating the split-gate nonvolatile semiconductor memory device according to the seventh embodiment.

Next, as shown in FIG. 28A, boron (B) ions as a p-type impurity and arsenic (As) ions as an n-type impurity are implanted sequentially by using the third resist pattern 93, the gate electrode 55, and the sidewalls 57 as a mask. As a result, the boron ions and the arsenic ions compensate for each other in the vicinity of the stepped portion in the semiconductor substrate 51 to form the depletion control layer 56a composed of the heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region. At this time, the boron ions are implanted at a dose of, e.g., about $0.5 \times 10^{14}$ cm$^{-2}$ to $5 \times 10^{14}$ cm$^{-2}$ with an implant energy of about 25 keV, and at an angle of about 30° with respect to a normal to the substrate surface. On the other hand, the arsenic ions are implanted at a dose of, e.g., about $0.5 \times 10^{14}$ cm$^{-2}$ to $5 \times 10^{14}$ cm$^{-2}$ with an implant energy of about 10 keV, and at an angle of about 0° with respect to a normal to the substrate surface.

Figure 28B:
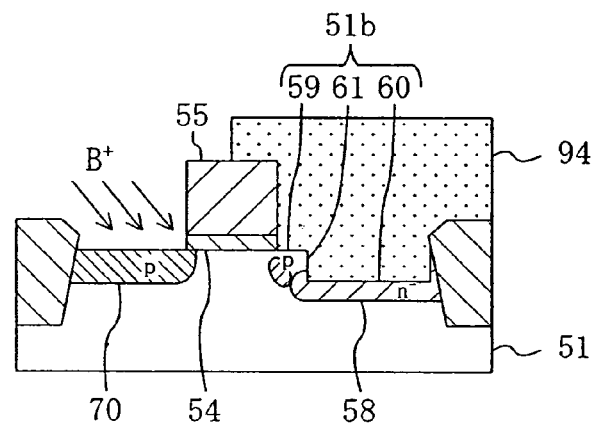

Next, as shown in FIG. 28B, the third resist pattern 93 is removed and then the sidewalls 57 and the exposed portion of the gate oxide film 54 are removed by wet etching, whereby the stepped portion 51b composed of the first surface region 59 serving as the upper stage, the second surface region 60 serving as the lower stage, and the step side region 61 connecting the upper and lower stages and the side surface of the control gate electrode 55 are exposed. Subsequently, the fourth resist pattern 94 having an opening over the source formation region of the active region 10 is formed. By using the formed fourth resist pattern 94 and the gate electrode 55 as a mask, boron ions at a dose of, e.g., about $0.5 \times 10^{13}$ cm$^{-2}$ to $5 \times 10^{13}$ cm$^{-2}$ are implanted into the semiconductor substrate 50 with an implant energy of about 30 keV and at an angle of about 30° relative to a normal to the substrate surface, whereby a p-type short-channel-effect suppressing layer 70 is formed.

Figure 28C:
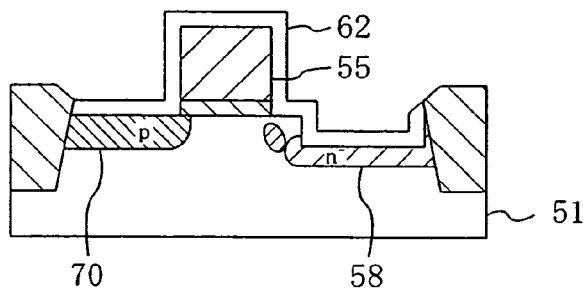

Next, as shown in FIG. 28C, the fourth resist pattern 94 is removed. Then, the thermal oxide film 62 serving as the second and third insulating films is formed on the exposed surface of the semiconductor substrate 51 including the stepped portion 51b and on the surface of the control gate electrode 55. The thermal oxide film 62 may also be a silicon dioxide film formed by CVD or the like.

Figure 28D:
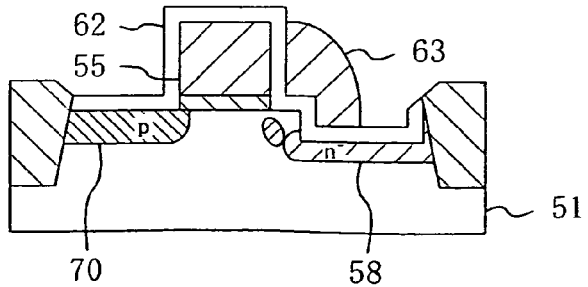

Next, as shown in FIG. 28D, the second polysilicon film is deposited by, e.g., CVD over the entire surface of the semiconductor substrate 51 including the control gate electrode 55. By performing anisotropic etching with respect to the deposited second polysilicon film, the floating gate electrode 63 composed of polysilicon, capacitively coupled to the side surface of the control gate electrode 55 closer to the stepped portion 51b with the thermal oxide film 62 interposed therebetween, and opposed to the second surface region 60 with the thermal oxide film 62 interposed therebetween is formed by self alignment so as to cover up the stepped portion 51b. The region of the thermal oxide film 62 sandwiched between the floating gate electrode 63 and the semiconductor substrate 51 functions as the tunnel film.

Figure 29:
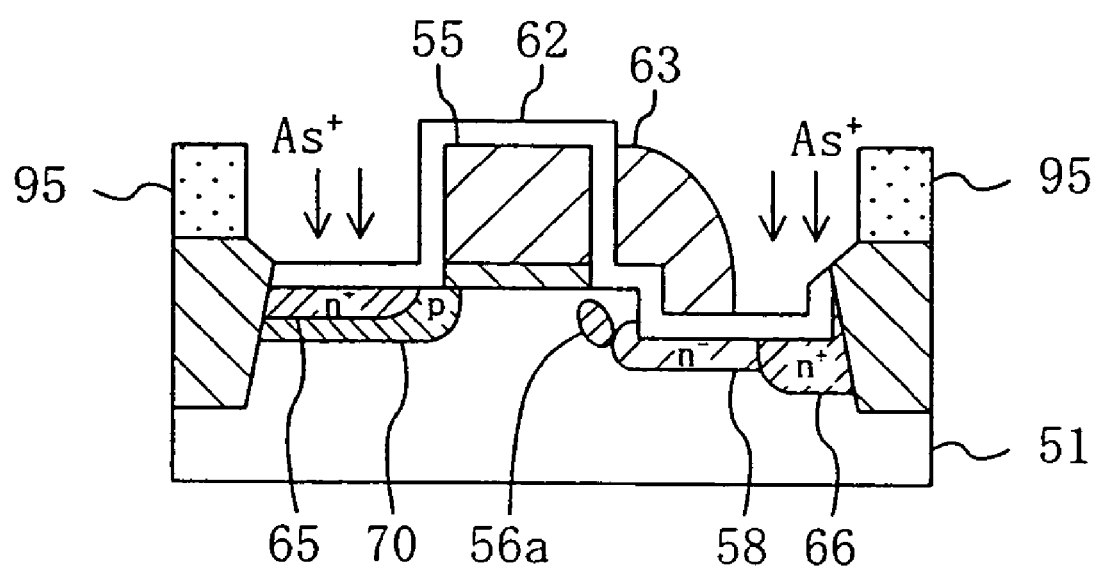
FIG. 29 is a cross-sectional view illustrating the process step of the method for fabricating the split-gate nonvolatile semiconductor memory device according to the seventh embodiment.

Next, as shown in FIG. 29, the fifth resist pattern 95 having an opening over the source formation region and the drain formation region is formed. By using the formed fifth resist pattern, the control gate electrode 55, and the floating gate electrode 63 as a mask, arsenic (As) ions are implanted into the semiconductor substrate 51 so that the heavily doped source region 65 is formed in the region of the semiconductor substrate 51 opposite to the floating gate electrode 63 relative to the control gate electrode 55 and internal of the short-channel-effect suppressing layer 70 and the heavily doped drain region 66 is formed in the region of the semiconductor substrate 51 closer to the floating gate electrode 63 than to the control gate electrode 55 and connecting to the lightly doped drain region 58, whereby the memory element in the nonvolatile semiconductor memory device is completed.

Thus, the fabrication method according to the seventh embodiment allows the formation of the p-type depletion control layer 56a in the vicinity of the stepped portion 51b of the p-type semiconductor substrate 51 and ensures the formation of the p-type short-channel-effect suppressing layer 70 covering from beneath the junction interface of the heavily doped n-type source region 65.

It will easily be appreciated that the effect of suppressing a short-channel effect is also achievable with a split-gate flash memory unformed with the stepped portion 16.

Variation of Embodiment 7

A variation of the seventh embodiment will be described with reference to the drawings.

Figure 30:
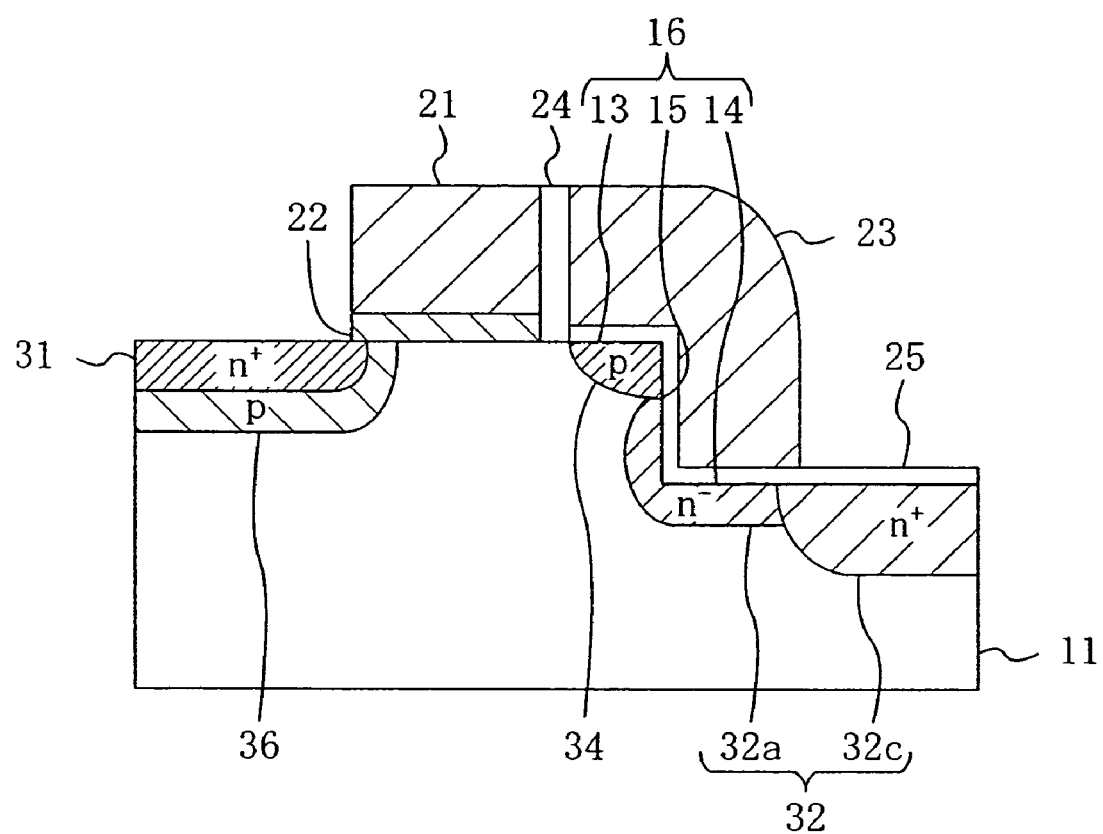
FIG. 30 is a structural cross-sectional view of a memory element in a split-gate nonvolatile semiconductor memory device according to a variation of the seventh embodiment.

FIG. 30 shows a cross-sectional structure of a memory element in a split-gate nonvolatile semiconductor memory device according to the variation of the seventh embodiment. In FIG. 30, the description of the same components as used in the seventh embodiment and shown in FIG. 26 will be omitted by retaining the same reference numerals.

As shown in FIG. 30, the nonvolatile semiconductor memory device according to the variation of the seventh embodiment features the high-electric-field forming layer 34 formed in the upper corner of the stepped portion 16 in place of the depletion control layer and containing a p-type impurity diffused therein. The concentration of a p-type impurity in the high-electric-field forming layer 34 has been adjusted to be higher than the concentration of the p-type impurity in the semiconductor substrate 11. The end portion of the high-electric-field forming layer 34 closer to the drain region 32 is in contact with the low-concentration layer 32a.

With the p-type high-electric-field forming layer 34 provided between the upper corner of the stepped portion 16 and the low-concentration layer 32a of the drain region 32, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the low-concentration layer 32a, so that an electron temperature in the vicinity of the lower corner of the stepped portion 16 is further increased. This increases the number of electrons in the channel that have become hot electrons and remarkably improves the efficiency with which the electrons are injected into the floating gate electrode 23.

The present variation can be implemented by adjusting an implant acceleration voltage and a dose during the implantation of boron (B) ions shown in FIG. 27B or during the implantation of boron (B) ions and arsenic (As) ions shown in 28A. It is also possible to perform only the step of implanting the boron (B) ions and the arsenic (As) ions shown in FIG. 28A without performing the implantation of the boron (B) ions shown in FIG. 27B.

Embodiment 8

An eighth embodiment of the present invention will be described with reference to the drawings.

Figure 31:
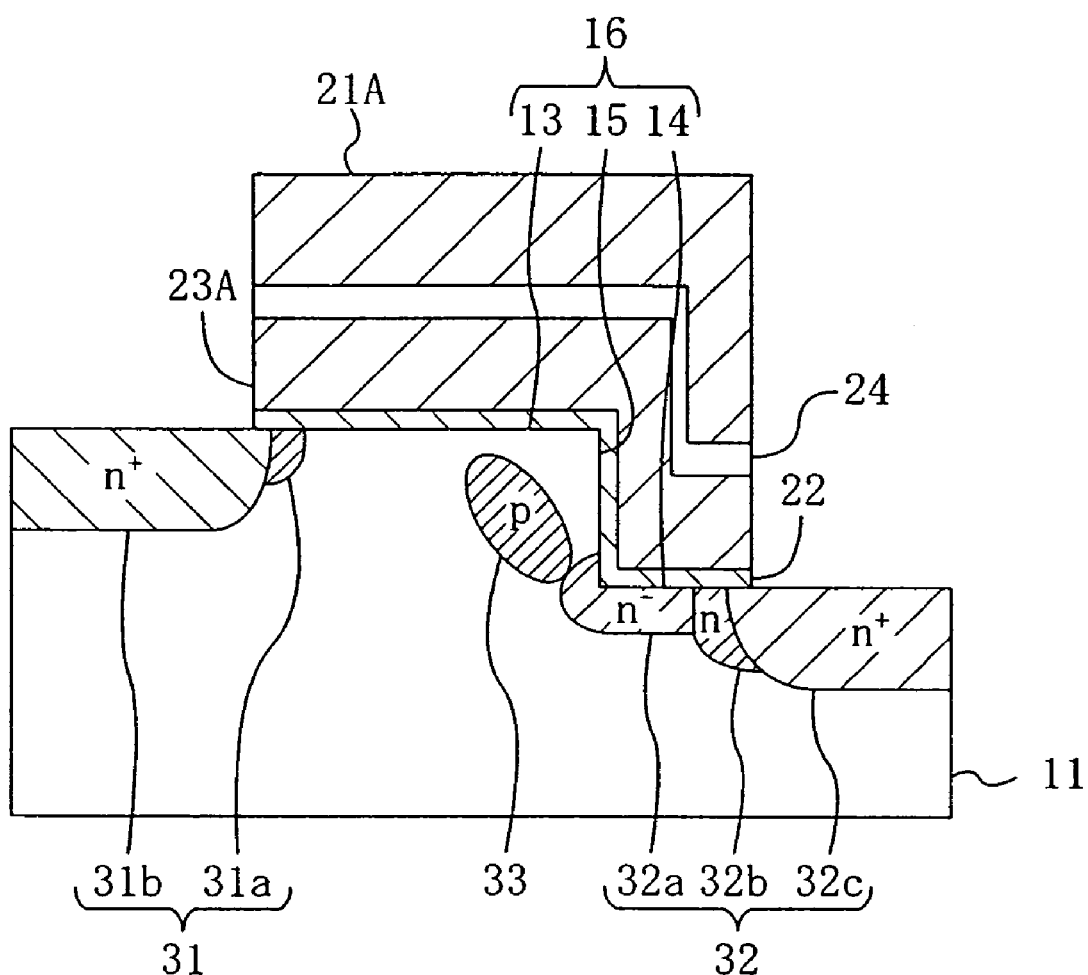
FIG. 31 is a structural cross-sectional view of a memory element in a stacked-gate nonvolatile semiconductor memory device according to an eighth embodiment of the present invention.

FIG. 31 shows a cross-sectional structure of a memory element in a stacked-gate nonvolatile semiconductor memory device according to the eighth embodiment. In FIG. 31, the description of the same components as used in the third embodiment and shown in FIG. 11 will be omitted by retaining the same reference numerals.

As shown in FIG. 31, the nonvolatile semiconductor memory device according to the eighth embodiment features the source region 31 which is composed of the middle-concentration layer 31a formed at the end portion closer to the channel region and the high-concentration layer 31b formed externally of and having a higher impurity concentration than the middle-concentration layer 31a as well as the drain region 32 which is composed of the low-concentration layer 32a, the middle-concentration layer 32b, and the high-concentration layer 32c such that their impurity concentrations are progressively outwardly higher with distance from the channel region. The end portion of the low-concentration layer 32a closer to the channel region is formed to adjoin the depletion control layer 33.

In the arrangement, the depletion control layer 33 containing a p-type impurity at a high concentration is not depleted during a write operation. Instead, the portion of the semiconductor substrate 11 enclosed with the first surface region 13, the step side region 15, and the depletion control layer 33 is depleted to function as a channel, similarly to the third embodiment. This causes electrons in the channel to flow expansively toward the step side region and improves the efficiency with which carriers are injected into the floating gate electrode 23A.

Since the middle-concentration layer 32b lower in impurity concentration than the high-concentration layer 32c is provided in the region underlying the floating gate electrode 23A, the intensity of an electric field in the vicinity of the underlying region is reduced during an erase operation so that hot holes generated at the adjacent pn junction interface are reduced. This prevents the lowering of the reliability of the third insulating film 25 as the tunnel film.

Although the eighth embodiment has formed the source region 31 composed of the middle-concentration layer 31a and the high-concentration layer 31b as shown in FIG. 31, the source region 31 may be formed to have a uniform concentration.

It will easily be appreciated that equal effects are also achievable with a stacked-gate flash memory unformed with the stepped portion 16.

A description will be given herein below to a method for fabricating the nonvolatile semiconductor memory device thus constituted with reference to the drawings.

FIGS. 32A to 34B show the cross-sectional structures of the nonvolatile semiconductor memory device according to the eighth embodiment in the individual process steps of the fabrication method therefor.

Figure 32A:
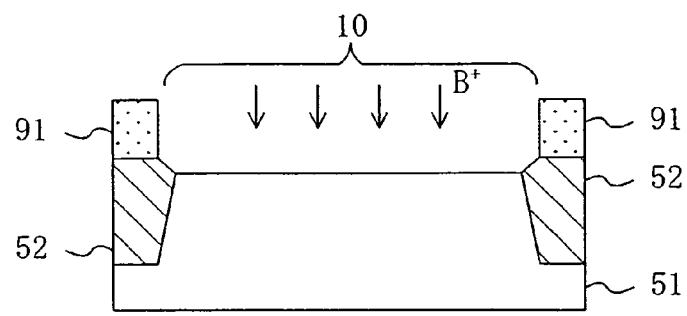
FIGS. 32A to 32D are cross-sectional views illustrating the individual process steps of the method for fabricating the stacked-gate nonvolatile semiconductor memory device according to the eighth embodiment.

First, as shown in FIG. 32A, the isolation layer 52 having e.g., a trench isolation structure, is formed on a semiconductor substrate 51 composed of p-type silicon. Then, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 with an implant energy of about 300 kev by using the first resist pattern 91 as a mask, whereby the p-type well region having a near-surface impurity concentration of about $5\times10^{13}$ cm$^{-3}$ to $1\times10^{14}$ cm$^{-3}$ is formed in the active region 10. Then, boron (B) ions for threshold voltage control at an implant dose of, e.g., $0.5\times10^{13}$ cm$^{-2}$ to $1\times10^{13}$ cm$^{-2}$ are further implanted into the entire surface of the active region 10 with an implant energy of about 30 keV.

Figure 32B:
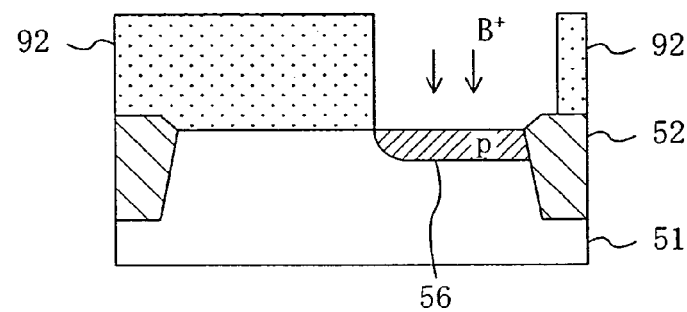

Next, as shown in FIG. 32B, the first resist pattern 91 is removed. Then, the second resist pattern 92 having an opening over the drain formation region of the active region 10 is formed on the semiconductor substrate 51. By using the formed second resist pattern 92 as a mask, boron (B) ions at an implant dose of, e.g., about $0.5\times10^{13}$ cm$^{-2}$ to $1\times10^{14}$ cm$^{-2}$ are implanted into the semiconductor substrate 51 through the protective insulating film 53 with an implant energy of about 15 keV, whereby the heavily doped p-type impurity layer 56 is formed in the drain formation region.

Figure 32C:
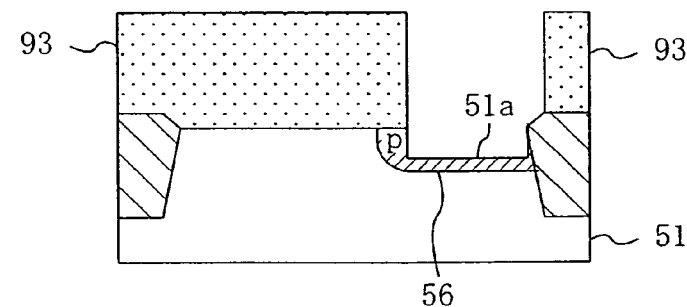

Next, as shown in FIG. 32C, the second resist pattern 92 is removed. Then, the third resist pattern 93 for masking the source formation region and the end portion of the heavily doped impurity layer 56 closer to the source formation region is formed on the semiconductor substrate 51. By using the formed third resist pattern 93 as a mask, dry etching is performed with respect to the semiconductor substrate 51, thereby forming the recessed portion 51*a* in the drain formation region of the semiconductor substrate 51. At this time, the dimension of the depletion control layer 56*a* in the direction of the gate length, which will be formed from the heavily doped impurity layer 56 in the subsequent step, can be optimized by adjusting the amount of masking (overlapping) the end portion of the heavily doped impurity layer 56 closer to the source formation region.

Figure 32D:
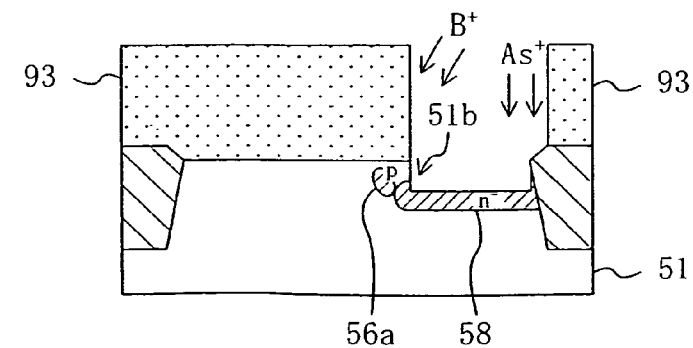

Next, as shown in FIG. 32D, boron (B) ions as a p-type impurity and arsenic (As) ions as an n-type impurity are implanted sequentially by using the third resist pattern 93 as a mask. As a result, the boron ions and the arsenic ions compensate for each other in the vicinity of the stepped portion in the semiconductor substrate 51 to form the depletion control layer 56*a* composed of the heavily doped p-type impurity layer 56 and formed in the stepped portion 51*b* of the recessed portion 51*a* in the semiconductor substrate 51 closer to the control gate electrode 55 to extend from a position located under the control gate electrode 55 and at a distance from the upper corner of the stepped portion 51*b* toward the lower corner of the stepped portion 51*b* and adjoin the lightly doped drain region 58 without reaching the step side region. At this time, both of the boron ions and the arsenic ions are implanted at a dose of, e.g., about $0.5\times10^{14}$ cm$^{-2}$ to $5\times10^{14}$ cm$^{-2}$ and with an implant energy of about 10 kev, while only the boron ions are implanted at an angle of about 30°.

Figure 33A:
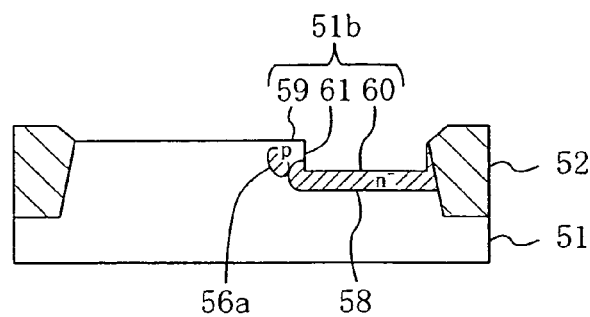
FIGS. 33A to 33D are cross-sectional views illustrating the individual process steps of the method for fabricating the stacked-gate nonvolatile semiconductor memory device according to the eighth embodiment.

Next, as shown in FIG. 33A, the third resist pattern 93 is removed, whereby the stepped portion 51*b* composed of the upper surface of the semiconductor substrate 51, i.e., the first surface region 59 serving as the upper stage, the second surface region 60 serving as the lower stage, and the step side region 61 connecting the upper and lower stages is exposed.

Figure 33B:
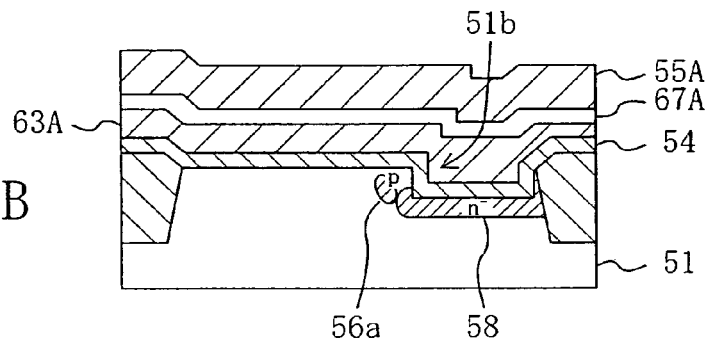

Next, as shown in FIG. 33B, the gate oxide film 54 serving as the first insulating film is formed on the exposed surface of the semiconductor substrate 51 including the stepped portion 51*b*. Then, the first polysilicon film 63A, the silicon dioxide film 67A serving as the second insulating film, and the second polysilicon film 55A are deposited by, e.g., CVD over the entire surface of the gate oxide film 54. The silicon dioxide film 67A may also be formed as the thermal oxide film.

Figure 33C:
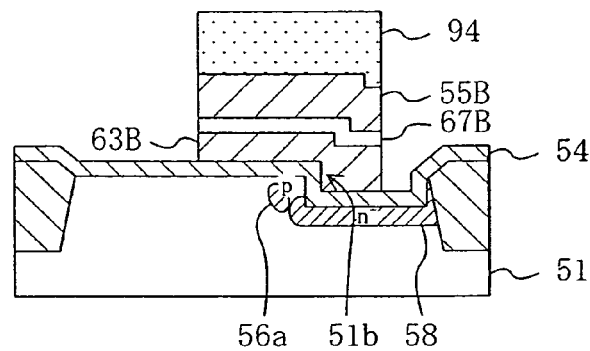

Next, as shown in FIG. 33C, the fourth resist pattern 94 including a pattern for a gate electrode which covers up the stepped portion 51*b* is formed on the second polysilicon film 55A. By using the formed fourth resist pattern 94 as a mask, anisotropic etching is performed with respect to the second polysilicon film 55A, the silicon dioxide film 67A, and the first polysilicon film 63A, thereby forming the floating gate electrode 63B composed of the first polysilicon film 63A, the capacitance insulating film 67B composed of the silicon dioxide film 67A, and the floating gate electrode 55B composed of the second polysilicon film 55A. The gate oxide film 54 between the semiconductor substrate 51 and the floating gate electrode 63B functions as the tunnel film.

Figure 33D:
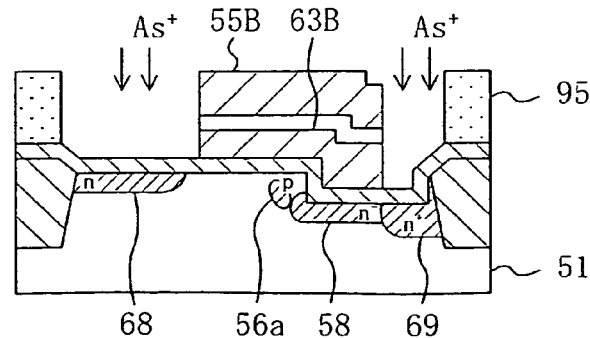

Next, as shown in FIG. 33D, the fourth resist pattern 94 is removed. Then, the fifth resist pattern 95 having an opening over the source formation region and the drain formation region is formed. By using the formed fifth resist pattern 95 and the control gate electrode 55B as a mask, arsenic (As) ions are implanted into the semiconductor substrate 51 so that the moderately doped source region 68 is formed in the first surface region 59 of the semiconductor substrate 51 and the moderately doped drain region 69 is formed in the area of the second surface region 60 of the semiconductor substrate 51 connecting to the lightly doped drain region 58.

Figure 34A:
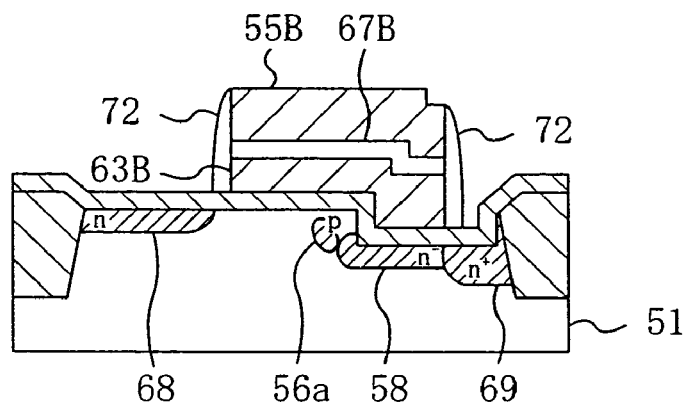
FIGS. 34A and 34B are cross-sectional views illustrating the individual process steps of the method for fabricating the stacked-gate nonvolatile semiconductor memory device according to the eighth embodiment.

Next, as shown in FIG. 34A, the insulating film 64 composed of a silicon dioxide or the like is formed over the entire surface of the semiconductor substrate 51. Then, the formed insulating film is etched to form the insulating film sidewalls 72 on the respective side surfaces of the floating gate electrode 63B and the control gate electrode 55B.

Figure 34B:
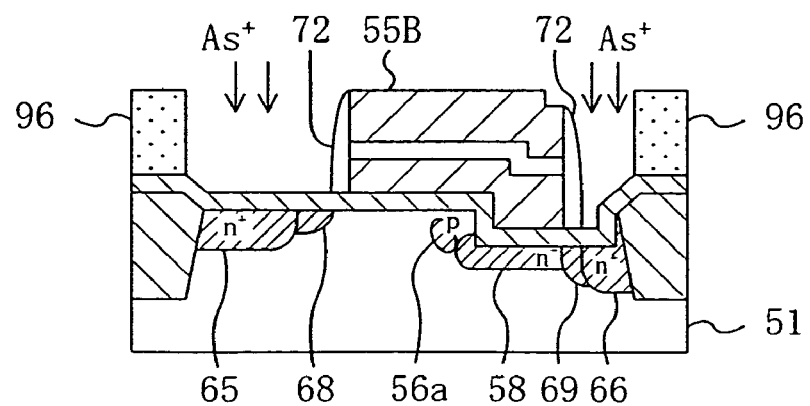

Next, as shown in FIG. 34B, a sixth resist pattern 96 having an opening over the source formation region and the drain formation region is formed and arsenic (As) ions are implanted into the semiconductor substrate 51 by using the formed sixth resist pattern 96, the control gate electrode 55, and the insulating film sidewalls 72 as a mask so that the heavily doped source region 65 is formed in the area of the first surface region 59 of the semiconductor substrate 51 connecting to the moderately doped source region 68 and the heavily doped drain region 66 is formed in the area of the second surface region 60 of the semiconductor substrate 51 connecting to the moderately doped drain region 69, whereby the memory element in the nonvolatile semiconductor memory device is completed.

Thus, the fabrication method according to the eighth embodiment allows the formation of the p-type depletion control layer 56*a* in the vicinity of the stepped portion 51*b* in the p-type semiconductor substrate 51 and ensures the formation of the drain region composed of the lightly doped drain region 58, the moderately doped drain region 60, and the heavily doped drain region 66 in which the concentrations of the n-type impurities are progressively higher with distance from the channel region.

Variation of Embodiment 8

A variation of the eighth embodiment will be described with reference to the drawings.

Figure 35:
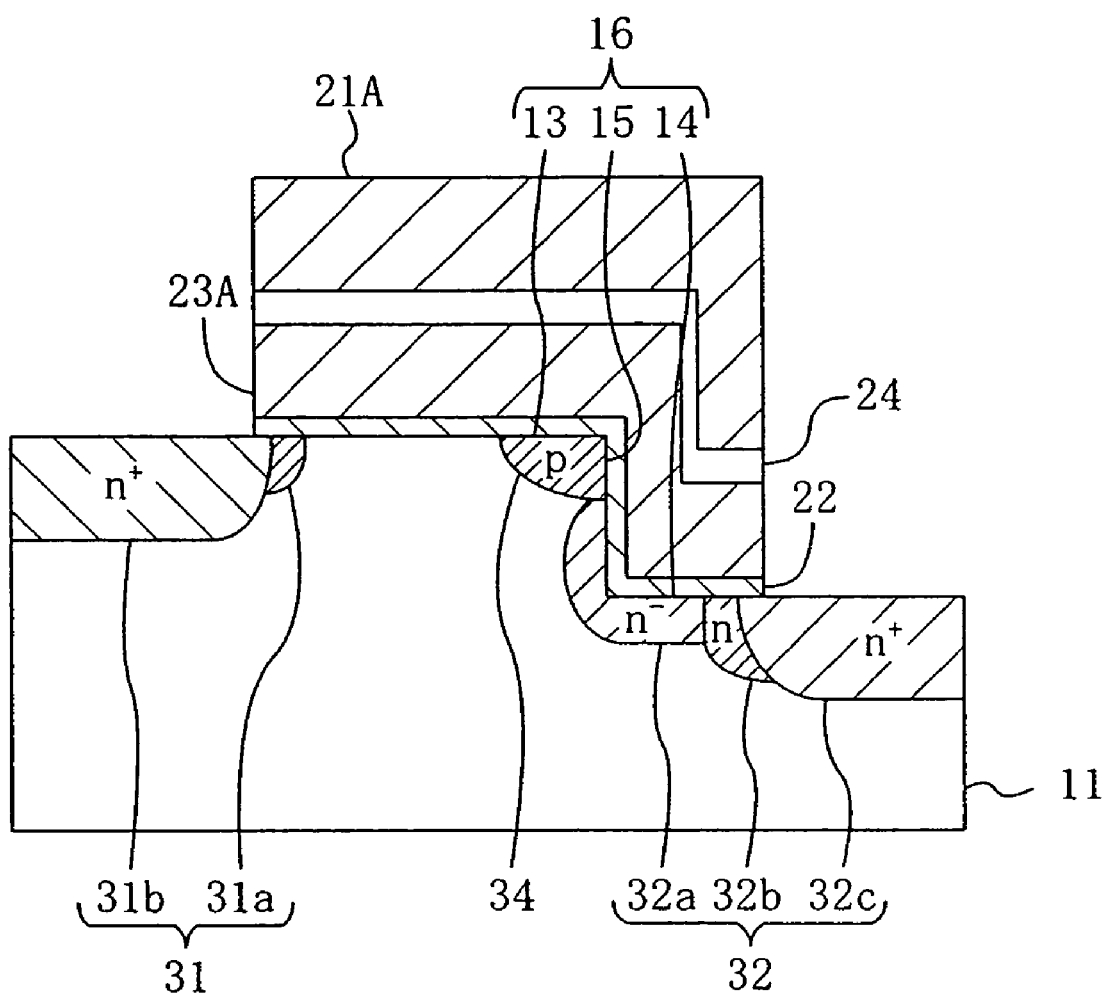
FIG. 35 is a structural cross-sectional view of a memory element in a stacked-gate nonvolatile semiconductor memory device according to a variation of the eighth embodiment.

FIG. 35 shows a cross-sectional structure of a memory element in a stacked-gate nonvolatile semiconductor memory device according to the variation of the eighth embodiment. In FIG. 35, the description of the same components as used in the eighth embodiment and shown in FIG. 31 will be omitted by retaining the same reference numerals.

As shown in FIG. 35, the nonvolatile semiconductor memory device according to the variation of the sixth embodiment features the high-electric-field forming layer 34 formed in the upper corner of the stepped portion in place of the depletion control layer and containing a p-type impurity diffused therein. The concentration of a p-type impurity in the high-electric-field forming layer 34 has been adjusted to be higher than the concentration of the p-type impurity in the semiconductor substrate 11. The end portion of the high-electric-field forming layer 34 closer to the drain region 32 is in contact with the low-concentration layer 32a.

With the p-type high-electric-field forming layer 34 provided between the upper corner of the stepped portion 16 and the low-concentration layer 32a of the drain region 32, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the low-concentration layer 32a, so that an electron temperature in the vicinity of the lower corner of the stepped portion 16 is further increased. This increases the number of electrons in the channel that have become hot electrons and remarkably improves the efficiency with which the electrons are injected into the floating gate electrode 23.

The present variation can be implemented by adjusting an implant acceleration voltage and a dose during the implantation of boron (B) ions shown in FIG. 32B or during the implantation of boron (B) ions and arsenic (As) ions shown in FIG. 32D. It is also possible to perform only the step of implanting the boron (B) ions and the arsenic (As) ions shown in FIG. 32D without performing the implantation of the boron (B) ions shown in FIG. 32B.

Although the present variation has also formed the source region 31 composed of the middle-concentration layer 31a and the high-concentration layer 31b, the source region 31 may also be formed to have a uniform concentration.

Equal effects are also achievable with a stacked-gate flash memory unformed with the stepped portion 16.

Embodiment 9

A ninth embodiment of the present invention will be described with reference to the drawings.

Figure 36:
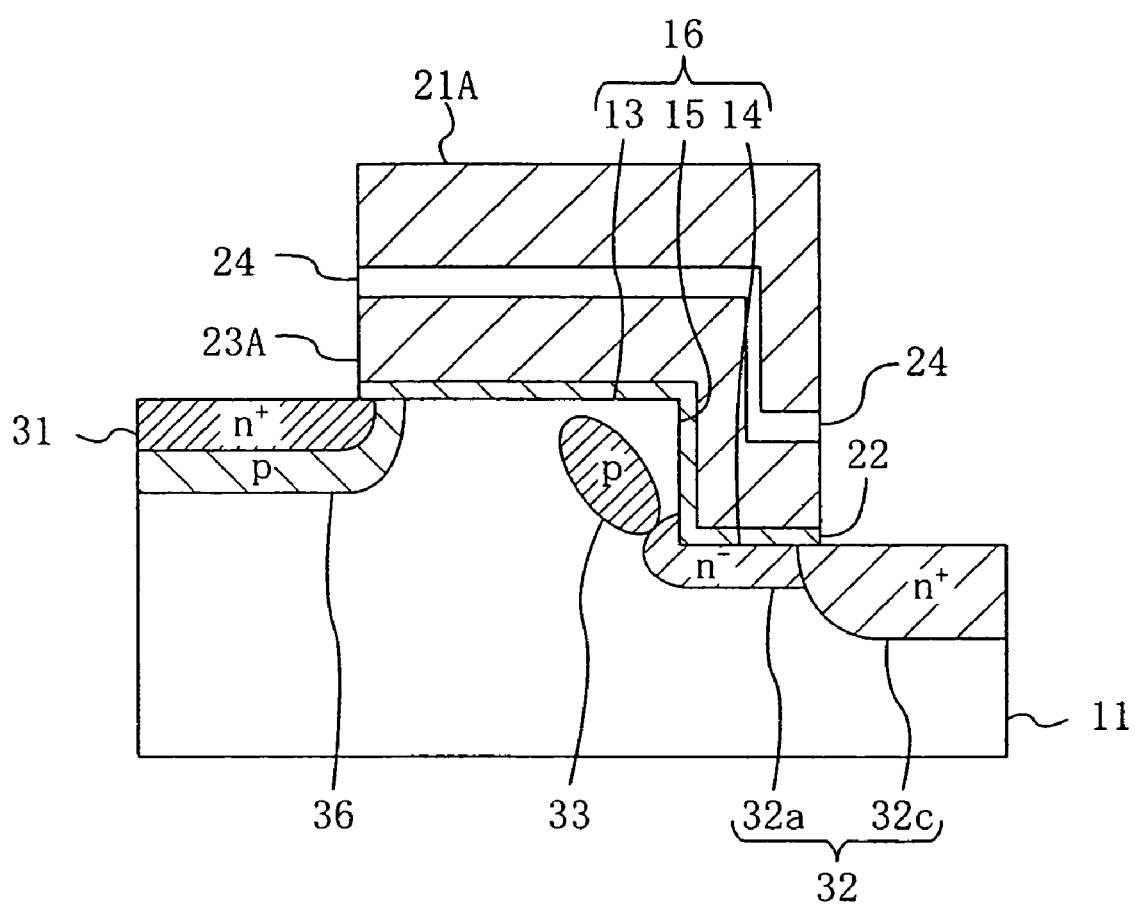
FIG. 36 is a structural cross-sectional view of a memory element in a stacked-gate nonvolatile semiconductor memory device according to a ninth embodiment of the present invention.

FIG. 36 shows a cross-sectional structure of a memory element in a stacked-gate nonvolatile semiconductor memory device according to the ninth embodiment. In FIG. 36, the description of the same components as used in the eighth embodiment and shown in FIG. 31 will be omitted by retaining the same reference numerals.

As shown in FIG. 36, the nonvolatile semiconductor memory device according to the ninth embodiment features the short-channel-effect suppressing region 36 which is composed 15 of a p-type impurity region and formed in a portion of the first surface region 13 underlying the outer peripheral portion of the source region 31 so as to cover the junction interface between the source region 31 and the semiconductor substrate 11. Since the p-type short-channel-effect suppressing region 36 is provided between the n-type source region 31 and the channel region, the intensity of an electric field between the source region 31 and the drain region 32 is reduced, which suppresses a short-channel effect and allows device size reduction.

A description will be given herein below to a method for fabricating the nonvolatile semiconductor memory device thus constituted with reference to the drawings.

FIGS. 37A to 39 show the cross-sectional structures of the nonvolatile semiconductor memory device according to the ninth embodiment in the individual process steps of the fabrication method therefor.

Figure 37A:
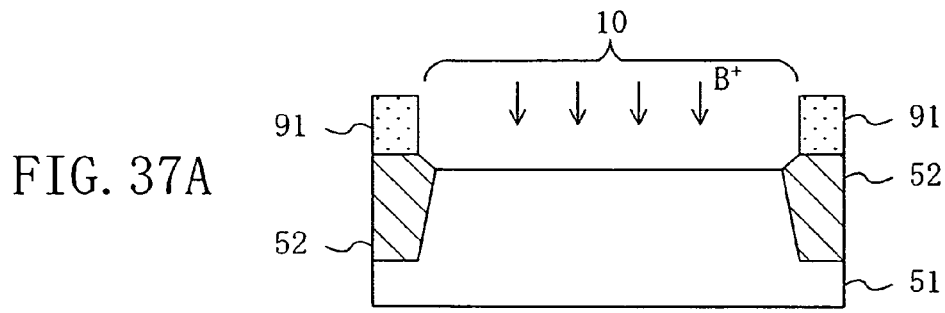
FIGS. 37A to 37D are cross-sectional views illustrating the individual process steps of the method for fabricating the stacked-gate nonvolatile semiconductor memory device according to the ninth embodiment.

First, as shown in FIG. 37A, the isolation layer 52 having, e.g., a trench isolation structure, is formed in the semiconductor substrate 51 composed of p-type silicon. Then, the first resist pattern 91 having a pattern for forming a p-type well region in the active region 10 is formed on the semiconductor substrate 51. Subsequently, boron (B) ions at an implant dose of, e.g., about $0.5 \times 10^{13}$ cm$^{-2}$ to $1 \times 10^{14}$ cm$^{-2}$ are implanted into the semiconductor substrate 51 with an implant energy of about 300 keV by using the first resist pattern 91 as a mask, whereby the p-type well region having a near-surface impurity concentration of about $5 \times 10^{13}$ cm$^{-3}$ to $1 \times 10^{14}$ cm$^{-3}$ is formed in the active region 10. Then, boron (B) ions for threshold voltage control at an implant dose of, e.g., $0.5 \times 10^{13}$ cm$^{-2}$ to $1 \times 10^{13}$ cm$^{-2}$ are further implanted into the entire surface of the active region 10 with an implant energy of about 30 keV.

Figure 37B:
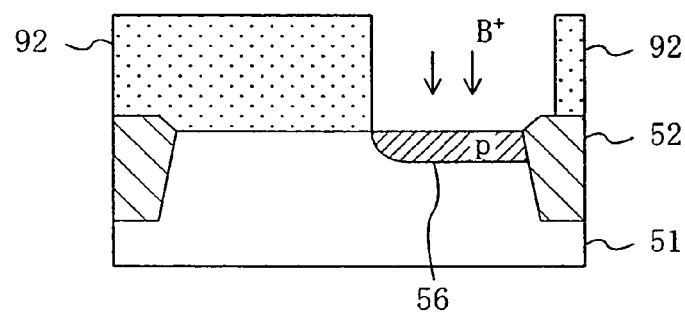

Next, as shown in FIG. 37B, the first resist pattern 91 is removed. Then, the second resist pattern 92 having an opening over the drain formation region of the active region 10 is formed on the semiconductor substrate 51. By using the formed second resist pattern 92 as a mask, boron (B) ions at an implant dose of, e.g., about $0.5 \times 10^{13}$ cm$^{-2}$ to $1 \times 10^{14}$ cm$^{-2}$ are implanted into the semiconductor substrate 51 through the protective insulating film 53 with an implant energy of about 15 keV, whereby the heavily doped p-type impurity layer 56 is formed in the drain formation region.

Figure 37C:
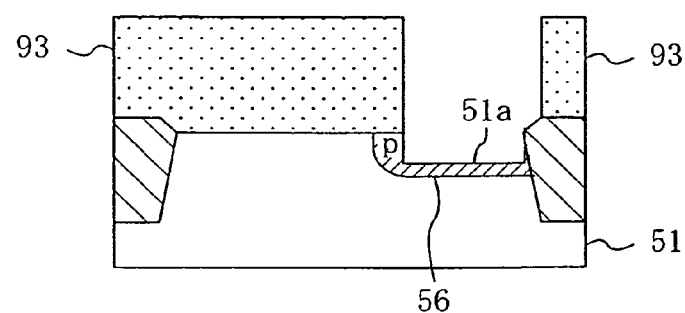

Next, as shown in FIG. 37C, the second resist pattern 92 is removed. Then, the third resist pattern 93 for masking the source formation region and the end portion of the heavily doped impurity layer 56 closer to the source formation region is formed on the semiconductor substrate 51. By using the formed third resist pattern 93 as a mask, dry etching is performed with respect to the semiconductor substrate 51, thereby forming the recessed portion 51a in the drain formation region of the semiconductor substrate 51. At this time, the dimension of the depletion control layer 56a in the direction of the gate length, which will be formed from the heavily doped impurity layer 56 in the subsequent step, can be optimized by adjusting the amount of masking (overlapping) the end portion of the heavily doped impurity layer 56 closer to the source formation region.

Figure 37D:
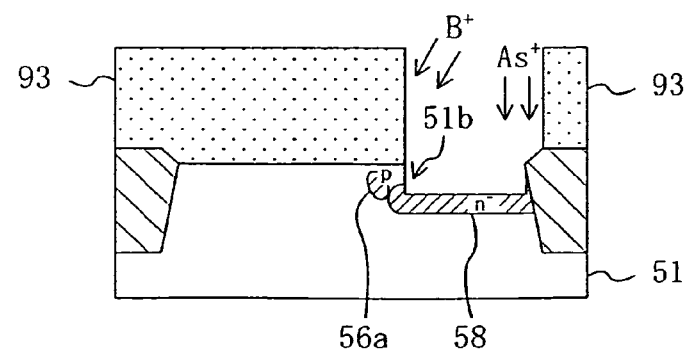

Next, as shown in FIG. 37D, boron (B) ions as a p-type impurity and arsenic (As) ions as an n-type impurity are implanted sequentially by using the third resist pattern 93 as a mask. As a result, the boron ions and the arsenic ions compensate for each other in the vicinity of the stepped portion in the semiconductor substrate 51 to form the depletion control layer 56a composed of the heavily doped p-type impurity layer 56 and formed in the stepped portion 51b of the recessed portion 51a in the semiconductor substrate 51 closer to the control gate electrode 55 to extend from a position located under the control gate electrode 55 and at a distance from the upper corner of the stepped portion 51b toward the lower corner of the stepped portion 51b and adjoin the lightly doped drain region 58 without reaching the step side region. At this time, both of the boron ions and the arsenic ions are implanted at a dose of, e.g., about $0.5 \times 10^{14}$ cm$^{-2}$ to $5 \times 10^{14}$ cm$^{-2}$ and with an implant energy of about 10 keV, while only the boron ions are implanted at an angle of about 30°.

Figure 38A:
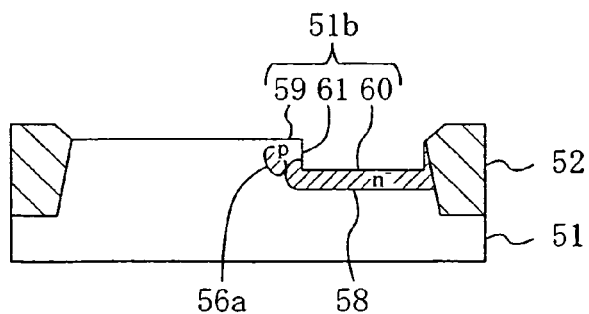
FIGS. 38A to 38D are cross-sectional views illustrating the individual process steps of the method for fabricating the stacked-gate nonvolatile semiconductor memory device according to the ninth embodiment.

Next, as shown in FIG. 38A, the third resist pattern 93 is removed, whereby the stepped portion 51b composed of the upper surface of the semiconductor substrate 51, i.e., the first surface region 59 serving as the upper stage, the second surface region 60 serving as the lower stage, and the step side region 61 connecting the upper and lower stages is exposed.

Figure 38B:
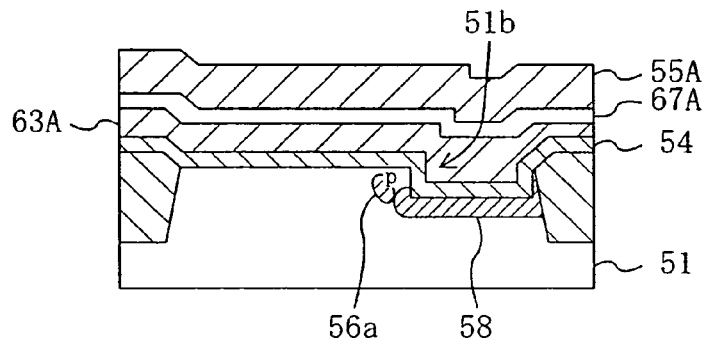

Next, as shown in FIG. 38B, the gate oxide film 54 serving as the first insulating film is formed on the exposed surface of the semiconductor substrate 51 including the stepped portion 51b. Then, the first polysilicon film 63A, the silicon dioxide film 67A serving as the second insulating film, and the second polysilicon film 55A are deposited by, e.g., CVD over the entire surface of the gate oxide film 54. The silicon dioxide film 67A may also be formed as the thermal oxide film.

Figure 38C:
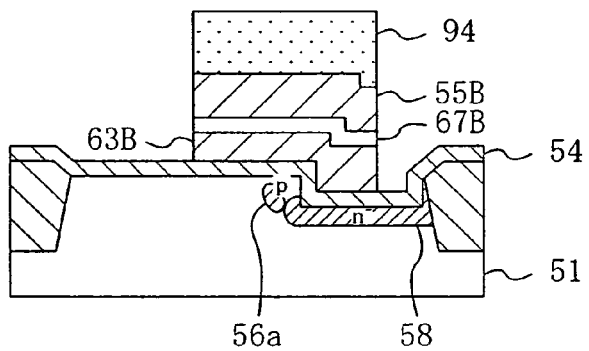

Next, as shown in FIG. 38C, the fourth resist pattern 94 including a pattern for a gate electrode which covers up the stepped portion 51b is formed on the second polysilicon film 55A. By using the formed fourth resist pattern 94 as a mask, anisotropic etching is performed with respect to the second polysilicon film 55A, the silicon dioxide film 67A, and the first polysilicon film 63A, thereby forming the floating gate electrode 63B composed of the first polysilicon film 63A, the capacitance insulating film 67B composed of the silicon dioxide film 67A, and the floating gate electrode 55B composed of the second polysilicon film 55A. The gate oxide film 54 between the semiconductor substrate 51 and the floating gate electrode 63B functions as the tunnel film.

Figure 38D:
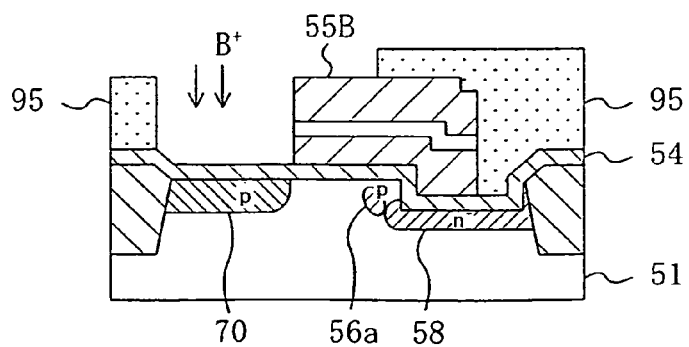

Next, as shown in FIG. 38D, the fifth resist pattern 95 having an opening over the source formation region of the active region 10 is formed on the semiconductor substrate 51. By using the formed fifth resist pattern 95 and the gate electrode 55B as a mask, boron ions at a dose of, e.g., about $0.5 \times 10^{13}$ cm$^{-2}$ to $5 \times 10^{13}$ cm$^{-2}$ are implanted into the semiconductor substrate 51 with an implant energy of about 30 keV, whereby the p-type short-channel-effect suppressing layer 70 is formed in the source formation region.

Figure 39:
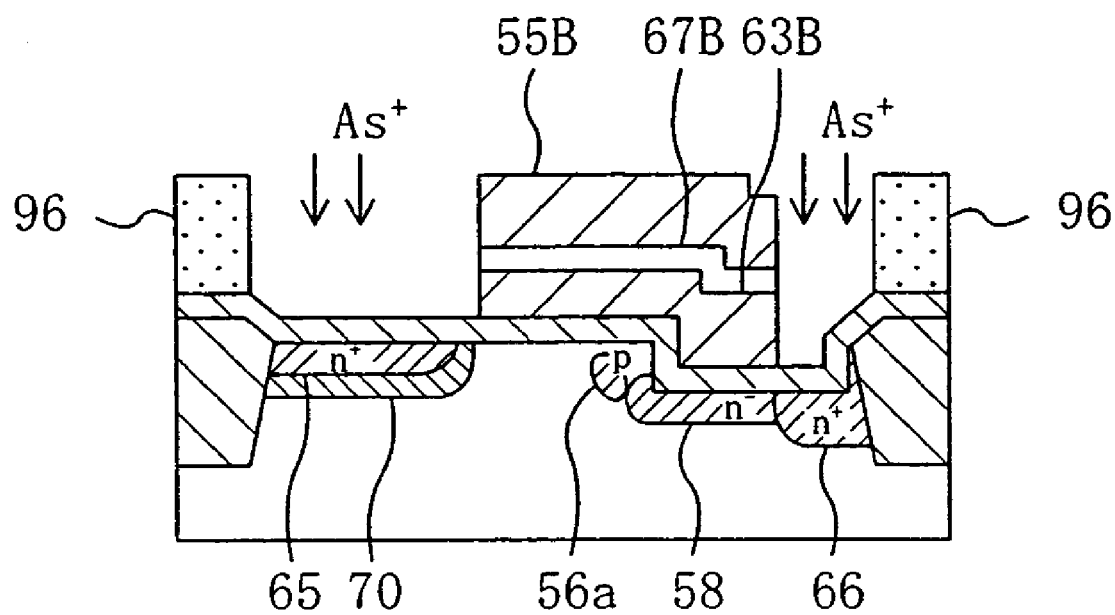
FIG. 39 is a cross-sectional view illustrating the process step of the method for fabricating the stacked-gate nonvolatile semiconductor memory device according to the ninth embodiment.

Next, as shown in FIG. 39, the fifth resist pattern 95 is removed and then the sixth resist pattern having an opening over the source formation region and the drain formation region is formed. By using the formed sixth resist pattern 96 and the control gate electrode 55B as a mask, arsenic (As) ions are implanted into the semiconductor substrate 51 so that the heavily doped source region 65 is formed in the area of the first surface region 51 of the semiconductor substrate 51 internal of the short-channel-effect suppressing layer 70 and the heavily doped drain region 66 is formed in the area of the second surface region 60 of the semiconductor substrate 51 connecting to the lightly doped drain region 58, whereby the memory element in the stacked-gate nonvolatile semiconductor memory device is completed.

Thus, the fabrication method according to the ninth embodiment allows the formation of the p-type depletion control layer 56a in the vicinity of the stepped portion 51b in the p-type semiconductor substrate 51 and ensures the formation of the p-type short-channel-effect suppressing layer 70 covering from beneath the junction interface of the heavily doped n-type source region 65.

It will easily be appreciated that the effect of suppressing a short-channel effect is also achievable with a stacked-gate flash memory unformed with the stepped portion 16.

Variation of Embodiment 9

A variation of the ninth embodiment will be described with reference to the drawings.

Figure 40:
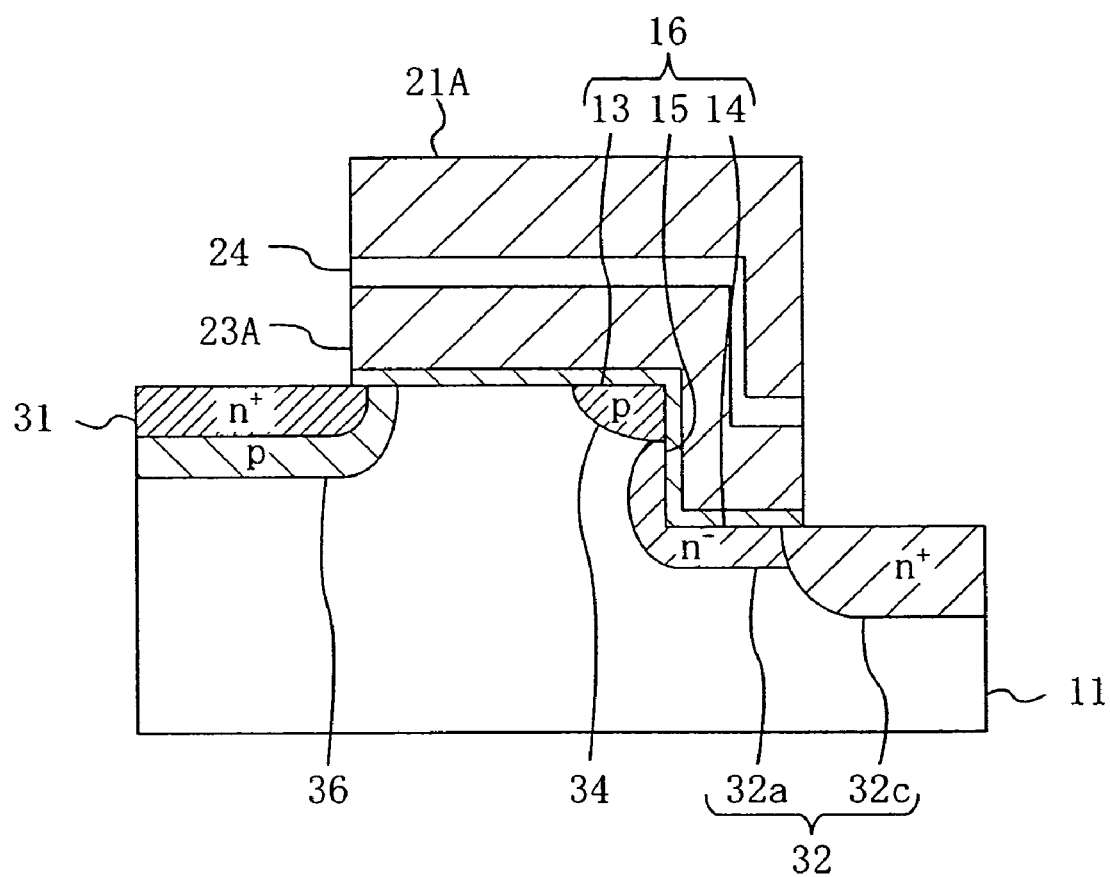
FIG. 40 is a structural cross-sectional view of a memory element in a stacked-gate nonvolatile semiconductor memory device according to a variation of the ninth embodiment.

FIG. 40 shows a cross-sectional structure of a memory element in a stacked-gate nonvolatile semiconductor memory device according to the variation of the ninth embodiment. In FIG. 40, the description of the same components as used in the ninth embodiment and shown in FIG. 36 will be omitted by retaining the same reference numerals.

As shown in FIG. 40, the nonvolatile semiconductor memory device according to the variation of the ninth embodiment features the high-electric-field forming layer 34 formed in the upper corner of the stepped portion in place of the depletion control layer and containing a p-type impurity diffused therein. The concentration of a p-type impurity in the high-electric-field forming layer 34 has been adjusted to be higher than the concentration of the p-type impurity in the semiconductor substrate 11. The end portion of the high-electric-field forming layer 34 closer to the drain region 32 is in contact with the low-concentration layer 32a.

With the p-type high-electric-field forming layer 34 provided between the upper corner of the stepped portion 16 and the low-concentration layer 32a of the drain region 32, an energy level in the step side region 15 has a sharper gradient due to a pn junction portion composed of the interface between the high-electric-field forming layer 34 and the drain region 32. As a result, a high electric field is generated at the interface between the high-electric-field forming layer 34 and the low-concentration layer 32a, so that an electron temperature in the vicinity of the lower corner of the stepped portion 16 is further increased. This increases the number of electrons in the channel that have become hot electrons and remarkably improves the efficiency with which the electrons are injected into the floating gate electrode 23.

The present variation can be implemented by adjusting an implant acceleration voltage and a dose during the implantation of boron (B) ions shown in FIG. 37B or during the implantation of boron (B) ions and arsenic (As) ions shown in FIG. 37D. It is also possible to perform only the step of implanting the boron (B) ions and the arsenic (As) ions shown in FIG. 37D without performing the implantation of the boron (B) ions shown in FIG. 37B.

Embodiment 10

A tenth embodiment of the present invention will be described with reference to the drawings.

The tenth embodiment relates to a method for controlling a nonvolatile semiconductor memory device according to the present invention, which is a method for bias application used to extract electrons accumulated in a floating gate electrode therefrom (erase operation).

Figure 41A:
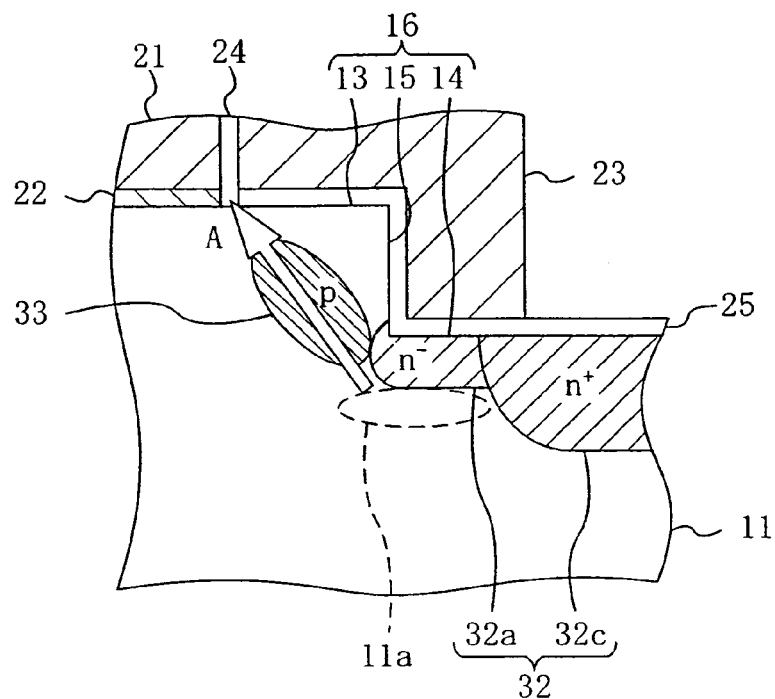
Figure 41B:
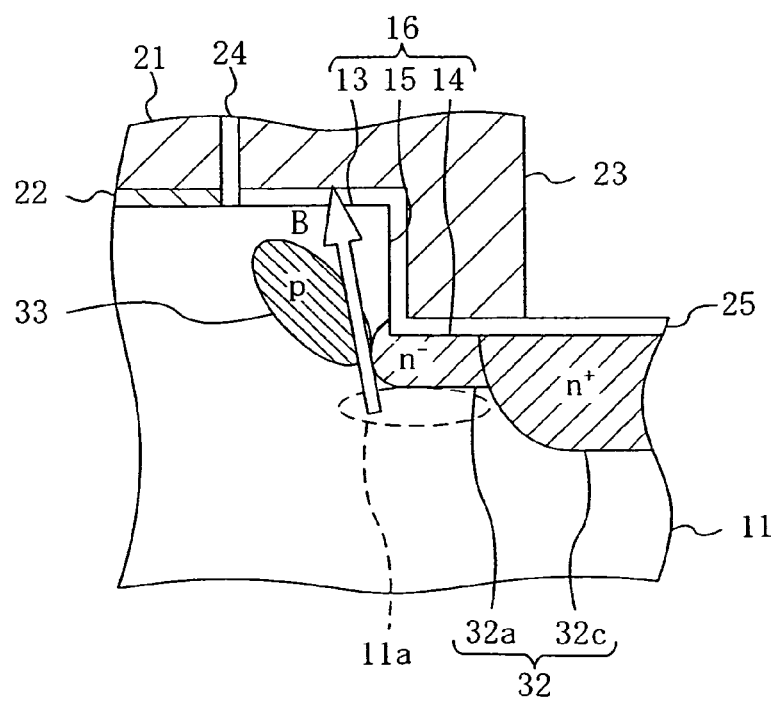
Figure 42:
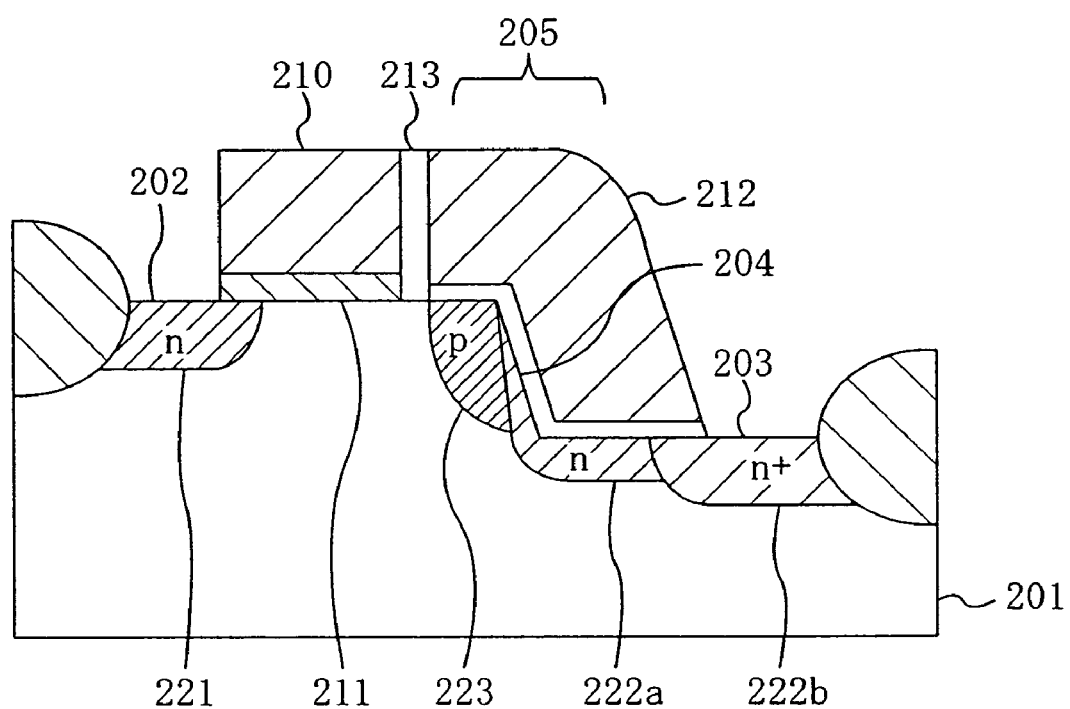
FIG. 42 is a structural cross-sectional view of a memory element in a conventional split-gate nonvolatile semiconductor memory device.

FIGS. 41A and 41B show cross-sectional structures of, e.g., the split-gate nonvolatile semiconductor memory device according to the seventh embodiment in which the region in the vicinity of the stepped portion 16 is enlarged. In FIGS. 41A and 41B, the description of the same components as shown in FIG. 26 will be omitted by retaining the same reference numerals.

In FIG. 41A, exemplary erase bias conditions are such that a voltage applied to the control gate electrode 21 is −6 V to −8 V and a voltage applied to the drain region 32 is 5 V to 6 V. Under such conditions, hot holes are generated in the region 11a of the semiconductor substrate 11 underlying the low-concentration layer 32a of the drain region 32.

Under the foregoing erase bias conditions, the hot holes generated under the drain region 32 may flow in the direction indicated by the arrow A to be captured in the end portion of the first insulating film 22 as the gate insulating film, the second insulating film 24 as the capacitance insulating film, or the third insulating film 25 as the tunnel insulating film closer to the control gate electrode 21. If the hot holes are captured in such places, a read current is reduced in value because of their proximity to the channel region.

In FIG. 41B, therefore, the tenth embodiment has used erase bias conditions such that, e.g., a voltage applied to the control gate electrode 21 is −4 V to −5 V and a voltage applied to the drain region 32 is 6 V to 7 V. In short, the control gate bias is reduced and the drain bias is increased. As a result, the hot holes generated in the region 11a underlying the low-concentration layer 32a of the drain region 32 flow in the direction indicated by the arrow B, i.e., toward the portion of the third insulating film (tunnel film) 25 underlying the floating gate electrode 23 to be captured in the portion of the third insulating film 25 at a distance from the channel region. Since the hot holes are thus captured in the portion at a distance from the channel region, the influence given to the read current value can be reduced.

The bias conditions according to the tenth embodiment greatly change depending on the design rules for the device and are not limited to the foregoing voltage range.

Although the present embodiment has described the split-gate flash memory having the stepped portion 16, it will be appreciated that equal effects are achievable with a split-gate flash memory unformed with the stepped portion 16.

What is claimed is:

1. A nonvolatile semiconductor memory device comprising:
   a stepped portion formed in a semiconductor substrate, the stepped portion being composed of a first surface region serving as an upper stage, a second surface region serving as a lower stage, and a step side region connecting the upper and lower stages;
   a first insulating film formed on the first surface region;
   a control gate electrode formed on an area of the first surface region with the first insulating film interposed therebetween;
   a floating gate electrode formed on the semiconductor substrate so as to cover up the stepped portion, the floating gate electrode being capacitively coupled to a side surface of the control gate electrode closer to the stepped portion with a second insulating film interposed therebetween and opposed to the second surface region and the step side region with a third insulating film interposed therebetween;
   a source region formed in an area of the first surface region opposite to the floating gate electrode relative to the control gate electrode;
   a drain region formed in an area of the second surface region underlying the floating gate electrode; and
   an impurity region formed in the first surface region and step side region of the semiconductor substrate to have an impurity concentration higher than an impurity concentration of the semiconductor substrate and a conductivity type opposite to a conductivity type of the drain region,
   wherein the impurity region is in contact with the third insulating film formed on the step side region.

2. The nonvolatile semiconductor memory device of claim 1, wherein a substrate voltage is applied to the semiconductor substrate such that a channel region in which carriers flow from a portion of the first surface region underlying the floating gate electrode toward the step side region.

3. The nonvolatile semiconductor memory device of claim 1, wherein the impurity region is formed at an upper corner of the stepped portion in the semiconductor substrate.

4. The nonvolatile semiconductor memory device of claim 1, wherein the impurity is formed only under the floating gate electrode in the first surface region.

5. A nonvolatile semiconductor memory device comprising:
   a stepped portion formed in a semiconductor substrate, the stepped portion being composed of a first surface region serving as an upper stage, a second surface region serving as a lower stage, and a step side region connecting the upper and lower stages;
   a first insulating film formed on the semiconductor substrate so as to cover up the stepped portion;
   a floating gate electrode formed on the first insulating film so as to cover up the stepped portion;
   a control gate electrode formed on the floating gate electrode with a second insulating film interposed therebetween, the control gate electrode being capacitively coupled to the floating gate electrode;
   a source region formed in an area of the first surface region opposite to the stepped portion relative to the floating gate electrode;
   a drain region formed in an area of the second surface region underlying the floating gate electrode; and
   an impurity region formed in the first surface region and step side region of the semiconductor substrate to have an impurity concentration higher than an impurity concentration of the semiconductor substrate and a conductivity type opposite to a conductivity type of the drain region,
   wherein the impurity region is in contact with the first insulating film formed on the step side region.

6. The nonvolatile semiconductor memory device of claim 5, wherein a substrate voltage is applied to the semiconductor substrate such that a channel region in which carriers flow from a portion of the first surface region underlying the floating gate electrode toward the step side region.

7. The nonvolatile semiconductor memory device of claim 5, wherein the impurity region is formed at an upper corner of the stepped portion in the semiconductor substrate.

* * * * *